(12) United States Patent
Roh et al.

(10) Patent No.: US 11,855,113 B2
(45) Date of Patent: Dec. 26, 2023

(54) IMAGE SENSOR INCLUDING COLOR SEPARATING LENS ARRAY AND ELECTRONIC DEVICE INCLUDING THE IMAGE SENSOR

(71) Applicant: SAMSUNG ELECTRONICS CO., LTD., Suwon-si (KR)

(72) Inventors: Sookyoung Roh, Yongin-si (KR); Seokho Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/514,634

(22) Filed: Oct. 29, 2021

(65) Prior Publication Data

US 2022/0141427 A1  May 5, 2022

(30) Foreign Application Priority Data

Oct. 30, 2020 (KR) .................. 10-2020-0143877
Jun. 25, 2021 (KR) .................. 10-2021-0083124

(51) Int. Cl.
*H01L 27/146* (2006.01)
*G02B 27/10* (2006.01)
(Continued)

(52) U.S. Cl.
CPC .... *H01L 27/14627* (2013.01); *G02B 27/1013* (2013.01); *G02B 27/123* (2013.01);
(Continued)

(58) Field of Classification Search
None
See application file for complete search history.

(56) References Cited

U.S. PATENT DOCUMENTS 8,289,422 B2  10/2012 Hiramoto et al.
8,384,818 B2   2/2013 Hiramoto et al.
(Continued)

FOREIGN PATENT DOCUMENTS

EP    1845559 A1 * 10/2007 ....... H01L 27/14621
JP    6083538 B2    2/2017
(Continued)

OTHER PUBLICATIONS

Communication dated Mar. 18, 2022 issued by the European Patent Office in EP Application No. 21205334.2.
(Continued)

*Primary Examiner* — David N Werner
(74) *Attorney, Agent, or Firm* — Sughrue Mion, PLLC

(57) ABSTRACT

Provided is an image sensor including a sensor substrate including a plurality of first pixels configured to sense first wavelength light in an infrared ray band and a plurality of second pixels configured to sense second wavelength light in a visible light band, and a color separating lens array disposed on the sensor substrate and configured to change a phase of the first wavelength light incident on the color separating lens array such that the first wavelength light is condensed to the plurality of first pixels, wherein the color separating lens array includes a plurality of light condensing regions configured to condense the first wavelength light respectively on the plurality of first pixels, and wherein an area of each of the plurality of light condensing regions is larger than an area of each of the plurality of first pixels.

33 Claims, 52 Drawing Sheets

(51) Int. Cl.
*G02B 27/12* (2006.01)
*H04N 23/84* (2023.01)
*H04N 9/01* (2023.01)
*H04N 23/11* (2023.01)
*H04N 25/11* (2023.01)
*H04N 23/12* (2023.01)
*H04N 25/131* (2023.01)
*H04N 25/13* (2023.01)
*H04N 25/133* (2023.01)

(52) U.S. Cl.
CPC ............... *H04N 9/01* (2023.01); *H04N 23/11* (2023.01); *H04N 23/12* (2023.01); *H04N 23/84* (2023.01); *H04N 25/11* (2023.01); *H04N 25/131* (2023.01); *H04N 25/133* (2023.01); *H04N 25/135* (2023.01)

(56) References Cited

U.S. PATENT DOCUMENTS

| | | | |
|---|---|---|---|
| 9,673,241 B2 | 6/2017 | Nishiwaki et al. | |
| 10,103,189 B2 | 10/2018 | Yokogawa | |
| 10,136,109 B2 | 11/2018 | Yun et al. | |
| 10,976,472 B2 | 4/2021 | Lee et al. | |
| 2008/0246853 A1* | 10/2008 | Takizawa | H01L 27/14627 348/222.1 |
| 2008/0283728 A1* | 11/2008 | Inoue | H01L 27/14625 438/48 |
| 2012/0206637 A1 | 8/2012 | Hiramoto et al. | |
| 2014/0327783 A1 | 11/2014 | Nishiwaki et al. | |
| 2018/0164154 A1 | 6/2018 | Roh et al. | |
| 2019/0196183 A1* | 6/2019 | Yokogawa | G02B 3/0068 |
| 2021/0124179 A1 | 4/2021 | Yun et al. | |
| 2021/0288095 A1 | 9/2021 | Delga et al. | |
| 2022/0102407 A1* | 3/2022 | Irisa | H04N 23/12 |
| 2022/0139974 A1* | 5/2022 | Tang | H01L 27/14621 257/432 |
| 2022/0139981 A1* | 5/2022 | Tang | H01L 27/1463 257/432 |

FOREIGN PATENT DOCUMENTS

| | | | | |
|---|---|---|---|---|
| KR | 10-2016-0004641 A | 1/2016 | | |
| KR | 10-2018-0090613 A | 8/2018 | | |
| KR | 10-2031384 B1 | 11/2019 | | |
| WO | WO-2012004934 A1 * | 1/2012 | | G02B 5/201 |
| WO | 2018/052750 A1 | 3/2018 | | |
| WO | 2020/007622 A1 | 1/2020 | | |

OTHER PUBLICATIONS

Nishiwaki et al., "Efficient colour splitters for high-pixel-density image sensors," Nature Photonics, vol. 7, Mar. 2013, pp. 240-246 (*published online Feb. 3, 2013).

* cited by examiner

IMAGE SENSOR INCLUDING COLOR SEPARATING LENS ARRAY AND ELECTRONIC DEVICE INCLUDING THE IMAGE SENSOR

CROSS-REFERENCE TO RELATED APPLICATIONS

This application is based on and claims priority under 35 U.S.C. § 119 to Korean Patent Application No. 10-2020-0143877, filed on Oct. 30, 2020 and Korean Patent Application No. 10-2021-0083124, filed on Jun. 25, 2021, in the Korean Intellectual Property Office, the disclosures of which are incorporated by reference herein in their entireties.

BACKGROUND

1. Field

Example embodiments of the present disclosure relate to an image sensor including a color separating lens array, and an electronic device including the image sensor, and more particularly, to an image sensor including a color separating lens array capable of condensing infrared light separately, and an electronic device including the image sensor.

2. Description of Related Art

In order to obtain a three-dimensional (3D) image or material information that is not detected by the human eye, an image sensor including both visible light pixels and infrared pixels, for example, a multi-spectral image sensor or a 3D image sensor, is being developed. However, when a silicon-based photoelectric conversion element is used, a signal conversion rate of an infrared pixel is low, and crosstalk of infrared light occurs due to a microlens, making it difficult to improve quality.

SUMMARY

One or more example embodiments provide image sensors having improved light utilization efficiency by using a color separating lens array capable of condensing infrared light separately and electronic devices including the image sensors.

Additional aspects will be set forth in part in the description which follows and, in part, will be apparent from the description, or may be learned by practice of example embodiments of the disclosure.

According to an aspect of an example embodiment, there is provided an image sensor including a sensor substrate including a plurality of first pixels configured to sense first wavelength light in an infrared ray band and a plurality of second pixels configured to sense second wavelength light in a visible light band, and a color separating lens array disposed on the sensor substrate and configured to change a phase of the first wavelength light incident on the color separating lens array such that the first wavelength light is condensed to the plurality of first pixels, wherein the color separating lens array includes a plurality of light condensing regions configured to condense the first wavelength light respectively on the plurality of first pixels, and wherein an area of each of the plurality of light condensing regions is larger than an area of each of the plurality of first pixels.

The plurality of light condensing regions are configured to change the phase of the first wavelength light such that the first wavelength light passing through the plurality of light condensing regions may have a phase profile that reduces in a direction away from a center of the plurality of light condensing regions.

The area of each of the plurality of light condensing regions may be 1.5 to 4 times larger than the area of each of the plurality of first pixels.

The color separating lens array may be configured such that a phase of the second wavelength light passing through the color separating lens array has a constant phase profile.

The image sensor may further include an infrared filter disposed between the sensor substrate and the color separating lens array that face the plurality of first pixels in a vertical direction, the infrared filter being configured to block visible light.

The image sensor may further include a color filter disposed between the sensor substrate and the color separating lens array that face the plurality of second pixels in a vertical direction, the color filter being configured to block infrared ray.

The image sensor may further include a microlens disposed on the color filter.

The color separating lens array may include a first pixel corresponding region disposed to face the plurality of first pixels in a vertical direction and including a first nanopost, and a second pixel corresponding region disposed to face the plurality of second pixels in the vertical direction and including a second nanopost.

The first nanopost may be disposed in a center of the first pixel corresponding region, the second nanopost may be disposed in a center of the second pixel corresponding region, and a cross-sectional area of the first nanopost may be larger than a cross-sectional area of the second nanopost.

The plurality of light condensing regions may include a first wavelength light condensing region, the second wavelength light may include red light or blue light, the color separating lens array may include a second wavelength light condensing region configured to condense the second wavelength light to the plurality of second pixels, an area of the second wavelength light condensing region may be larger than an area of the plurality of second pixels, and the first wavelength light condensing region may partially overlap the second wavelength light condensing region.

The sensor substrate may include a plurality of third pixels configured to sense third wavelength light, and a plurality of fourth pixels configured to sense fourth wavelength light, the second wavelength light may be red light, the third wavelength light may be blue light, and the fourth wavelength light may be green light, and the color separating lens array may be further configured to change a phase of the second wavelength light incident on the color separating lens array such that the second wavelength light is condensed to the plurality of second pixels, change a phase of the third wavelength light incident on the color separating lens array such that the third wavelength light is condensed to the plurality of third pixels, and change a phase of the fourth wavelength light incident on the color separating lens array such that the fourth wavelength light is condensed to the plurality of fourth pixels.

The sensor substrate may include a plurality of third pixels configured to sense third wavelength light, and a plurality of fourth pixels configured to sense fourth wavelength light, the second wavelength light may be red light, the third wavelength light may be blue light, the fourth wavelength light may be green light, and the color separating lens array may be configured to change the phase of the first wavelength light and a phase of the fourth wavelength light that are incident on the color separating lens array such that combined light of the first wavelength light and the fourth wavelength light is condensed to the plurality of first pixels and the plurality of fourth pixels.

The image sensor may further include a color filter disposed on the plurality of fourth pixels, the color filter being configured to block infrared ray.

The image sensor may further include a color filter disposed on the plurality of first pixels, the color filter being configured to block visible light.

The color separating lens array may be configured to change a phase of the second wavelength light incident on the color separating lens array such that the second wavelength light is condensed to the plurality of second pixels, and change a phase of the third wavelength light incident on the color separating lens array such that the third wavelength light is condensed to the plurality of third pixels.

The plurality of light condensing regions may include a first wavelength light condensing region, the color separating lens array may include a plurality of second wavelength light condensing regions configured to respectively condense the second wavelength light on the plurality of second pixels, and an area of each of the plurality of second wavelength light condensing regions may be larger than that of the first wavelength light condensing region.

According to another aspect of an example embodiment, there is provided an electronic device including an image sensor configured to convert an optical image into an electrical signal, and a processor configured to control the image sensor, and store and output a signal generated by the image sensor, wherein the image sensor includes a sensor substrate including a plurality of first pixels configured to sense first wavelength light in an infrared ray band and a plurality of second pixels configured to sense second wavelength light in a visible light band, and a color separating lens array disposed on the sensor substrate and configured to change a phase of the first wavelength light incident on the color separating lens array such that the first wavelength light is condensed to the plurality of first pixels, wherein the color separating lens array may include a plurality of light condensing regions configured to condense the first wavelength light respectively on the plurality of first pixels, and an area of each of the plurality of light condensing regions is larger than an area of each of the plurality of first pixels.

The plurality of light condensing regions may be configured to change the phase of the first wavelength light such that the first wavelength light passing through the plurality of light condensing regions has a phase profile that reduces in a direction away from a center of the plurality of light condensing regions.

The area of each of the plurality of light condensing regions may be 1.5 to 4 times larger than the area of each of the plurality of first pixels.

The color separating lens array may be configured such that a phase of the second wavelength light passing through the color separating lens array has a constant phase profile.

The electronic device may further include an infrared filter disposed between the sensor substrate and the color separating lens array that face the plurality of first pixels in a vertical direction, the infrared filter being configured to block visible light.

The electronic device may further include a color filter disposed between the sensor substrate and the color separating lens array that face the plurality of second pixels, color filter being configured to block infrared ray.

The electronic device may further include a microlens disposed on the color filter.

The color separating lens array may include a first pixel corresponding region disposed to face the plurality of first pixels in a vertical direction and including a first nanopost, and a second pixel corresponding region disposed to face the plurality of second pixels in the vertical direction and including a second nanopost.

The first nanopost may be disposed in a center of the first pixel corresponding region, the second nanopost may be disposed in a center of the second pixel corresponding region, and a cross-sectional area of the first nanopost may be larger than a cross-sectional area of the second nanopost.

The plurality of light condensing regions may include a first wavelength light condensing region, the second wavelength light may include red light or blue light, the color separating lens array may include a second wavelength light condensing region configured to condense the second wavelength light to the plurality of second pixels, an area of the second wavelength light condensing region may be larger than an area of the plurality of second pixels, and the first wavelength light condensing region may partially overlap the second wavelength light condensing region.

The sensor substrate may include a plurality of third pixels configured to sense third wavelength light, and a plurality of fourth pixels may be configured to sense fourth wavelength light, the second wavelength light may be red light, the third wavelength light may be blue light, and the fourth wavelength light may be green light, and the color separating lens array may be configured to change a phase of the second wavelength light incident on the color separating lens array such that the second wavelength light is condensed to the plurality of second pixels, change a phase of the third wavelength light incident on the color separating lens array such that the third wavelength light is condensed to the plurality of third pixels, and change a phase of the fourth wavelength light incident on the color separating lens array such that the fourth wavelength light is condensed to the plurality of fourth pixels.

The sensor substrate may include a plurality of third pixels configured to sense third wavelength light, and a plurality of fourth pixels configured to sense fourth wavelength light, the second wavelength light may be red light, the third wavelength light may be blue light, and the fourth wavelength light may be green light, and the color separating lens array may be configured to change phases of the first wavelength light and the fourth wavelength light that are incident on the color separating lens array such that combined light of the first wavelength light and the fourth wavelength light is condensed on the plurality of first pixels and the plurality of fourth pixels.

The electronic device may further include a color filter disposed on the plurality of fourth pixels, the color filter being configured to block infrared ray.

The electronic device may further include a color filter disposed on the plurality of first pixels, the color filter being configured to block visible light.

The color separating lens array may be configured to change a phase of the second wavelength light incident on the color separating lens array such that the second wavelength light is condensed on the plurality of second pixels, and change a phase of the third wavelength light incident on the color separating lens array such that the third wavelength light is condensed on the plurality of third pixels.

The plurality of light condensing regions may include a first wavelength light condensing region, the color separating lens array may include a plurality of second wavelength light condensing regions configured to respectively condense the second wavelength light on the plurality of second pixels, and an area of each of the plurality of second wavelength light condensing regions may be larger than that of the first wavelength light condensing region.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
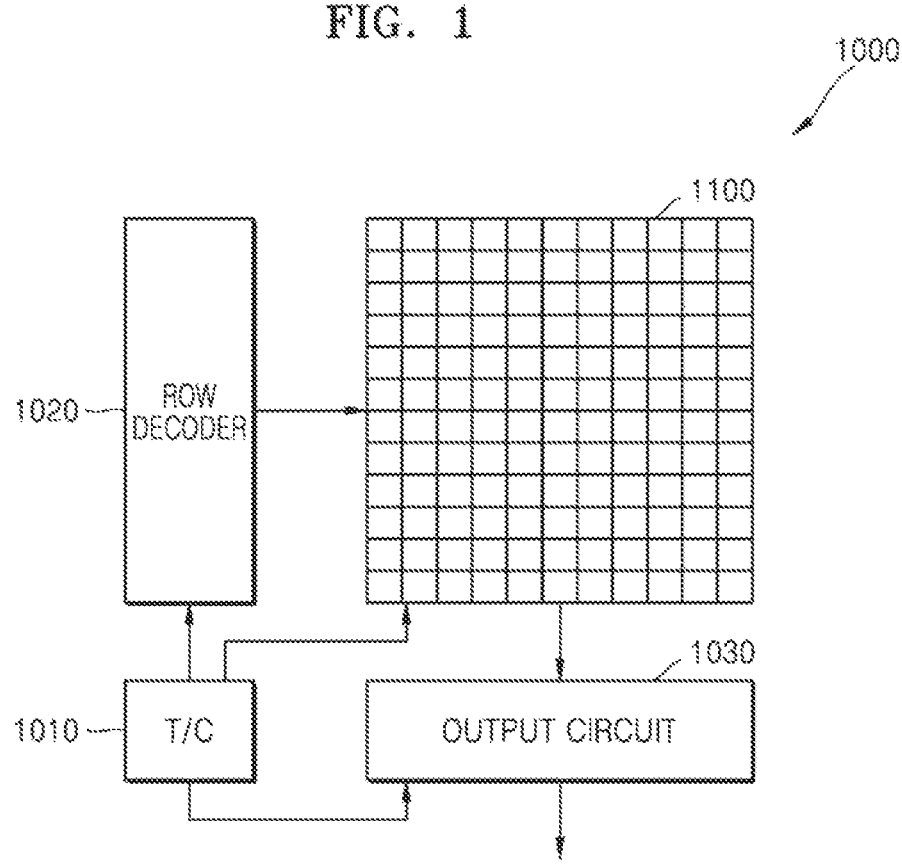
FIG. 1 is a block diagram of an image sensor according to example an embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, an image sensor including a color separating lens array and an electronic device including the image sensor will be described in detail with reference to accompanying drawings. The example embodiments of the disclosure are capable of various modifications and may be embodied in many different forms. In the drawings, like reference numerals denote like components, and sizes of components in the drawings may be exaggerated for convenience of explanation.

When a layer, a film, a region, or a panel is referred to as being "on" another element, it may be directly on/under/at left/right sides of the other layer or substrate, or intervening layers may also be present.

It will be understood that although the terms "first," "second," etc. may be used herein to describe various components, these components should not be limited by these terms. These components are only used to distinguish one component from another. These terms do not limit that materials or structures of components are different from one another.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

In addition, the terms such as " . . . unit", "module", etc. provided herein indicates a unit performing a function or operation, and may be realized by hardware, software, or a combination of hardware and software.

The use of the terms of "the above-described" and similar indicative terms may correspond to both the singular forms and the plural forms.

Also, the steps of all methods described herein may be performed in any suitable order unless otherwise indicated herein or otherwise clearly contradicted by context. Also, the use of all exemplary terms (for example, etc.) is only to describe a technical spirit in detail, and the scope of rights is not limited by these terms unless the context is limited by the claims.

FIG. 1 is a schematic block diagram of an image sensor 1000 according to an example embodiment. Referring to FIG. 1, the image sensor 1000 may include a pixel array 1100, a timing controller 1010, a row decoder 1020, and an output circuit 1030. The image sensor 1000 may include a charge coupled device (CCD) image sensor or a complementary metal oxide semiconductor (CMOS) image sensor.

The pixel array 1100 includes pixels that are two-dimensionally arranged in a plurality of rows and columns. The row decoder 1020 selects one of the rows in the pixel array 1100 in response to a row address signal output from the timing controller 1010. The output circuit 1030 outputs a photosensitive signal, in a column unit, from a plurality of pixels arranged in the selected row. To this end, the output circuit 1030 may include a column decoder and an analog-to-digital converter (ADC). For example, the output circuit 1030 may include a column decoder and a plurality of ADCs arranged respectively for the columns in the pixel array 1100 or one ADC arranged at an output end of a column decoder. The timing controller 1010, the row decoder 1020, and the output circuit 1030 may be implemented as one chip or in separate chips. A processor for processing an image signal output from the output circuit 1030 may be implemented as one chip with the timing controller 1010, the row decoder 1020, and the output circuit 1030.

The pixel array 1100 may include a plurality of pixels that sense light of different wavelengths, and in particular, may include an infrared pixel that senses light in an infrared band. An image sensor including the infrared pixel may perform various functions such as distance measurement, iris recognition, and night vision, and an arrangement of pixels including the infrared pixel may be implemented in various ways. For example, FIGS. 2A to 2C show various pixel arrangements of the pixel array 1100 of the image sensor 1000.

Figure 2A:
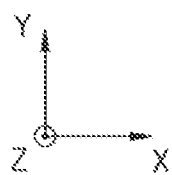
FIGS. 2A, 2B, and 2C are diagrams showing pixel patterns applicable to an image sensor.
Figure 2B:
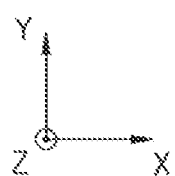
Figure 2C:
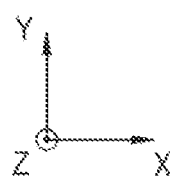

FIG. 2A shows an arrangement in which one of green pixels G in a Bayer pattern that is generally adopted in the image sensor 1000 is replaced with an infrared pixel IR. Referring to FIG. 2A, one unit pattern includes four quadrant regions, and first through fourth quadrants may be the blue pixel B, the green pixel G, the red pixel R, and the infrared pixel IR, respectively. The unit patterns may be repeatedly and two-dimensionally arranged in a first direction (X direction) and a second direction (Y direction). For example, one green pixel G, one blue pixel B, one red pixel R, and one infrared pixel IR are arranged in a unit pattern of a 2×2 array. In the entire arrangement of pixels, a first row in which a plurality of green pixels G and a plurality of blue pixels B are alternately arranged in the first direction (X direction) and a second row in which a plurality of red pixels R and a plurality of infrared pixels IR are alternately arranged in the first direction (X direction) are repeatedly arranged in the second direction (Y direction).

However, the arrangement of the pixel array 1100 may have various types, in addition to the arrangement of FIG. 2A. For example, FIG. 2B shows an arrangement in which one of the red pixel R and the blue pixel B of the Bayer pattern is replaced with the infrared pixel IR. Also, referring to FIG. 2C, an arrangement in which the 2×2 unit pattern of the Bayer pattern is replaced with one infrared pixel IR is also possible. In addition, the unit pattern may be in the form of a 3×2 array, and an arrangement in which the green pixel G, the blue pixel B, and the red pixel R are respectively replaced with a magenta pixel M, a cyan pixel C, and a yellow pixel Y is also possible. In addition to the above examples, the pixels in the pixel array 1100 may be arranged in various ways according to color characteristics of the image sensor 1000. Hereinafter, it will be described that the pixel array 1100 in the image sensor 1000 has the arrangement of FIG. 2A, but an operating principle also applies to other types of pixel arrangements.

Figure 3A:
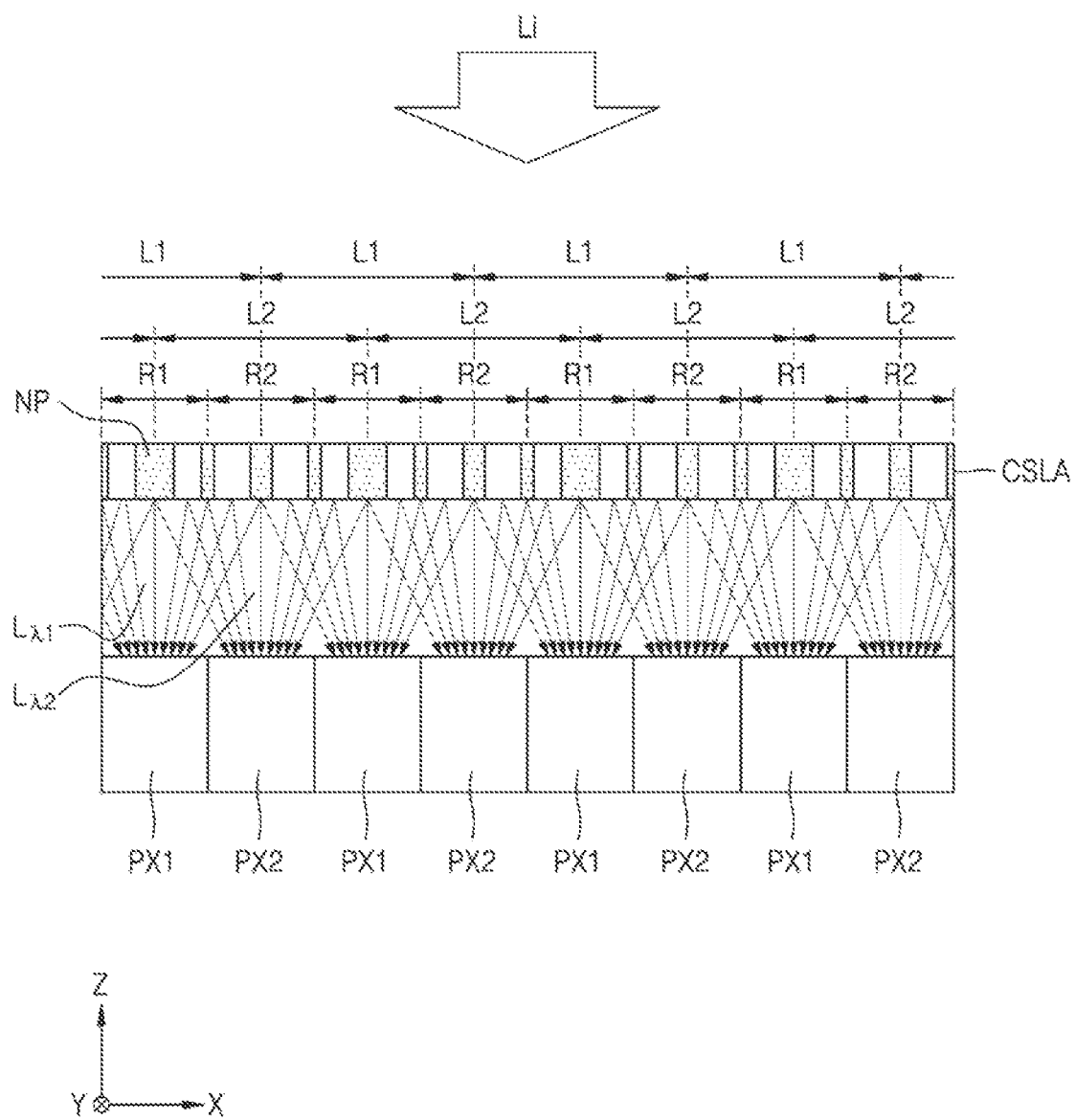
FIGS. 3A and 3B are conceptual diagrams showing the structure and operations of a color separating lens array.
Figure 3B:
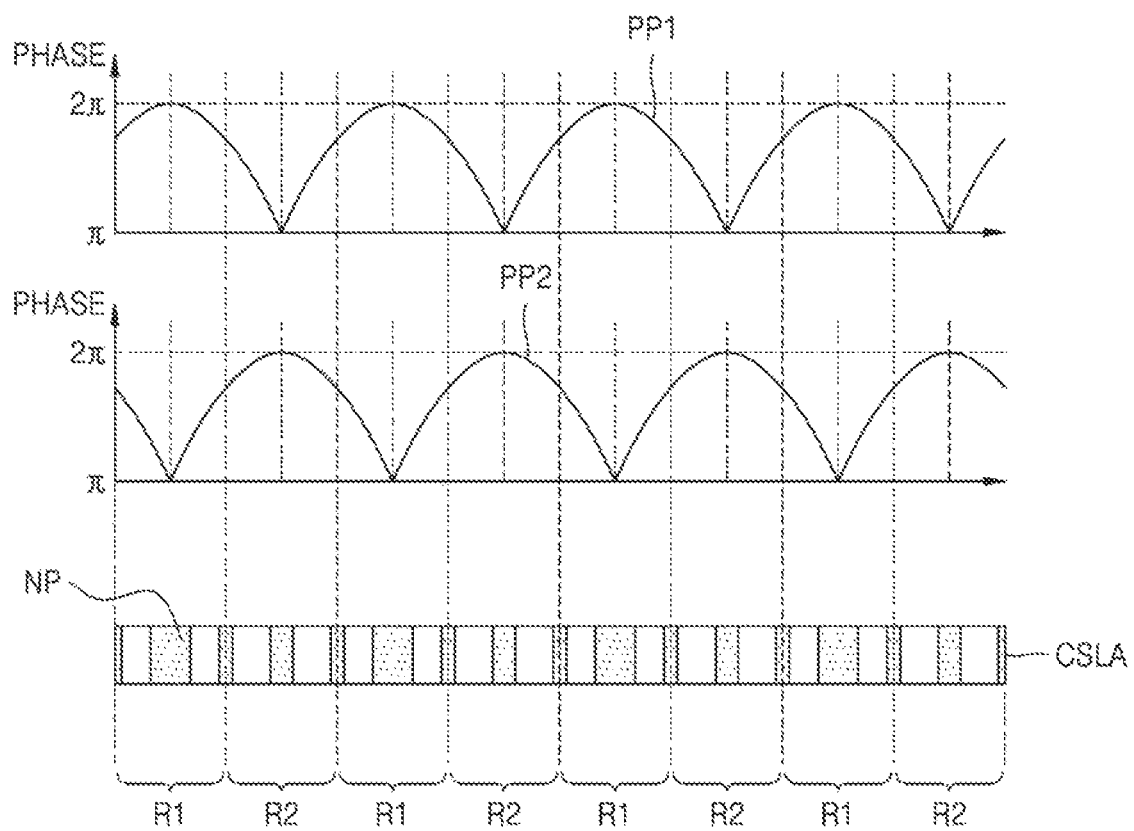

The pixel array 1100 of the image sensor 1000 may include a color separating lens array that condenses light of a color corresponding to a specific pixel. FIGS. 3A and 3B are conceptual diagrams showing the structure and operations of a color separating lens array CSLA.

Referring to FIG. 3A, the color separating lens array CSLA may include a plurality of nanoposts NP that change a phase of incident light Li differently according to an incidence position. The color separating lens array CSLA may be divided in various ways. For example, the color separating lens array CSLA may be divided into a first pixel corresponding region 131 corresponding to a first pixel PX1 on which first wavelength light $L_{\lambda 1}$ included in the incident light Li is condensed, and a second pixel corresponding region 132 corresponding to a second pixel PX2 on which second wavelength light $L_{\lambda 2}$ included in the incident light Li is condensed. Each of the first and second pixel corresponding regions 131 and 132 may include one or more nanoposts NP. The first and second pixel corresponding regions 131 and 132 may respectively face the first and second pixels PX1 and PX2 in a vertical direction. As another example, the color separating lens array CSLA may be divided into a first wavelength condensing region L1 configured to condense the first wavelength light $L_{\lambda 1}$ on the first pixel PX1 and a second wavelength condensing region L2 configured to condense the second wavelength light $L_{\lambda 2}$ on the second pixel PX2. The first wavelength condensing region L1 and the second wavelength condensing region L2 may partially overlap each other.

The color separating lens array CSLA may form different phase profiles in the first wavelength light $L_{\lambda 1}$ and the second wavelength light $L_{\lambda 2}$ included in the incident light Li so that the first wavelength light $L_{\lambda 1}$ may be condensed on the first pixel PX1 and the second wavelength light $L_{\lambda 2}$ may be condensed on the second pixel PX2.

For example, referring to FIG. 3B, the color separating lens array CSLA may allow the first wavelength light $L_{\lambda 1}$ to have a first phase profile PP1 and the second wavelength light $L_{\lambda 2}$ to have a second phase profile PP2 at a location right after passing through the color separating lens array CSLA, at a lower surface location of the color separating lens array CSLA, so that the first wavelength light $L_{\lambda 1}$ and the second wavelength light $L_{\lambda 2}$ may be condensed on the respective corresponding first and second pixels PX1 and PX2. For example, the first wavelength light $L_{\lambda 1}$ passing through the color separating lens array CSLA may have the phase profile PP1 that is the largest at the center of the first pixel corresponding region R1, and reduces in a direction away from the center of the first pixel corresponding region R1, that is, in a direction of the second pixel corresponding region R2. This phase profile may be similar to a phase profile of light converged to a point through a convex lens, for example, a microlens having a convex center, disposed in the first wavelength condensing region L1 and the first wavelength light $L_{\lambda 1}$ may be condensed on the first pixel PX1. In addition, the second wavelength light $L_{\lambda 2}$ passing through the color separating lens array CSLA may have the phase profile PP2 that is the largest at the center of the second pixel corresponding region R2, and reduces in a direction away from the center of the second pixel corresponding region R2, that is, in a direction of the first pixel corresponding region R1, and may be condensed on the second pixel PX2.

Because the refractive index of a material differs depending on the wavelength of reacting light, as shown in FIG. 3B, the color separating lens array CSLA may provide different phase profiles with respect to the first wavelength light $L_{\lambda 1}$ and the second wavelength light $L_{\lambda 2}$. For example, because the same material has a different refractive index according to the wavelength of light reacting to the material and a phase delay experienced by light when passing through the material is also different for each wavelength, a different phase profile may be formed for each wavelength. For example, the refractive index of the first pixel corresponding region R1 with respect to the first wavelength light $L_{\lambda 1}$ may be different from the refractive index of the first pixel corresponding region R1 with respect to the second wavelength light $L_{\lambda 2}$, and the phase delay experienced by the first wavelength light $L_{\lambda 1}$ passing through the first pixel corresponding region R1 and the phase delay experienced by the second wavelength light $L_{\lambda 2}$ passing through the first pixel corresponding region R1 may be different from each other. Thus, when the color separating lens array CSLA is designed considering the characteristics of light, different phase profiles may be provided with respect to the first wavelength light $L_{\lambda 1}$ and the second wavelength light $L_{\lambda 2}$.

The color separating lens array CSLA may include the nanoposts NP arranged in a specific rule so that first wavelength light $L_{\lambda 1}$ and the second wavelength light $L_{\lambda 2}$ have the first and second phase profiles PP1 and PP2, respectively. Here, the rule may be applied to parameters, such as the shape of the nanoposts NP, sizes (width and height), a distance between the nanoposts NP, and the arrangement form thereof, and these parameters may be determined according to a phase profile to be implemented through the color separating lens array CSLA.

A rule in which the nanoposts NP are arranged in the first pixel corresponding region R1, and a rule in which the nanoposts NP are arranged in the second pixel corresponding region R2 may be different from each other. For example, the shape, size, space, and/or arrangement of the nanoposts NP included in the first pixel corresponding region R1 may be different from the shape, size, space, and/or arrangement of the nanoposts NP included in the second pixel corresponding region R2.

The cross-sectional diameters of the nanoposts NP may have sub-wavelength dimensions. Here, the sub-wavelength refers to a wavelength less than a wavelength band of light to be branched. The nanoposts NP may have dimensions less than a shorter wavelength among first and second wavelengths. When the incident light Li is a visible ray, the cross-sectional diameters of the nanoposts NP may have dimensions less than 400 nm, 300 nm, or 200 nm. The heights of the nanoposts NP may be 500 nm to 1500 nm, and may be larger than the cross-sectional diameters thereof. The nanoposts NP may be a combination of two or more posts stacked in a height direction (Z direction).

The nanoposts NP may include a material having a higher refractive index than that of a peripheral material. For example, the nanoposts NP may include c-Si, p-Si, a-Si and a Group III-V compound semiconductor (gallium phosphide (GaP), gallium nitride (GaN), gallium arsenide (GaAs), etc.), silicon carbide (SiC), titanium oxide ($TiO_2$), silicon nitride (SiN), and/or a combination thereof. The nanoposts NP having a difference in a refractive index from the refractive index of the peripheral material may change a phase of light that passes through the nanoposts NP. This is caused by a phase delay due to the shape dimension of the sub-wavelength of the nanoposts NP, and a degree of the phase delay may be determined by detailed shape dimensions, arrangement types, etc. of the nanoposts NP. The peripheral material of the nanoposts NP may include a dielectric material having a lower refractive index than that of the nanoposts NP. For example, the peripheral material may include silicon oxide ($SiO_2$) or air.

The first wavelength $\lambda 1$ and the second wavelength $\lambda 2$ may be in a wavelength band of infrared or visible rays, but are not limited thereto. The first wavelength $\lambda 1$ and the second wavelength $\lambda 2$ may operate in a variety of wavelengths according to the arrangement rule of an array of the plurality of nanoposts NP. Although it is described that two wavelengths are branched and condensed, incident light may be branched into three or more directions according to wavelengths and condensed.

In addition, although it is described that the color separating lens array CSLA includes one layer, the color separating lens array CSLA may have a structure in which a plurality of layers are stacked. For example, the CSLA may be designed where a first layer condenses visible light on a specific pixel, and a second layer condenses infrared ray on other pixels.

Hereinafter, an example is described in which the color separating lens array CSLA described above is applied to the pixel array 1100 of the image sensor 1000.

Figure 4A:
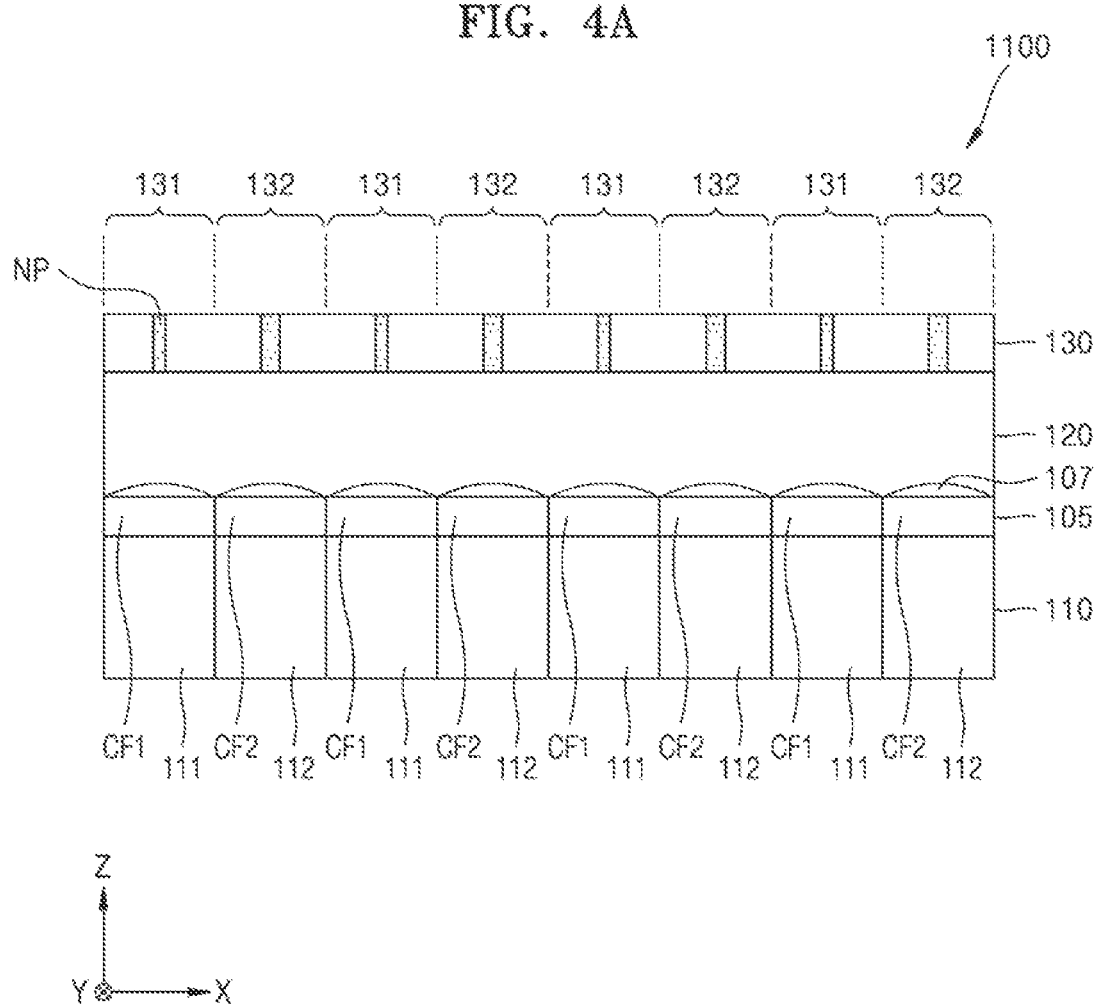
FIGS. 4A and 4B are cross-sectional views of a pixel array according to an example embodiment.
Figure 4B:
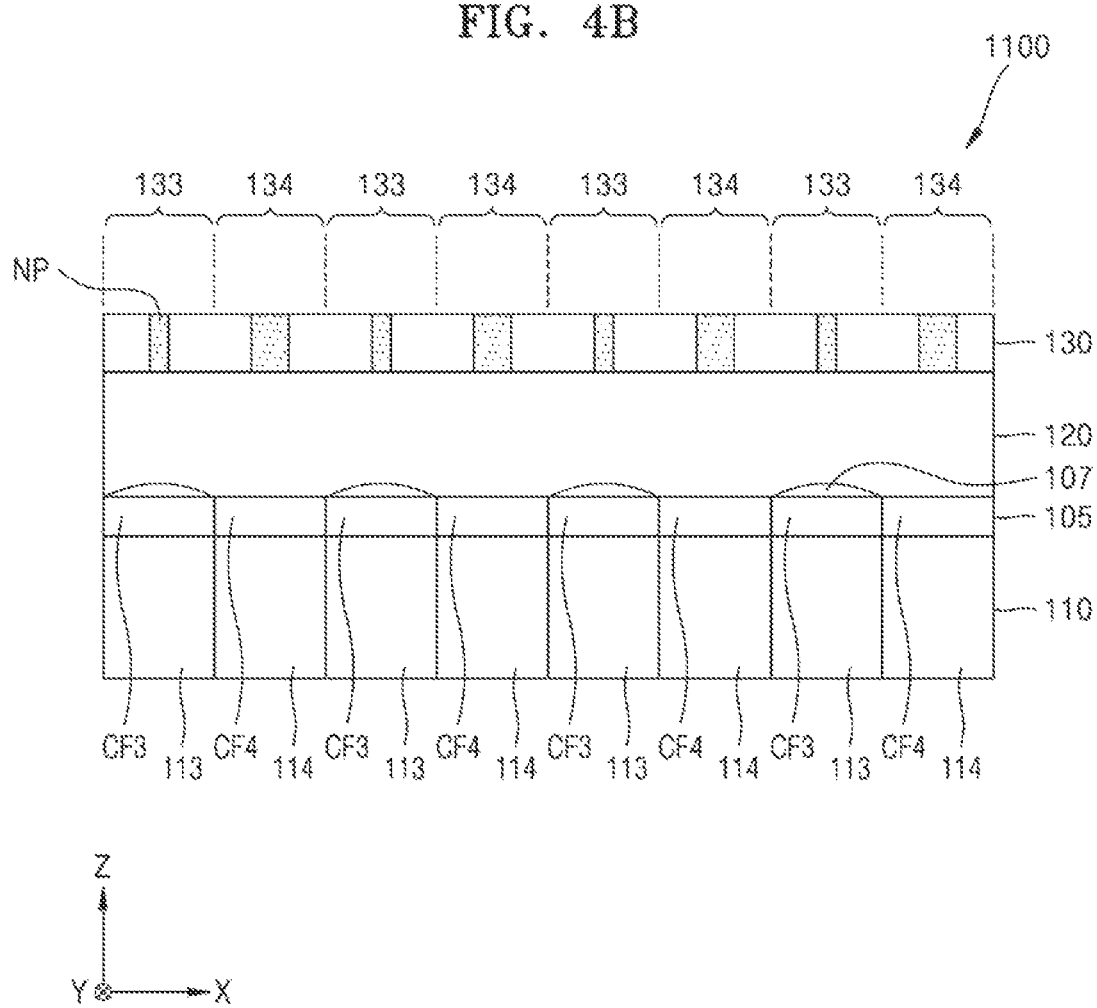
Figure 5A:
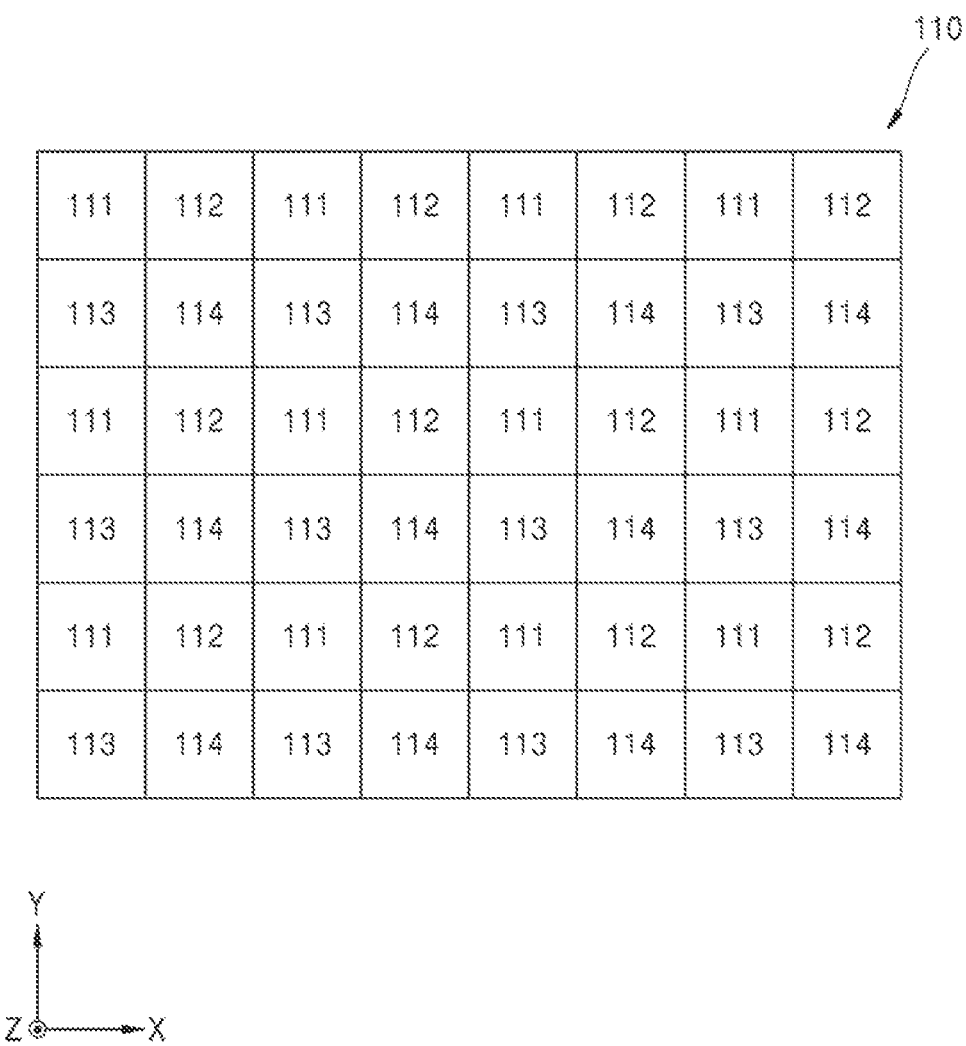
FIG. 5A is a plan view showing an arrangement of pixels of the pixel array of FIGS. 4A and 4B.
Figure 5B:
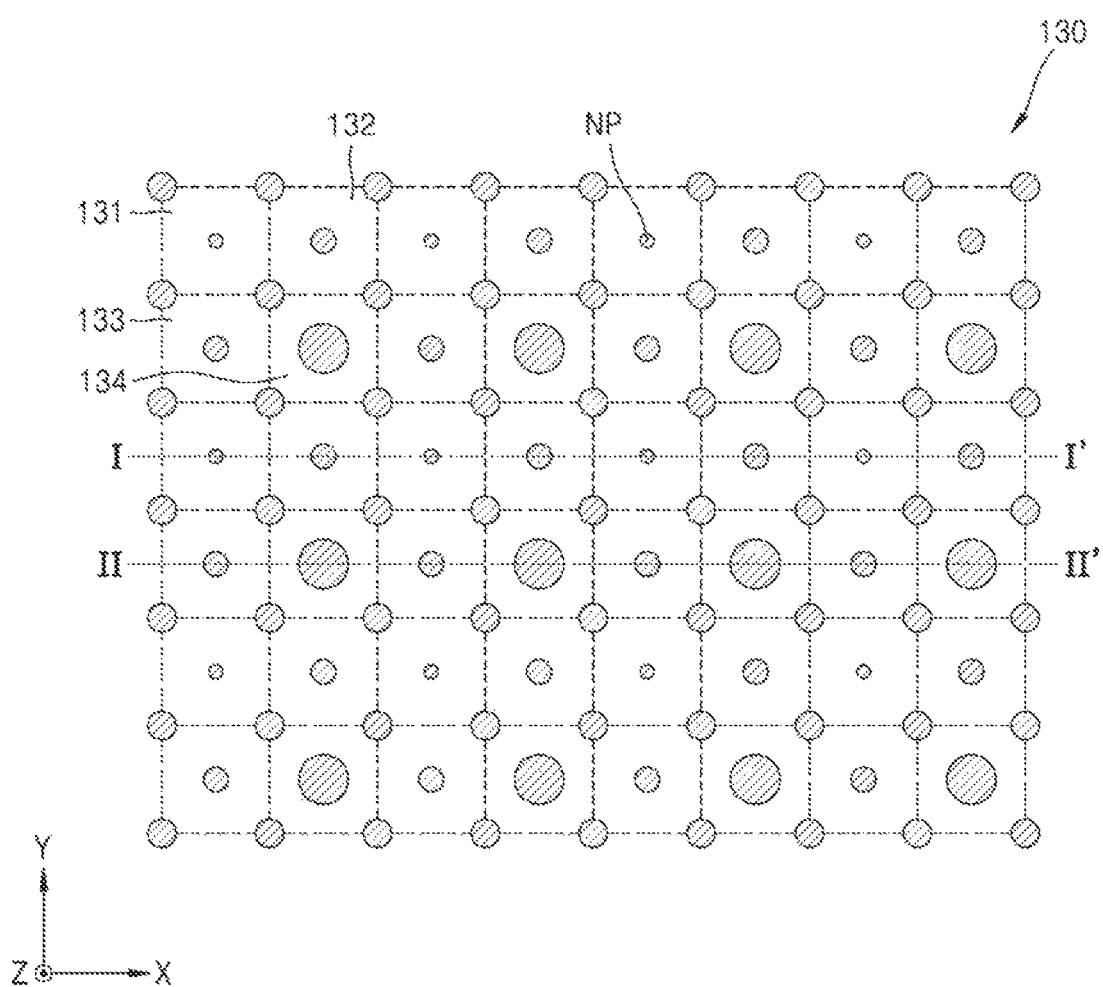
FIG. 5B is a plan view showing an example of an arrangement of a plurality of nanoposts of a color separating lens array of FIGS. 4A and 4B.
Figure 5C:
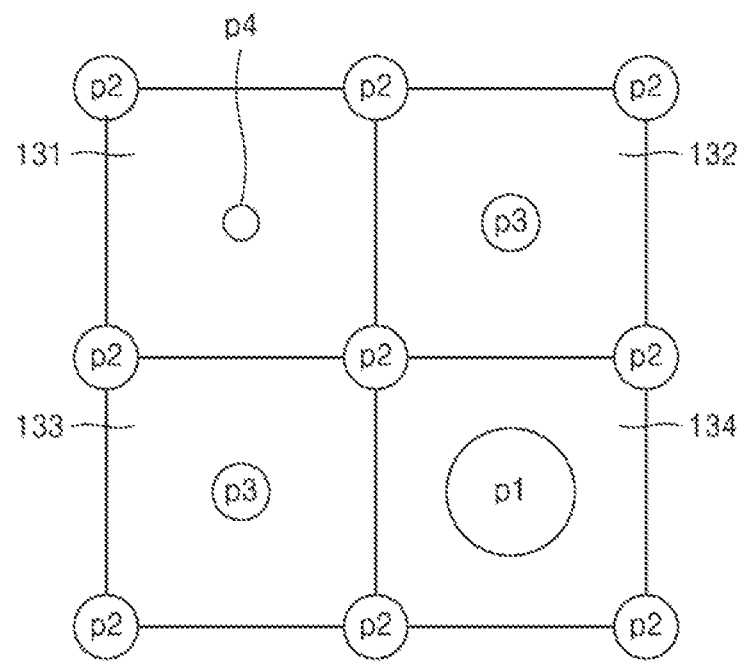
FIG. 5C is a detailed view of an arrangement of nanoposts of green, blue, red, and infrared pixel corresponding regions constituting a partial region of FIG. 5B, e.g., a unit pattern.

FIGS. 4A and 4B are schematic cross-sectional views of the pixel array 1100 according to an example embodiment, FIG. 5A is a plan view showing an arrangement of pixels of the pixel array 1100 of FIGS. 4A and 4B, FIG. 5B is a plan view showing an example of an arrangement of the plurality of nanoposts NP of a color separating lens array 130 of FIGS. 4A and 4B, and FIG. 5C is a detailed view of an arrangement of pixel corresponding regions 131, 132, 133, and 134 constituting a partial region of FIG. 5B, e.g., a unit pattern.

Referring to FIGS. 4A and 4B, the pixel array 1100 of the image sensor 1000 may include a sensor substrate 110 including a plurality of pixels 111, 112, 113, and 114 sensing light, a transparent spacer layer 120 disposed on the sensor substrate 110, and the color separating lens array 130 on the spacer layer 120.

The sensor substrate 110 may include the green pixel 111, the blue pixel 112, the red pixel 113, and the infrared pixel 114 that convert light into electrical signals. As shown in FIG. 4A, the green pixel 111 and the blue pixel 112 may be alternately arranged in a first direction (X direction), and in a cross-section in which a Y direction location is different from FIG. 4A, as shown in FIG. 4B, the red pixel 113 and the infrared pixel 114 may be alternately arranged. This region division is for sensing incident light by a unit pattern such as a Bayer pattern. For example, the green pixel 111 may sense light having a first wavelength that corresponds to green light, the blue pixel 112 may sense light having a second wavelength that corresponds to blue light, the red pixel 113 may sense light having a third wavelength that corresponds to red light, and the infrared pixel 114 may sense light having a fourth wavelength that corresponds to infrared ray. FIG. 5A shows an arrangement of the pixels 111, 112, 113, and 114 when the pixel array 1100 of the image sensor 1000 has an arrangement shown in FIG. 2A. A separator for separating cells may be further formed in a boundary between cells.

The spacer layer 120 may be disposed between the sensor substrate 110 and the color separating lens array 130 to maintain a gap between the sensor substrate 110 and the color separating lens array 130 to be constant. The spacer layer 120 may include a transparent material with respect to the visible ray, for example, a dielectric material having a lower refractive index than that of the nanoposts NP and a low absorption coefficient in the visible ray band, e.g., $SiO_2$, siloxane-based spin on glass (SOG), etc. The thickness h of the spacer layer 120 may be selected to be within the range of $h_t-p \leq h \leq h_t+p$. In this regard, when a theoretical thickness $h_t$ of the spacer layer 120 is expressed by Equation 1 below when a refractive index of the spacer layer 120 with respect to a wavelength $\lambda_0$ is n, a pitch of a pixel is p.

$$h_t = \frac{np^2}{\lambda_0} - \frac{\lambda_0}{4n} \quad \text{[Equation 1]}$$

Here, the theoretical thickness $h_t$ of the spacer layer 120 may refer to a focal length at which light having a wavelength of $\lambda_0$ is condensed onto a top surface of the pixels 111, 112, 113, and 114 by the color separating lens array 130. $\lambda_0$ may be a reference wavelength for determining the thickness h of the spacer layer 120, and the thickness of the spacer layer 120 may be designed with respect to 540 nm, which is the central wavelength of green light.

A color filter layer 105 and a microlens layer 107 may be included between the sensor substrate 110 and the spacer layer 120. The color filter layer 105 may include filters corresponding to a pixel arrangement of the sensor substrate 110. As shown in FIG. 4A, a green filter CF1 and a blue filter CF2 are alternately arranged, and as shown in FIG. 4B, in a next row spaced apart in the Y direction, a red filter CF3 and an infrared filter CF4 are alternately arranged. The color filter layer 105 may be designed to cause only light in a specific wavelength band to transmit therethrough. For example, the green filter CF1 may cause only green light to transmit therethrough so that the green light travels to the green pixel 111, and the infrared filter CF4 may absorb and/or reflect visible rays so as not to transmit therethrough, and may cause only infrared ray to transmit therethrough so that the infrared rays travel to the infrared pixel 114. The green, blue, and red filters CF1, CF2, and CF3 may further include a filter that blocks infrared rays besides a filter which transmits only green, blue, and red light among visible light.

The microlens layer 107 may include microlenses formed on the green filter CF1, the blue filter CF2, and/or the red filter CF3, and the microlenses may be convex in a Z direction. The microlens layer 107 may condense light that passes through the color separating lens array 130 and then travels to the green, blue, and red pixels 111, 112, and 113 to the center of the pixel. The microlens layer 107 may include a light transmissive resin or a material having a refractive index higher than that of a material constituting the spacer layer 120 such as $TiO_2$.

The color separating lens array 130 may be supported by the spacer layer 120 and may include the nanoposts NPs that change the phase of incident light and dielectrics, such as air or $SiO_2$, disposed between the nanoposts NPs and having refractive indexes lower than those of the nanoposts NP.

Referring to FIG. 5B, the color separating lens array 130 may be divided into the four pixel corresponding regions 131, 132, 133, and 134 respectively corresponding to the pixels 111, 112, 113, and 114 of FIG. 5A. The green pixel corresponding region 131 may correspond to the green pixel 111 and may be disposed on the green pixel 111, the blue pixel corresponding region 132 may correspond to the blue pixel 112 and may be disposed on the blue pixel 112, the red pixel corresponding region 133 may correspond to the red pixel 113 and may be disposed on the red pixel 113, and the infrared pixel corresponding region 134 may correspond to the infrared pixel 114, and may be disposed on the infrared pixel 114. For example, the pixel corresponding regions 131, 132, 133, and 134 of the color separating lens array 130 may be disposed to respectively face the pixels 111, 112, 113, and 114 of the sensor substrate 110. The pixel corresponding regions 131, 132, 133, and 134 may be two-dimensionally arranged in the first direction (X direction) and the second direction (Y direction) so that a first row in which the green pixel corresponding region 131 and the blue pixel corresponding region 132 are alternately arranged, and a second row in which the red pixel corresponding region 133 and the infrared pixel corresponding region 134 are alternately arranged are alternately repeated to each other. The color separating lens array 130 may also include a plurality of two-dimensionally arranged unit patterns like a pixel array of the sensor substrate 110, and each unit pattern may include the pixel corresponding regions 131, 132, 133, and 134 arranged in a 2×2 form.

The color separating lens array 130 may be divided into a green light condensing region condensing green light, a blue light condensing region condensing blue light, and a red light condensing region condensing red light, similarly to that described with reference to FIG. 3B.

One or more nanoposts NP may be disposed in each of the pixel corresponding regions 131, 132, 133, and 134, and the shape, size, space, and/or arrangement of the nanoposts NP may vary depending on the region. For example, each of the pixel corresponding regions 131, 132, 133, and 134 may include one or more nanoposts NP. The size, shape, space, and/or arrangement of the nanoposts NP are determined so that travel directions of green, blue, and red light do not change, and infrared rays are condensed on the infrared pixel 114 through the color separating lens array 130. The thickness of the color separating lens array 130 in the third direction (Z direction) may be similar to the height of the nanoposts NP, and may be about 500 nm to about 1500 nm.

Referring to FIG. 5B, the pixel corresponding regions 131, 132, 133, and 134 may include the nanoposts NP each having a cylindrical shape of a circular cross-section. The nanoposts NP may also be arranged on the center of each of the pixel corresponding regions 131, 132, 133, and 134 and a crossing point of pixel boundaries. The nanopost NP having the largest cross-sectional area is disposed on the center of the infrared pixel corresponding region 134, and the nanopost NP disposed farther away from the center of the infrared pixel corresponding region 134 may have a less cross-sectional area.

FIG. 5C is a detailed view of the arrangement of the nanoposts NP in partial regions of FIG. 5B, that is, the pixel corresponding regions 131, 132, 133, and 134 constituting the unit pattern. In FIG. 5C, the nanoposts NP are indicated as p1 to p4 according to detailed locations thereof. For example, the nanoposts NP may include the nanopost p1 disposed at the center of the infrared pixel corresponding region 134, the nanopost p2 disposed on a crossing point of boundaries dividing the infrared pixel corresponding region 134, the nanopost p3 disposed at the center of the blue and red pixel corresponding regions 132 and 133, and the nanopost p4 disposed at the center of the green pixel corresponding region 131. The nanoposts p1 to p4 are arranged in the order of p1>p2>p3>p4 so that the cross-sectional area of the nanopost p1 disposed at the center of the infrared pixel corresponding region 131 is the largest, and the nanopost disposed farther away from the center of the infrared pixel corresponding region 131 have a less cross-sectional area. However, this is only an example, and the nanoposts NPs of various shapes, sizes, spaces, and/or arrangements may be applied if necessary.

The nanoposts NP have symmetrical circular cross-sectional shapes but are not limited thereto. Some nanoposts having asymmetrical cross-sectional shapes may be included. For example, nanoposts having an asymmetrical cross-sectional shape that has different widths in the first direction (X direction) and the second direction (Y direction) may be employed.

Figure 6A:
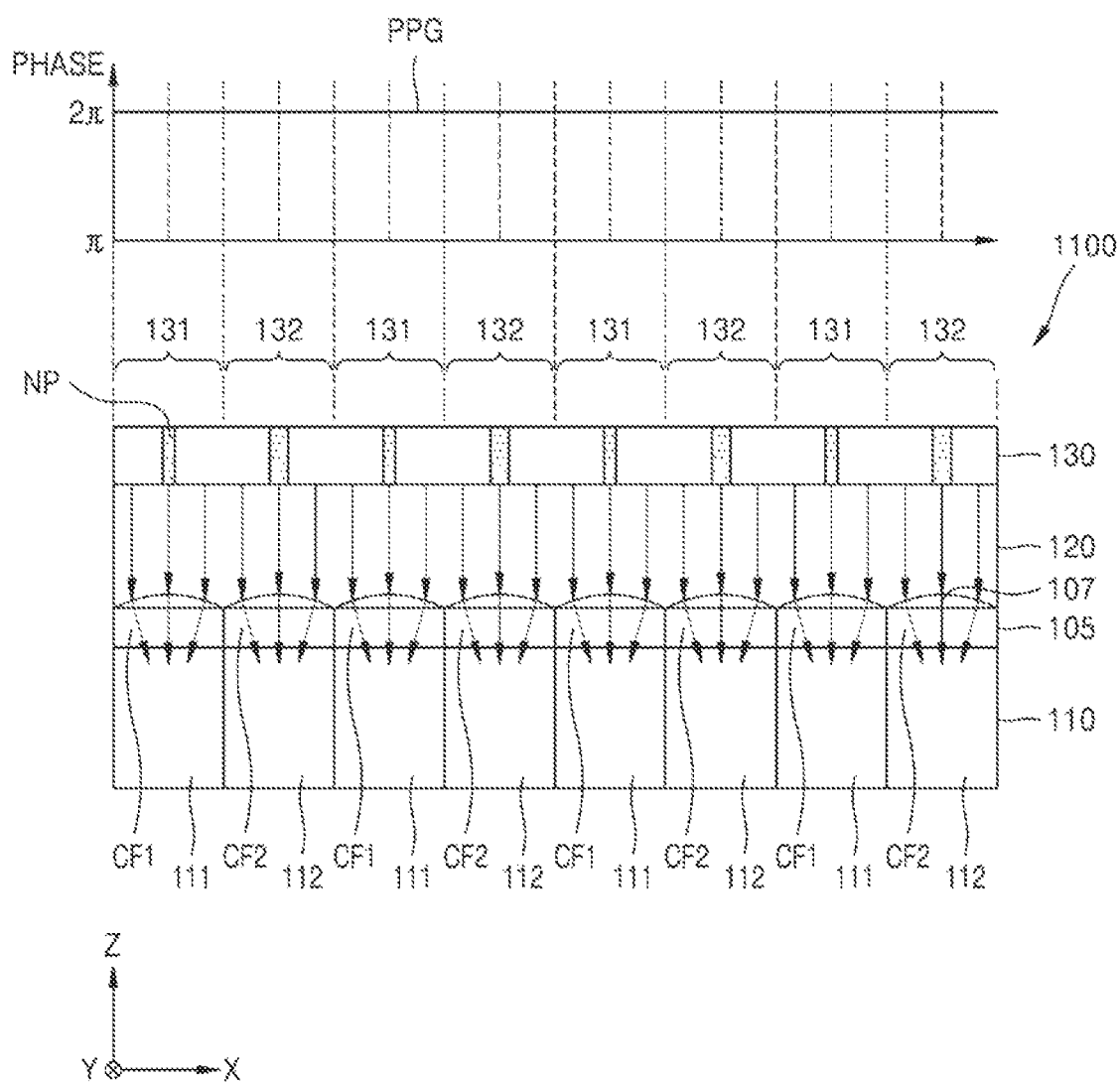
FIG. 6A shows a phase profile of green light passing through a color separating lens array along line I-I' of FIG. 5B.
Figure 6B:
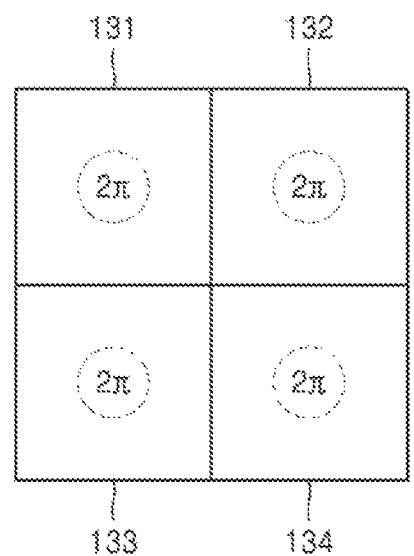
FIG. 6B shows a phase of the green light passing through the color separating lens array at the center of green, blue, red, and infrared pixel corresponding regions.

FIG. 6A shows a phase profile PPG of green light passing through the color separating lens array 130 along line I-I' of FIG. 5B, and FIG. 6B shows a phase of the green light passing through the color separating lens array 130 at the center of the pixel corresponding regions 131, 132, 133 and 134.

Referring to FIGS. 6A and 6B, the green light passing through the color separating lens array 130 may have the green light phase distribution PPG having the constant phase for each location. For example, at a location right after passing through the color separating lens array 130, at a lower surface location of the color separating lens array 130 or at an upper surface of the spacer layer 120, when a phase is 2π at the center of the green pixel corresponding region 131 of the green light, the phase of the green light at all locations passing through the color separating lens array 130 may be 2π. A phase profile that does not change depending on the location is similar to a phase profile of light passing through transparent glass having a uniform thickness, and the green light may pass through the color separating lens array 130 while maintaining a direction incident on the color separating lens array 130.

Among the green light passing through the color separating lens array 130, the light directed to the green pixel 111 may be condensed on the center of the green pixel 111 through a microlens of the microlens layer 107 disposed on the green pixel 111 and may be photoelectrically converted in the green pixel 111 through the green color filter CF1. Among the green light passing through the color separating lens array 130, the light not directed to the green pixel 111, for example, the light directed to the blue pixel 112, may be condensed on the center of the blue pixel 112 through a microlens of the microlens layer 107 disposed on the blue pixel 112, but the light may be absorbed and/or reflected by the blue color filter CF2 and not be sensed by the blue pixel 112.

Figure 7A:
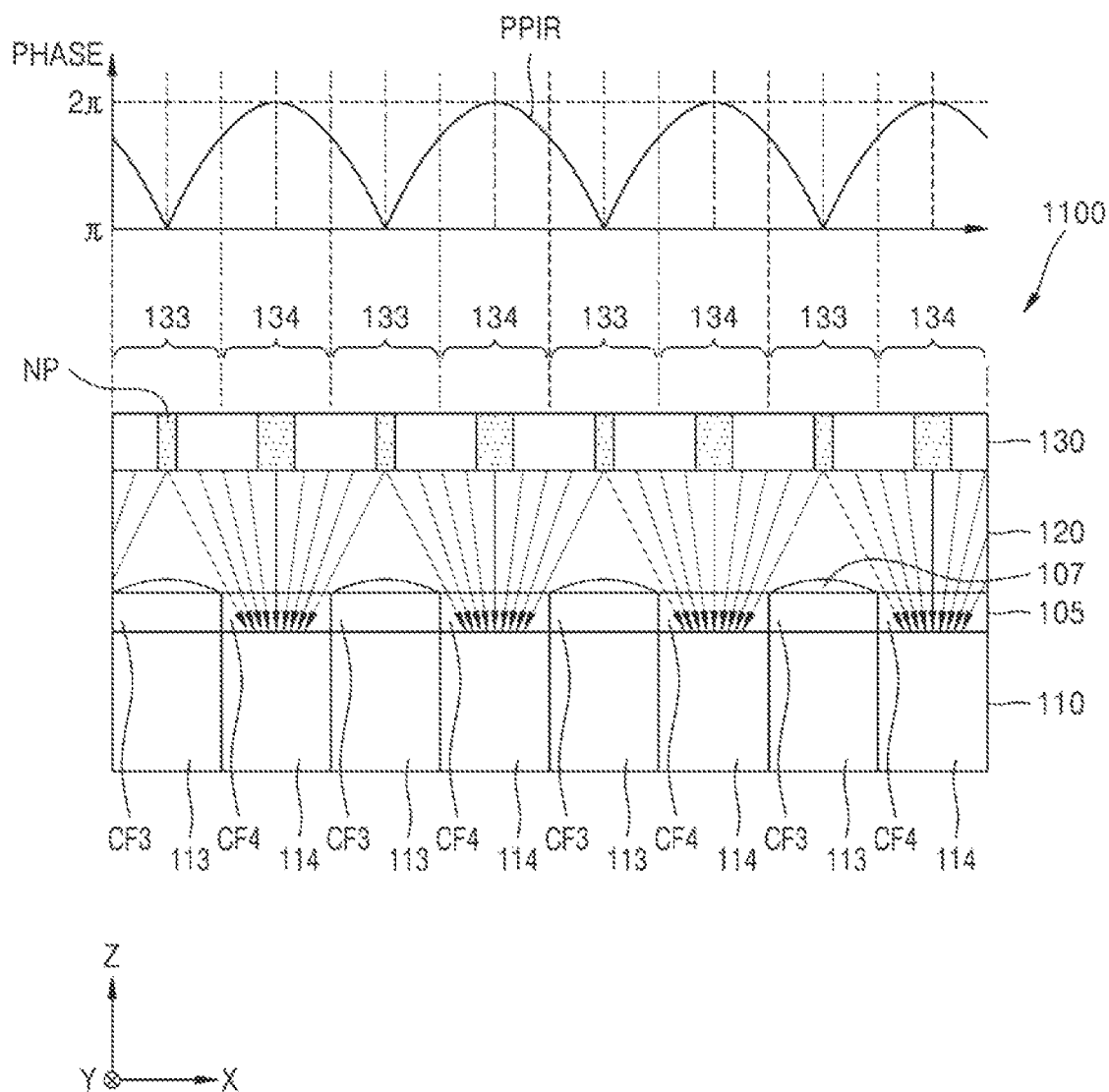
FIG. 7A shows a phase profile of infrared ray passing through a color separating lens array along line II-II' of FIG. 5B.
Figure 7B:
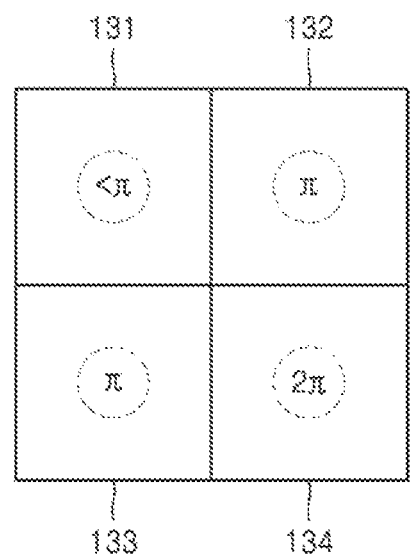
FIG. 7B shows a phase of the infrared ray passing through the color separating lens array at the center of the green, blue, red, and infrared pixel corresponding regions.

FIG. 7A shows a phase profile PPIR of infrared ray passing through the color separating lens array 130 along line II-II' of FIG. 5B, and FIG. 7B shows a phase of the infrared ray passing through the color separating lens array 130 at the center of the pixel corresponding regions 131, 132, 133 and 134.

Referring to FIGS. 7A and 7B, the infrared ray passing through the color separating lens array 130 may have the infrared ray phase profile PPIR that is the largest at the center of the infrared pixel corresponding region 134 and reduces in a direction away from the center of the infrared pixel corresponding region 134. For example, at a location right after passing through the color separating lens array 130, at a lower surface location of the color separating lens array 130 or at an upper surface of the spacer layer 120, the phase of the infrared ray may be the largest at the center of the infrared pixel corresponding region 134, may gradually reduce in the form of a concentric circle away from the center of the infrared pixel corresponding region 134, may be the smallest at the center of the blue and red pixel corresponding regions 132 and 133 in the X and Y directions, and may be the smallest at the center of the green pixel corresponding region 131 in the diagonal direction. When the phase of the infrared ray at the center of the infrared pixel corresponding region 134 is 2π, the phase of the infrared ray may be 0.9π to 1.1π at the center of the blue and red pixel corresponding regions 132 and 133, and may be a value less than π, about 0.2π to 0.9π, at the center of the green pixel corresponding region 131. The infrared ray phase profile PPIR may not mean that a phase delay amount of the light passing through the center of the infrared pixel corresponding region 134 is the largest. When the phase of the light passing through the infrared pixel corresponding region 134 is determined as 2π, when the phase delay of light passing through another location is larger and has a phase value larger than 2π, the phase value may be a value remaining by removing by 2nπ, that is, a profile of a wrapped phase. For example, when the phase of light passing through the infrared pixel corresponding region 134 is 2π, and the phase of light passing through the center of the red pixel corresponding region 133 is 3π, the phase in the red pixel corresponding region 133 may be π remaining by removing 2π (when n=1) from 3π.

Figure 7C:
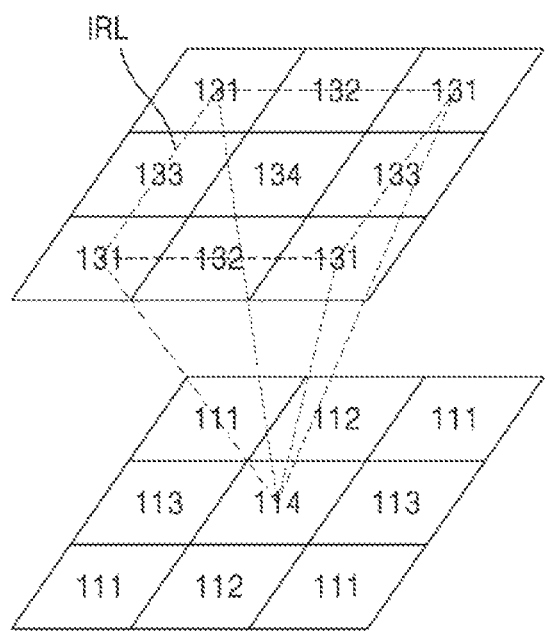
FIG. 7C shows a traveling direction of infrared ray incident on an infrared pixel corresponding region of a color separating lens array corresponding to an infrared pixel and a periphery thereof and FIG. 7D shows an infrared condensing region.
Figure 7D:
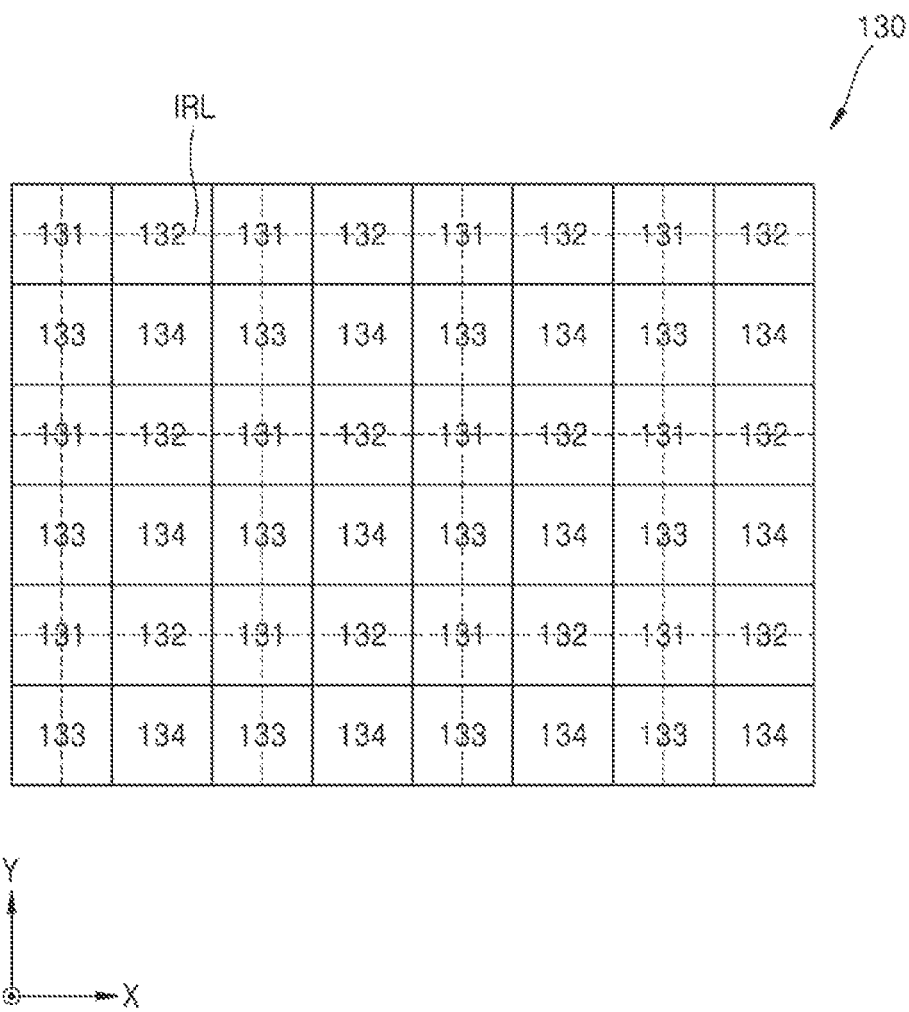

FIG. 7C shows a traveling direction of infrared ray incident on an infrared condensing region IRL, and FIG. 7D shows an array of the infrared condensing region IRL.

The infrared ray is condensed on the infrared pixel 114 by the color separating lens array 130 as shown in FIG. 7C, and the infrared ray from the pixel corresponding regions 131, 132, 133, and 134 is incident on the infrared pixel 114. In the phase profile PPIR of the infrared ray described above with reference to FIGS. 7A and 7B, the infrared ray passing through the infrared condensing region IRL by connecting the centers of four green corresponding regions 131 adjacent to the infrared pixel corresponding region 134 with vertexes facing each other is condensed on the infrared pixel 114. Accordingly, as shown in FIG. 7D, the color separating lens array 130 may operate as the array of the infrared condensing region IRL in which the infrared ray is condensed on the infrared pixel 114. Because an area of the infrared condensing region IRL is larger than that of the corresponding infrared pixel 114, not only the infrared ray traveling to the infrared pixel 114 but also the infrared ray traveling to directions of the green, blue, and red pixels 111, 112, and 113 may also be condensed on the infrared pixel 114. The area of the infrared condensing region IRL may be 1.5 to 4 times larger than the area of the infrared pixel 114. As described above, because the infrared ray may be condensed by the color separating lens array 130, a separate microlens may not be disposed on the infrared filter CF4.

Referring back to FIG. 7A, the infrared ray passing through the color separating lens array 130 may be photoelectrically converted in the infrared pixel 114 through the infrared filter CF4 formed on the infrared pixel 114. The infrared filter CF4 may be a filter for blocking visible light, and may block green, blue, and red light from being incident on the infrared pixel 114.

Phase profiles of the red light and blue light passing through the color separating lens array 130 is similar to the phase profile of the green light described above with reference to FIG. 6A. For example, there is no phase difference between the red light and blue light passing through the color separating lens array 130.

Among the blue light passing through the color separating lens array 130, the light directed to the blue pixel 112 may be condensed on the center of the blue pixel 112 through a microlens of the microlens layer 107 formed on the blue pixel 112, and may be photoelectrically converted in the blue pixel 112 through the blue color filter CF2. Among the blue light passing through the color separating lens array 130, the light directed to the green, red, and infrared pixels 111, 113 and 114 may be absorbed and/or reflected by the green, red, and infrared filters CF1, CF3 and CF4 and not be sensed by the green, red, and infrared pixels 111, 113, and 114.

Similarly, the red light passing through the color separating lens array 130 may be sensed by the red pixel 113 and not sensed by the green, blue, and infrared pixels 111, 112, and 114.

Figure 8A:
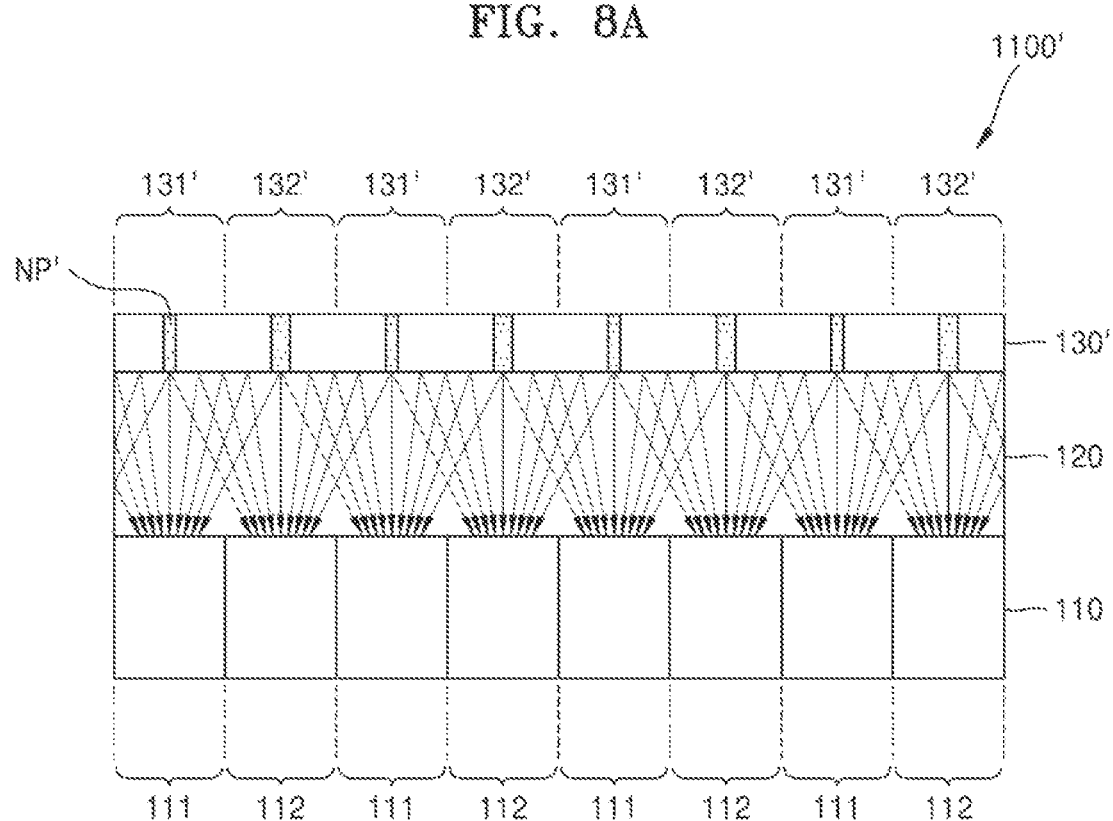
FIGS. 8A and 8B are cross-sectional views of a pixel array according to another embodiment.
Figure 8B:
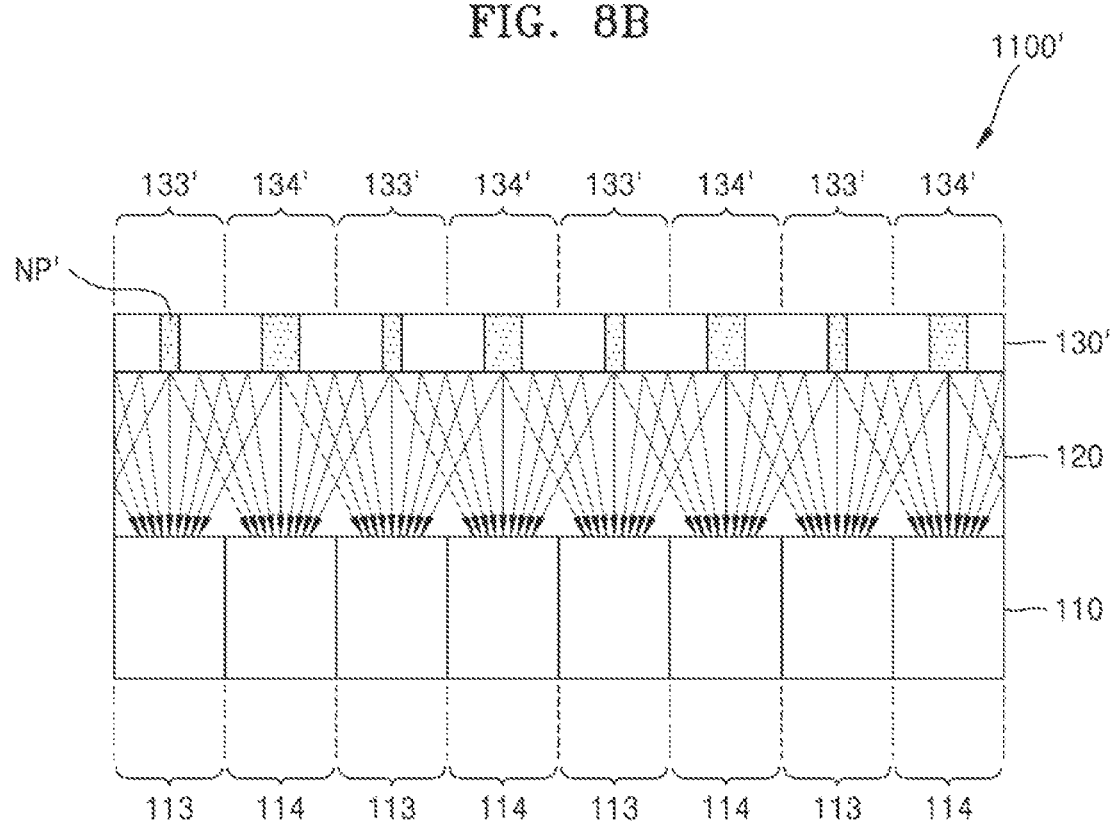
Figure 9A:
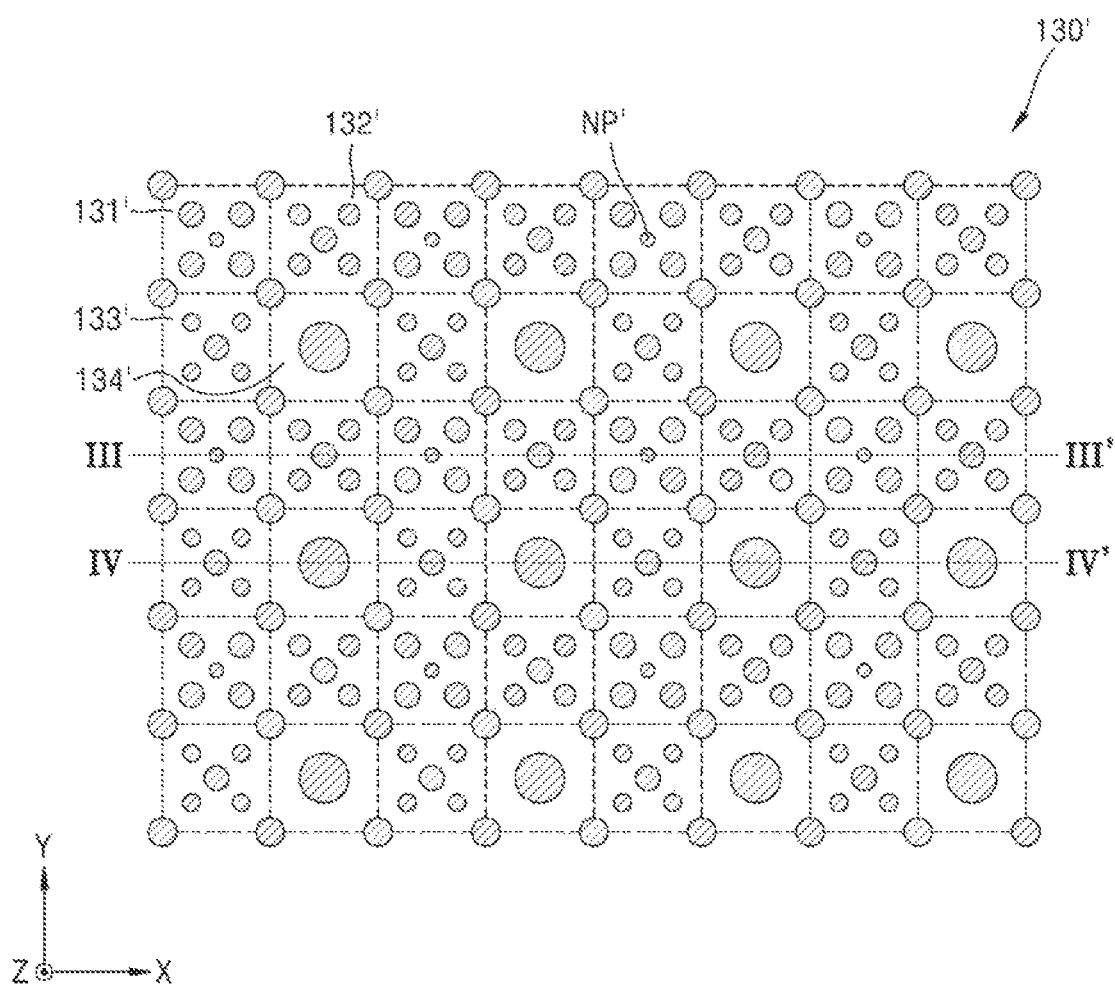
FIG. 9A is a plan view showing an example of an arrangement of the plurality of nanoposts of a color separating lens array of FIGS. 8A and 8B.
Figure 9B:
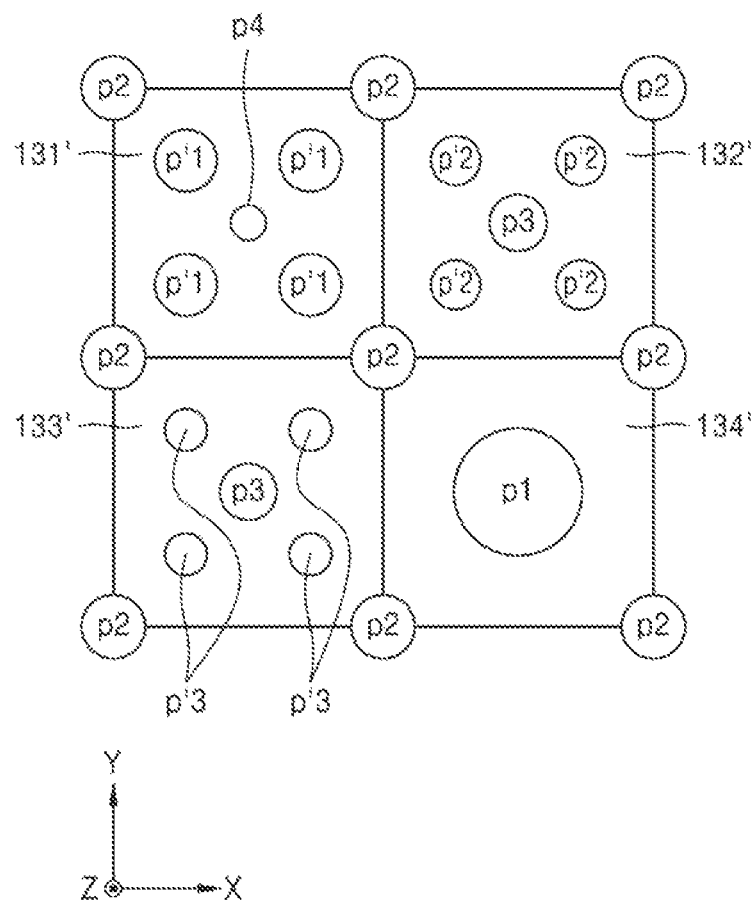
FIG. 9B is a detailed view of an arrangement of nanoposts of green, blue, red, and infrared pixel corresponding regions constituting a partial region of FIG. 9A, e.g., a unit pattern.

FIGS. 8A and 8B are cross-sectional views of a pixel array 1100' according to another example embodiment, FIG. 9A is a plan view showing an example of an arrangement of the plurality of nanoposts NP of a color separating lens array 130' of FIGS. 8A and 8B, and FIG. 9B is a detailed view of an arrangement of nanoposts NP' of a partial region of FIG. 9B.

Referring to FIGS. 8A and 8B, the pixel array 1100' of the image sensor 1000 may include the sensor substrate 110 including the plurality of pixels 111, 112, 113, and 114 sensing light, the transparent spacer layer 120 disposed on the sensor substrate 110, and the color separating lens array 130' on the spacer layer 120. The pixel array 1100' of FIGS. 8A and 8B is different from the pixel array 1100 of FIGS. 4A and 4B in that the pixel array 1100' condenses green, blue, and red light on the green, blue, and red pixels 111, 112, and 113, respectively, and may not include a microlens layer and a color filter layer. In the description of the example embodiment of FIGS. 8A and 8B, redundant descriptions with the description of the pixel array 1100 of FIGS. 4A and 4B will be omitted.

The sensor substrate 110 may include the pixels 111, 112, 113, and 114 that convert light into electrical signals, and the pixels 111, 112, 113 and 114 may sense light of first to fourth wavelengths, respectively. Hereinafter, light of the first wavelength is green light, light of the second wavelength is blue light, light of the third wavelength is red light, and light of the fourth wavelength is infrared ray. The arrangement of the pixels of FIGS. 8A and 8B is the same as that described with reference to FIG. 5A.

A color filter and a microlens may be omitted between the sensor substrate 110 and the spacer layer 120. For example, because the color separating lens array 130' of FIGS. 8A and 8B separates and condenses green light, blue light, red light and infrared ray into the respective pixels, the color separating lens array 130' may operate without a color filter and a microlens, but a color filter may be applied if necessary in order to increase color purity and color reproducibility. When the color filter is applied, for example, a visible light cut-filter may be applied to the upper portion of the infrared pixel 114, and an infrared cut-filter may be applied to the upper portions of the green, blue, and red pixels 111, 112, and 113.

The color separating lens array 130' may include the nanoposts NP' arranged to change phases of green light, blue light, red light, and infrared ray and condense the green light on the green pixel 111, the blue light on the blue pixel 112, the red light on the red pixel 113, and the infrared ray on the infrared pixel 114.

Referring to FIG. 9A, pixel corresponding regions 131', 132', 133', and 134' may include the nanoposts NP' each having a cylindrical shape of a circular cross-section. The nanoposts NP' may be also arranged inside of each of the pixel corresponding regions 131', 132', 133', and 134' and a crossing point of pixel boundaries. Compared to the color separating lens array 130 of FIG. 5B, the color separating lens array 130' of FIG. 9A may further include nanoposts for condensing visible light, that is, green light, blue light, and red light.

FIG. 9B is a detailed view of the arrangement of the nanoposts NP' in partial regions of FIG. 9A, that is, the pixel corresponding regions 131', 132', 133', and 134' constituting the unit pattern. Compared to the color separating lens array 130 of FIG. 5B, the color separating lens array 130' of FIG. 9A may further include nanoposts p'1, p'2, and p'3 disposed inside the green, blue and red pixel corresponding regions 131', 132', and 133'. For example, the color separating lens array 130' may include four nanoposts p'1 disposed between the center of the green pixel corresponding region 131' and each vertex of the green pixel corresponding region 131', four nanoposts p'2 disposed between the center of the blue pixel corresponding region 132' and each vertex of the blue pixel corresponding region 132', and four nanoposts p'3 disposed between the center of the red pixel corresponding region 133' and each vertex of the red pixel corresponding region 133'. The cross-sectional area of the nanoposts p'1 added to the green pixel corresponding region 131' may be larger than the cross-sectional area of the nanoposts p'2 and p'3 added to the blue and red pixel corresponding regions 132' and 133', and the cross-sectional area of the nanoposts p'2 added to the blue pixel corresponding region 132' may be larger than the cross-sectional area of the nanoposts p'3 added to the red pixel corresponding region 133'.

In addition, although the color separating lens array 130' of FIG. 9A shows an interleaved structure in which the additional nanoposts p'1, p'2, and p'3 and the nanoposts p1, p2, p3, and p4 included in the color separating lens array 130 of FIG. 5B are formed together on the same layer, the color separating lens array 130' may be implemented as a structure in which a color separating lens array for condensing infrared ray and a color separating lens array for condensing visible ray are formed as separate layers and a plurality of color separating lens array layers are stacked vertically.

Figure 10A:
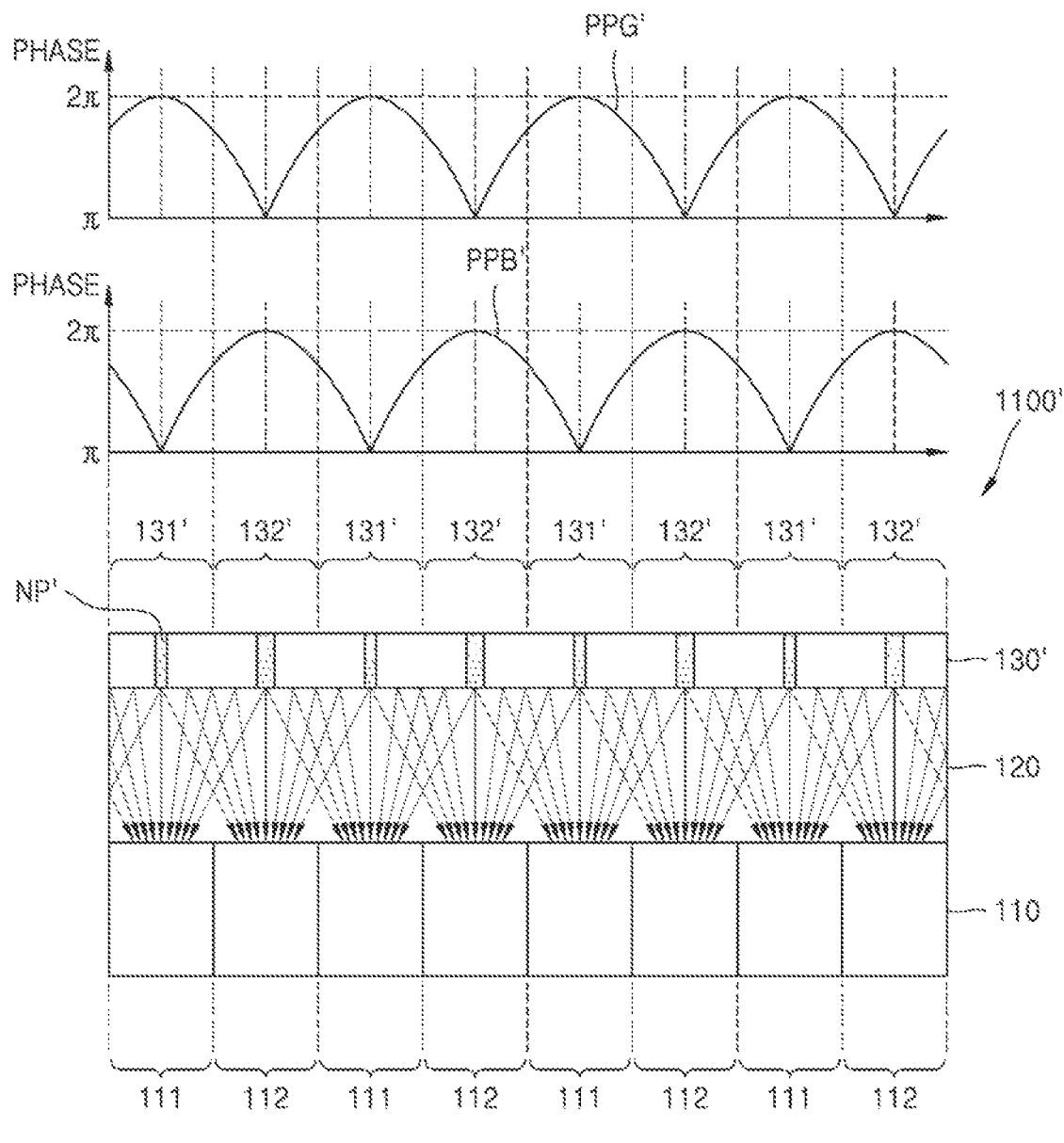
FIG. 10A shows phase profiles of green light and blue light passing through a color separating lens array along line III-III' of FIG. 9A.
Figure 10B:
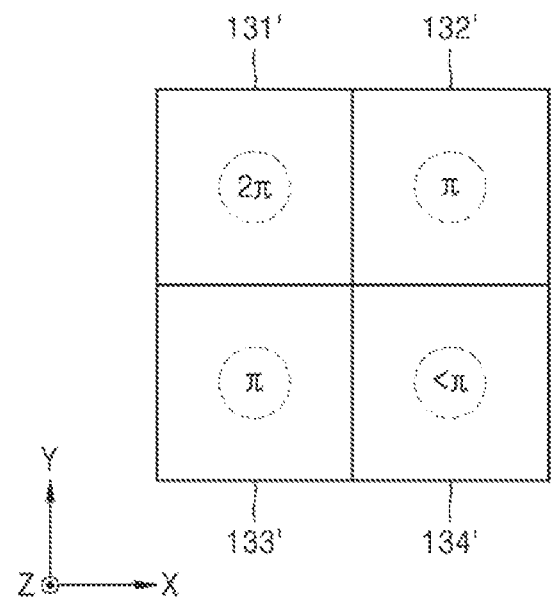
FIG. 10B shows a phase of the green light passing through the color separating lens array at the center of green, blue, red, and infrared pixel corresponding regions.
Figure 10C:
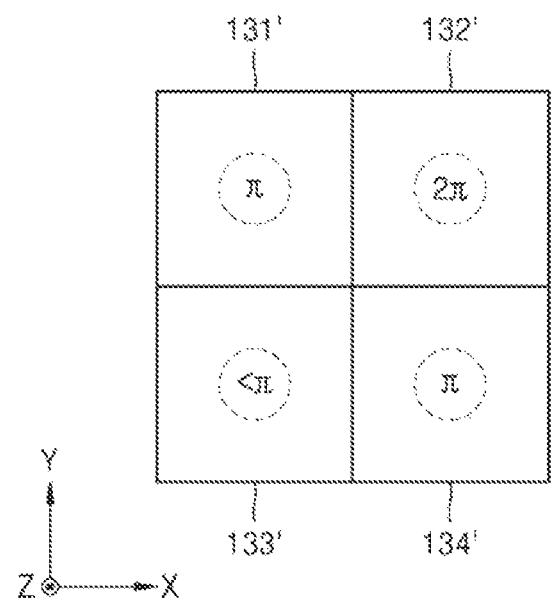
FIG. 10C shows a phase of the blue light passing through the color separating lens array at the center of the green, blue, red, and infrared pixel corresponding regions.

FIG. 10A shows phase profiles PPG' and PPB' of green light and blue light passing through the color separating lens array 130' along line III-III' of FIG. 9A, FIG. 10B shows a phase of the green light passing through the color separating lens array 130' at the center of the pixel corresponding regions 131', 132', 133', and 134', and FIG. 10C shows a phase of the blue light passing through the color separating lens array 130' at the center of the pixel corresponding regions 131', 132', 133', and 134'.

Referring to FIGS. 10A and 10B, the green light passing through the color separating lens array 130' may have the phase profile PPG' that is the largest at the center of the green pixel corresponding region 131' and reduce in a direction away from the center of the green pixel corresponding region 131'. For example, at a location right after passing through the color separating lens array 130', at a lower surface location of the color separating lens array 130' or at an upper surface of the spacer layer 120, the phase of the green light may be the largest at the center of the green pixel corresponding region 131', may gradually reduce in the form of a concentric circle away from the center of the green pixel corresponding region 131', may be the smallest at the center of the blue and red pixel corresponding regions 132' and 133' in the X and Y directions, and may be the smallest at the center of the infrared pixel corresponding region 134' in the diagonal direction. When the phase of the green light at the center of the green pixel corresponding region 131' is $2\pi$, the phase of the green light may be $0.9\pi$ to $1.1\pi$ at the center of the blue and red pixel corresponding regions 132' and 133', and may be a value less than $\pi$, about $0.2\pi$ to $0.9\pi$, at the center of the infrared pixel corresponding region 134'.

Referring to FIGS. 10A and 10C, the blue light passing through the color separating lens array 130' may have the phase profile PPB' that is the largest at the center of the blue pixel corresponding region 132' and reduce in a direction away from the center of the blue pixel corresponding region 132'. For example, at a location right after passing through the color separating lens array 130', the phase of the blue light may be the largest at the center of the blue pixel corresponding region 132', may gradually reduce in the form of a concentric circle away from the center of the blue pixel corresponding region 132', may be the smallest at the center of the green and infrared pixel corresponding regions 131' and 134' in the X and Y directions, and may be the smallest at the center of the red pixel corresponding region 133' in the diagonal direction. When the phase of the blue light at the center of the blue pixel corresponding region 132' is $2\pi$, the phase of the blue light may be $0.9\pi$ to $1.1\pi$ at the center of the green and infrared pixel corresponding regions 131' and 134', and may be a value less than $\pi$, about $0.2\pi$ to $0.9\pi$, at the center of the red pixel corresponding region 133'.

Figure 10D:
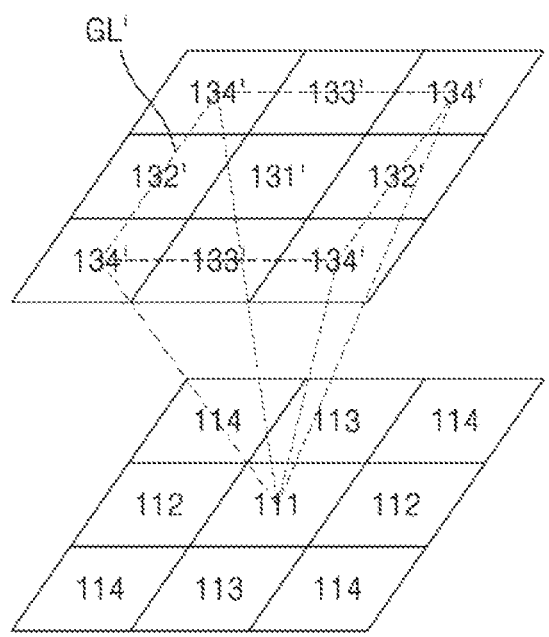
FIG. 10D shows a traveling direction of green light incident on a green pixel corresponding region of a color separating lens array corresponding to a green pixel and the periphery thereof.
Figure 10E:
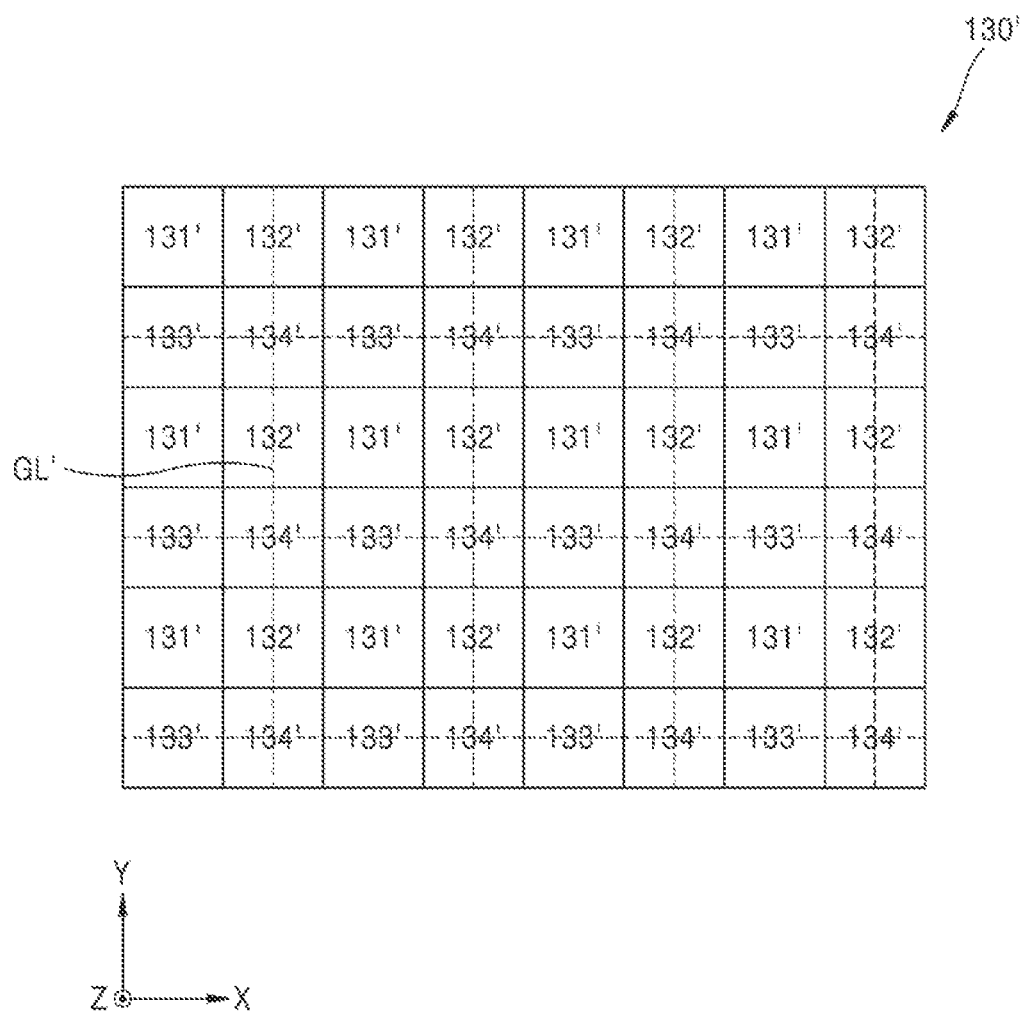
FIG. 10E shows a green light condensing region.

FIG. 10D shows a traveling direction of the green light incident on the green pixel corresponding region 131' of the color separating lens array 130' corresponding to the green pixel 111 and the periphery thereof, and FIG. 10E shows a green light condensing region GL'.

The green light incident on the green pixel corresponding region 131' is condensed on the green pixel 111 by the color separating lens array 130', as shown in FIG. 10D, and the green light from the pixel corresponding regions 131', 132', 133', and 134' is incident on the green pixel 111. In the phase profile PPG' of the green light described above with reference to FIGS. 10A and 10B, the green light incident on the green light condensing region GL' by connecting the centers of four infrared pixel corresponding regions 134' adjacent to the green pixel corresponding region 131' with vertexes facing each other is condensed on the green pixel 111. Accordingly, as shown in FIG. 10E, the color separating lens array 130' may operate as an array of the green light condensing region GL'. The area of each of the green light condensing regions GL' may be 1.5 to 4 times larger than the area of the green pixel 111.

Figure 10F:
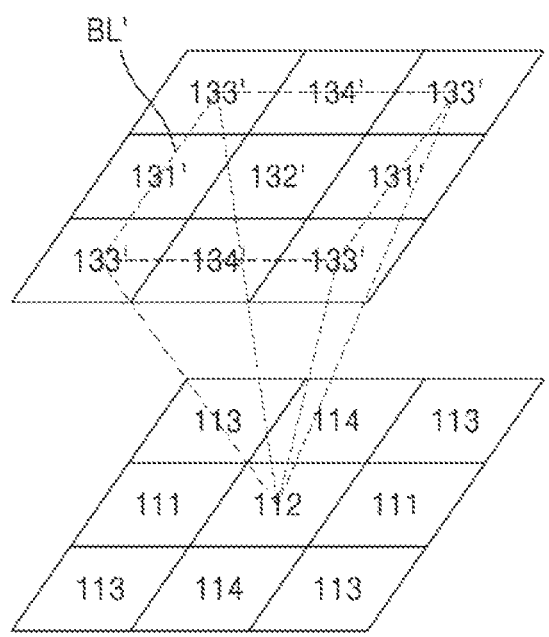
FIG. 10F shows a traveling direction of blue light incident on a blue pixel corresponding region of a color separating lens array corresponding to a blue pixel and the periphery thereof.
Figure 10G:
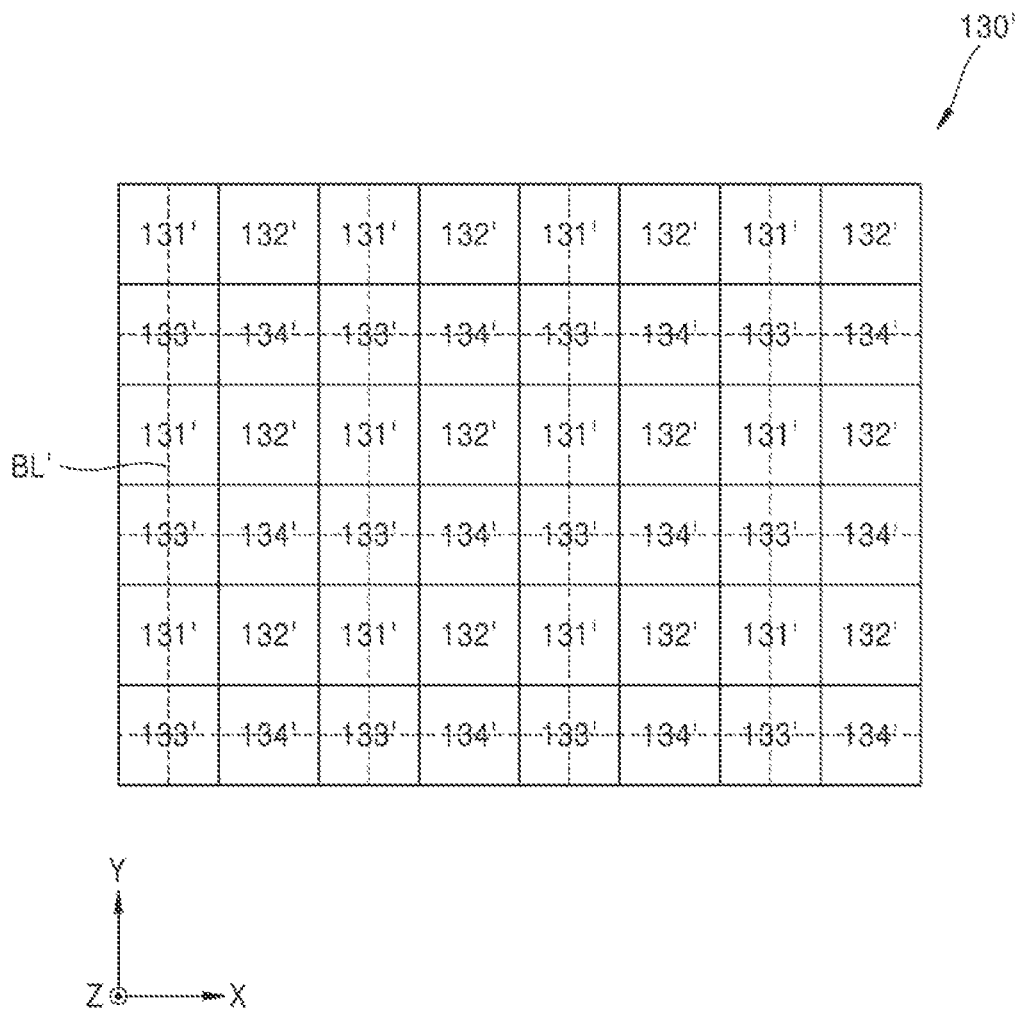
FIG. 10G shows a blue light condensing region.

FIG. 10F shows a traveling direction of the blue light incident on the blue pixel corresponding region 132' of the color separating lens array 130' corresponding to the blue pixel 112 and the periphery thereof, and FIG. 10G shows a blue light condensing region BL'.

The blue light is condensed on the blue pixel 112 by the color separating lens array 130', as shown in FIG. 10F, and the blue light from the pixel corresponding regions 131', 132', 133', and 134' is incident on the blue pixel 112. In the phase profile PPB' of the blue light described above with reference to FIGS. 10A and 10C, the blue light incident on the blue light condensing region BL' by connecting the centers of four red pixel corresponding regions 133' adjacent to the blue pixel corresponding region 132' with vertexes facing each other is condensed on the blue pixel 112. Accordingly, as shown in FIG. 10G, the color separating lens array 130' may operate as an array of the blue light condensing region BL'. The area of each of the blue light condensing regions BL' may be 1.5 to 4 times larger than the area of the blue pixel 112.

Figure 11A:
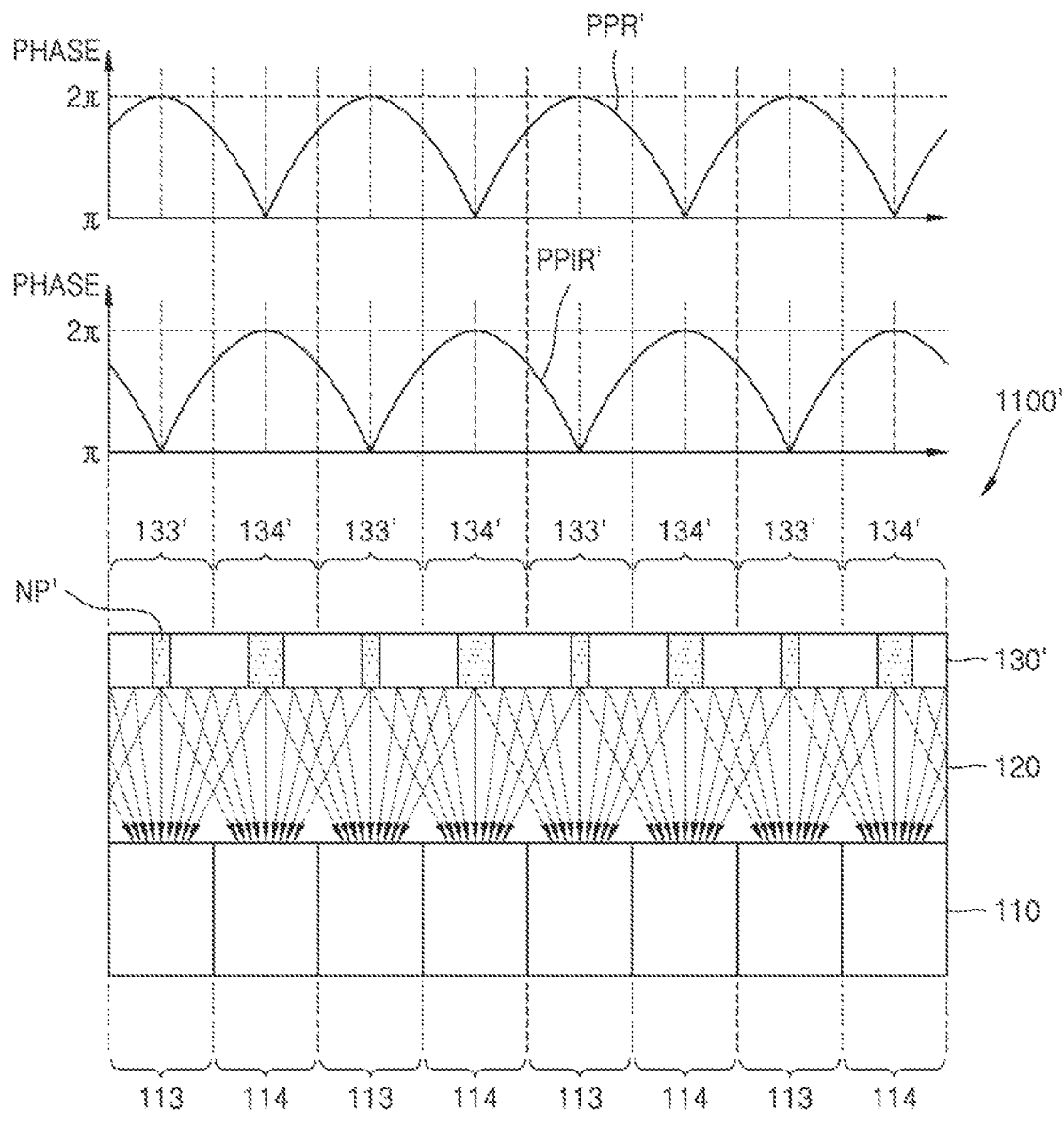
FIG. 11A shows phase profiles of red light and infrared ray passing through a color separating lens array along line IV-IV' of FIG. 9A.
Figure 11B:
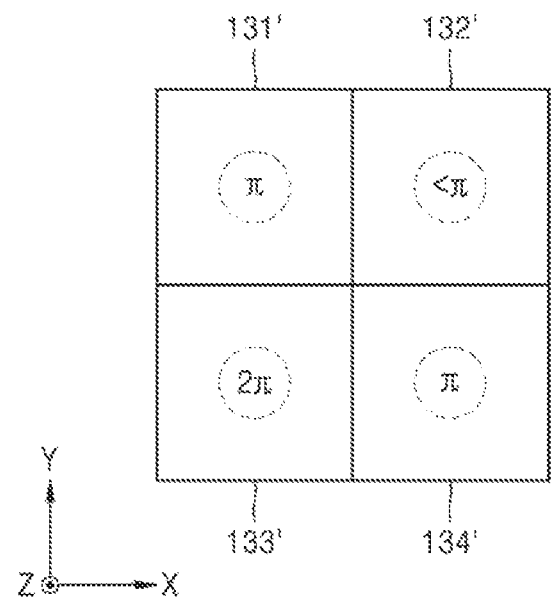
FIG. 11B shows a phase of the red light passing through the color separating lens array at the center of green, blue, red, and infrared pixel corresponding regions.
Figure 11C:
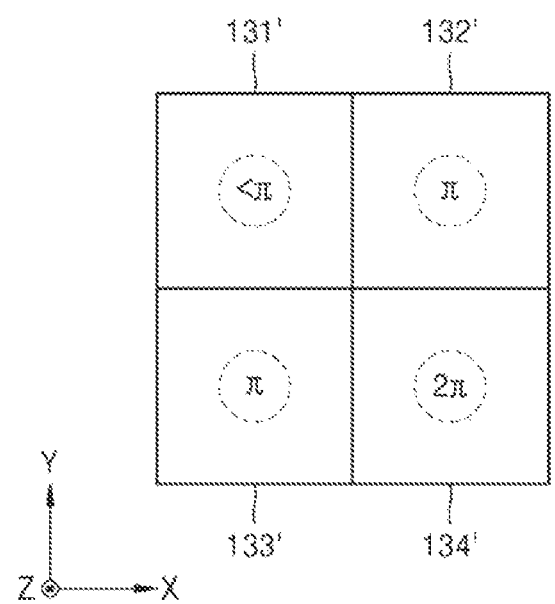
FIG. 11C shows a phase of the infrared ray passing through the color separating lens array at the center of the green, blue, red, and infrared pixel corresponding regions.

FIG. 11A shows phase profiles PPR' and PPIR' of red light and infrared ray passing through the color separating lens array 130' along line IV-IV' of FIG. 9A, FIG. 11B shows a phase of the red light passing through the color separating lens array 130' at the center of the pixel corresponding regions 131', 132', 133', and 134', and FIG. 11C shows a phase of the infrared ray passing through the color separating lens array 130' at the center of the pixel corresponding regions 131', 132', 133', and 134'.

Referring to FIGS. 11A and 11B, the red light passing through the color separating lens array 130' may have the phase profile PPR' that is the largest at the center of the red pixel corresponding region 133' and reduce in a direction away from the center of the red pixel corresponding region 133'. For example, at a location right after passing through the color separating lens array 130', at a lower surface location of the color separating lens array 130' or at an upper surface of the spacer layer 120, the phase of the red light may be the largest at the center of the red pixel corresponding region 133', may gradually reduce in the form of a concentric circle away from the center of the red pixel corresponding region 133', may be the smallest at the center of the green and infrared pixel corresponding regions 131' and 134' in the X and Y directions, and may be the smallest at the center of the blue pixel corresponding region 132' in the diagonal direction. When the phase of the red light at the center of the red pixel corresponding region 133' is $2\pi$, the phase of the red light may be $0.9\pi$ to $1.1\pi$ at the center of the green and infrared pixel corresponding regions 131' and 134', and may be a value less than $\pi$, about $0.2\pi$ to $0.9\pi$, at the center of the blue pixel corresponding region 132'.

Referring to FIGS. 11A and 11C, the infrared ray passing through the color separating lens array 130' may have the phase profile PPIR' that is the largest at the center of the infrared pixel corresponding region 134' and reduces in a direction away from the center of the infrared pixel corresponding region 134', and the phase profile PPIR' of the infrared ray is the same as described with reference to FIGS. 7A and 7B above.

Figure 11D:
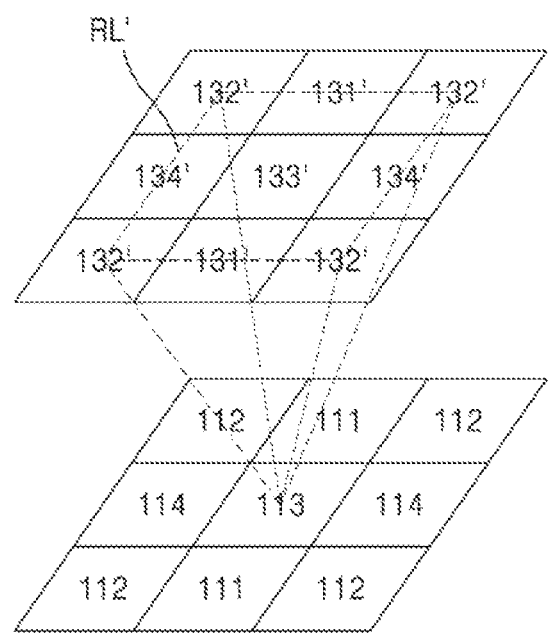
FIG. 11D shows a traveling direction of red light incident on a red pixel corresponding region of a color separating lens array corresponding to a red pixel and the periphery thereof.
Figure 11E:
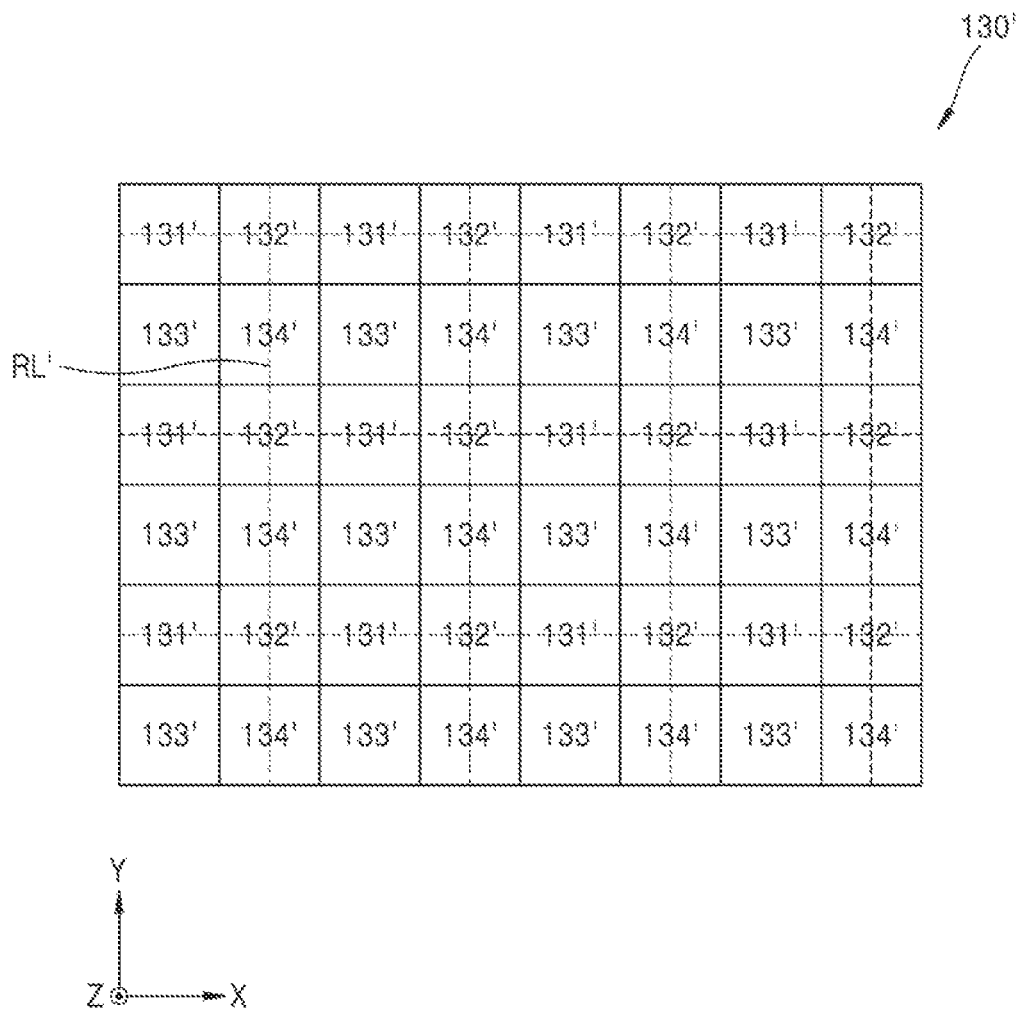
FIG. 11E shows a red light condensing region.

FIG. 11D shows a traveling direction of the red light incident on the red pixel corresponding region 133' of the color separating lens array 130' corresponding to the red pixel 113 and the periphery thereof, and FIG. 11E shows a red light condensing region RL'.

The red light incident on the red pixel corresponding region 133' is condensed on the red pixel 113 by the color separating lens array 130', as shown in FIG. 11D, and the red light from the pixel corresponding regions 131', 132', 133', and 134' is incident on the red pixel 113. In the phase profile PPR' of the red light described above with reference to FIGS. 11A and 11B, the red light incident on the red light condensing region RL' by connecting the centers of four blue pixel corresponding regions 132' adjacent to the red pixel corresponding region 133' with vertexes facing each other is condensed on the red pixel 113. Accordingly, as shown in FIG. 11E, the color separating lens array 130' may operate as an array of the red light condensing region RL'. The area of each of the red light condensing regions RL' may be 1.5 to 4 times larger than the area of the red pixel 113.

The phase profile PPIR' and condensing of the infrared ray by the color separating lens array 130' are similar to those given with reference to FIGS. 7A and 7B above, and thus, redundant descriptions thereof will be omitted.

Figure 12A:
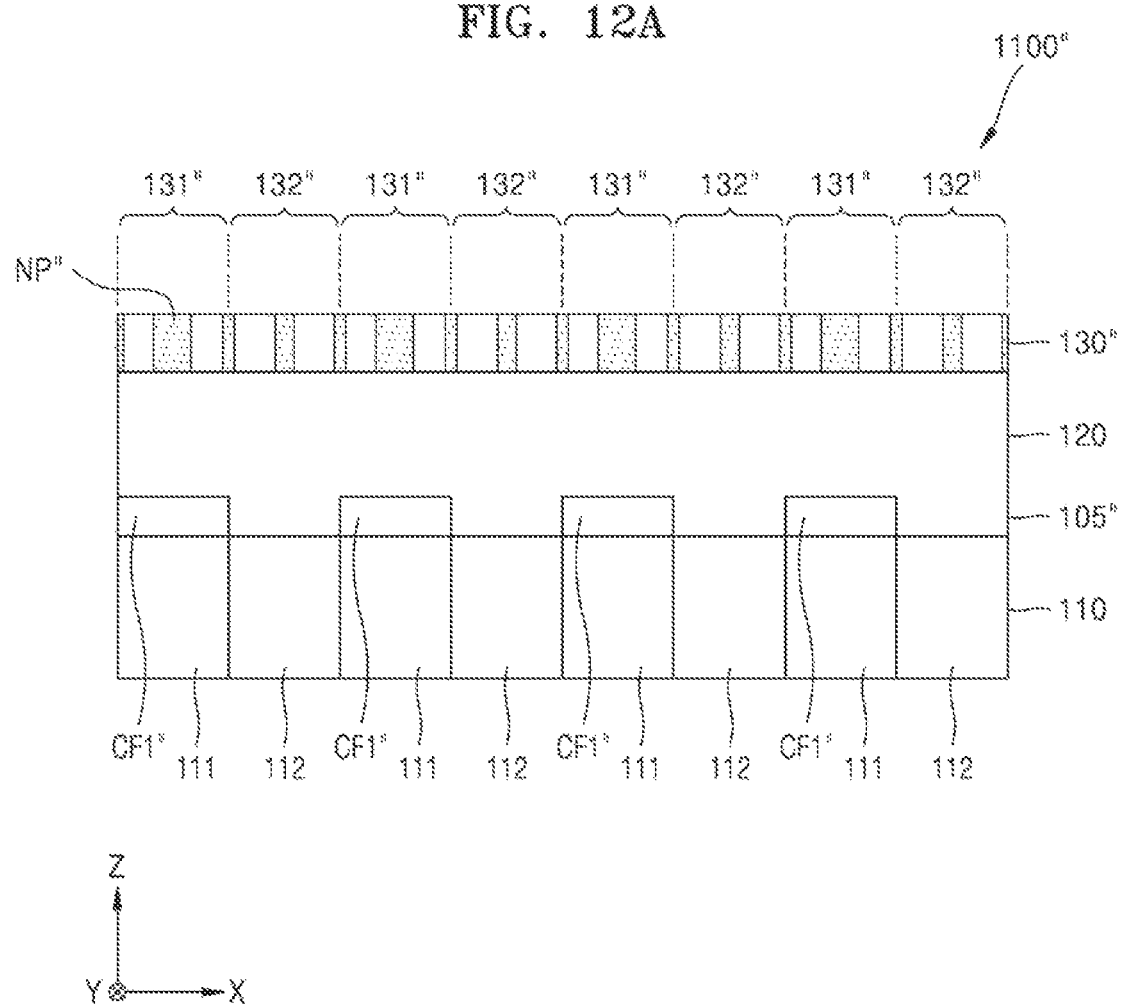
FIGS. 12A and 12B are cross-sectional views of a pixel array according to another example embodiment.
Figure 12B:
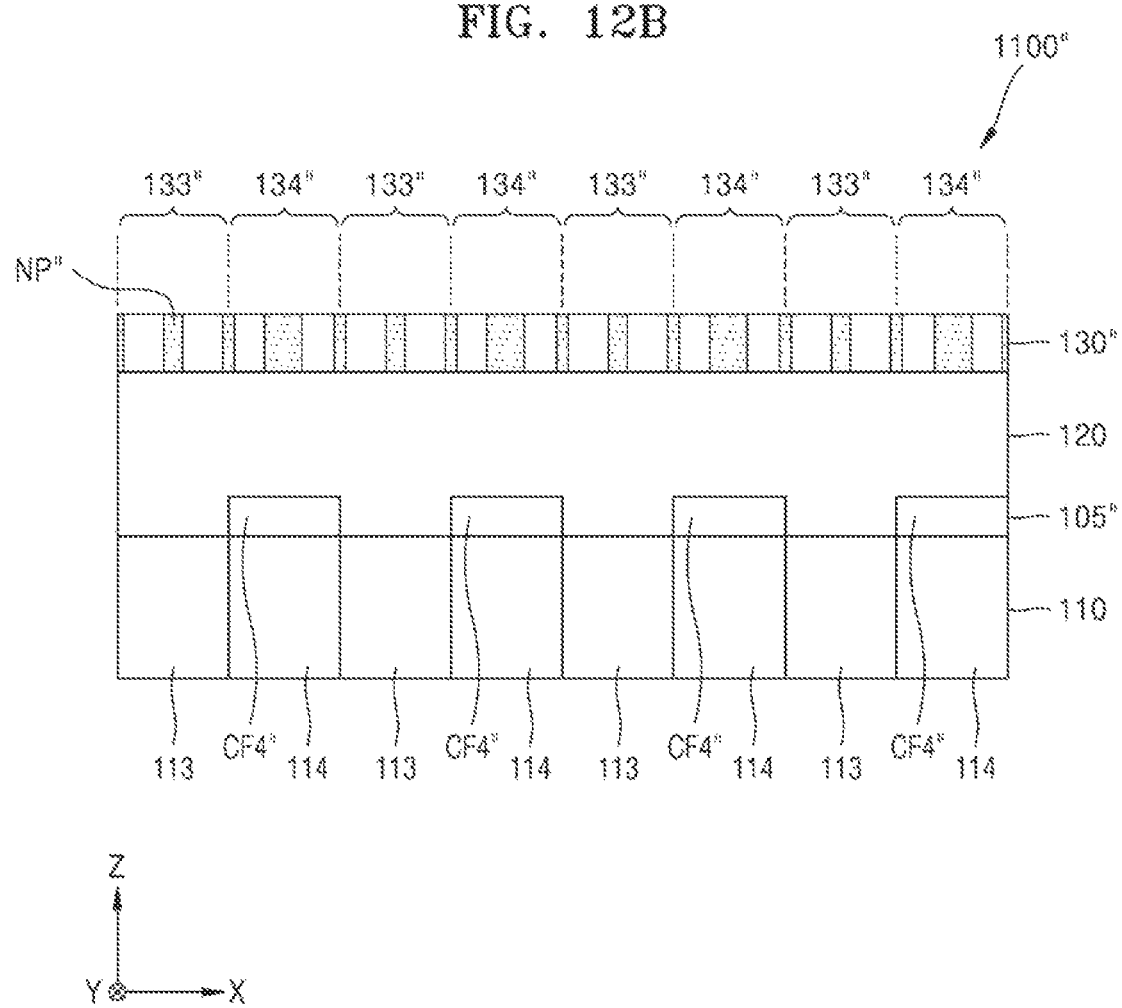
Figure 13A:
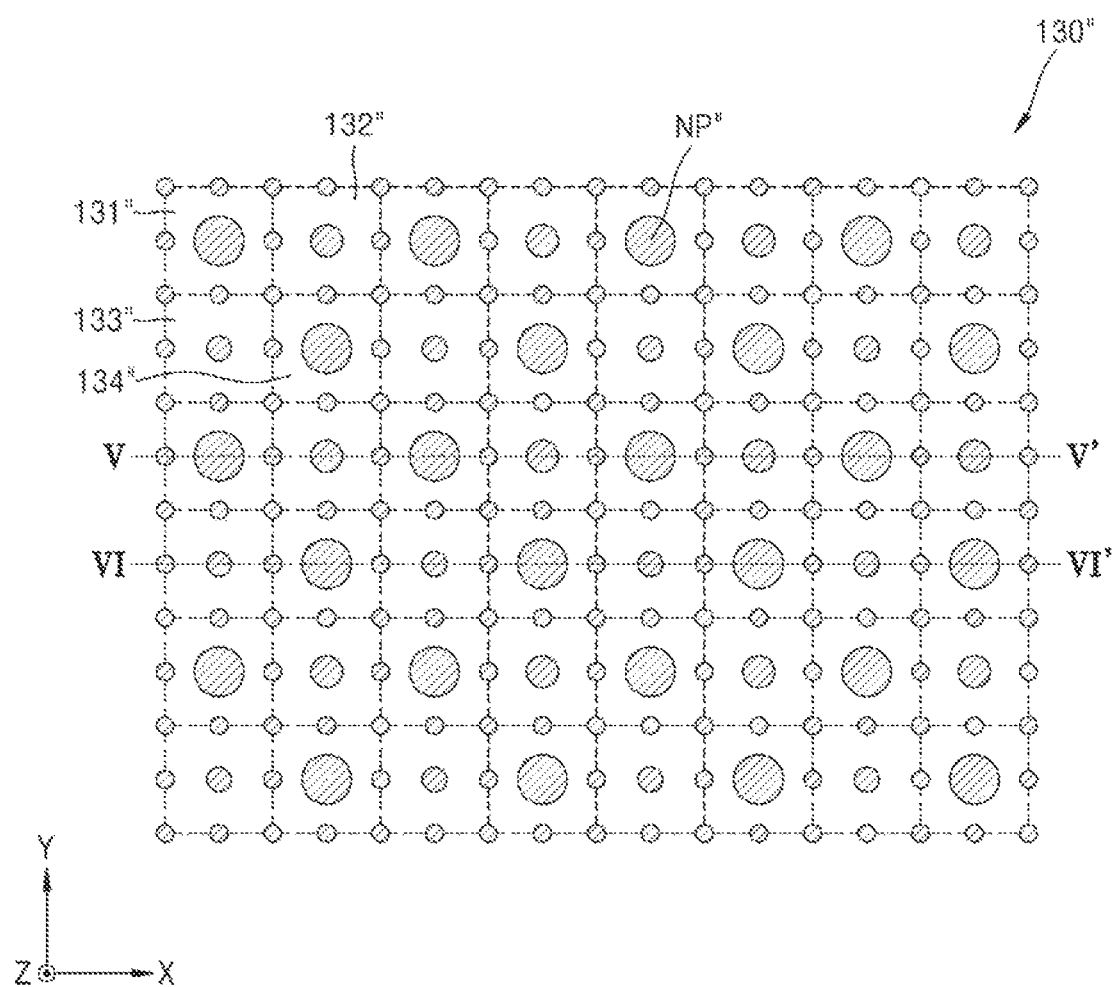
FIG. 13A is a plan view showing an example of an arrangement of nanoposts of a color separating lens array of FIGS. 12A and 12B.
Figure 13B:
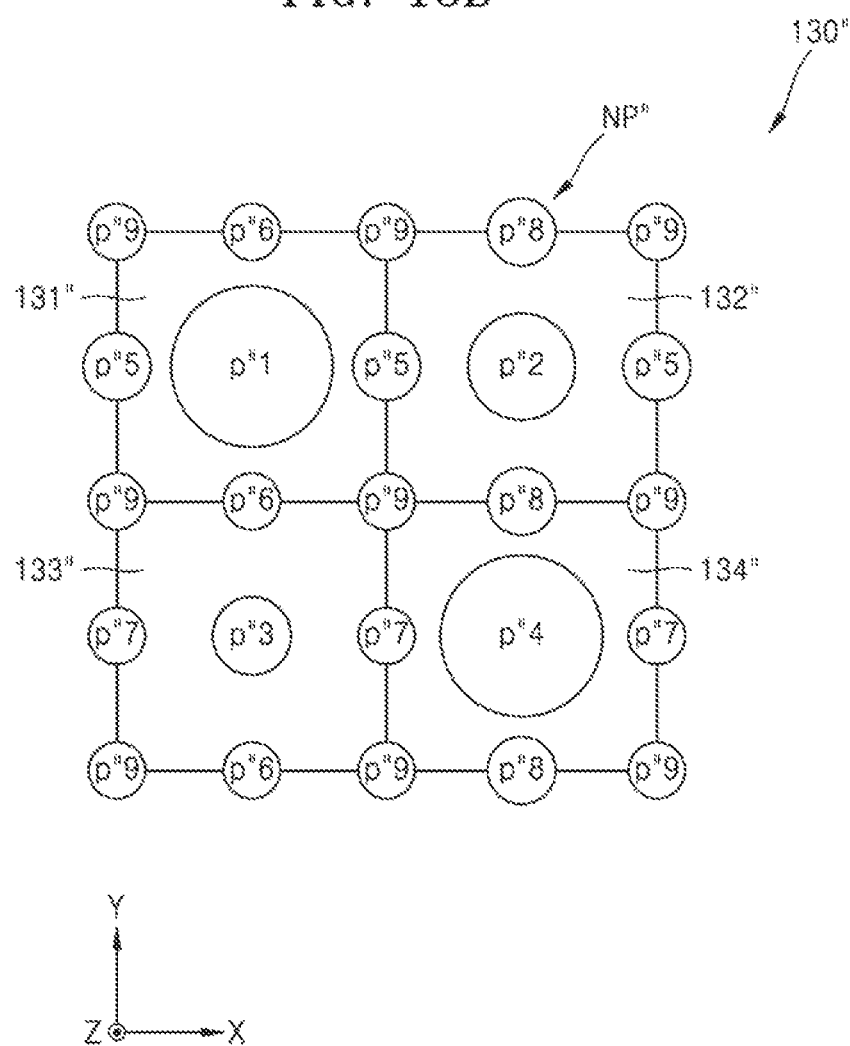
FIG. 13B is a detailed and enlarged plan view of a part of FIG. 13A.

FIGS. 12A and 12B are schematic cross-sectional views of a pixel array 1100" according to another example embodiment, FIG. 13A is a plan view showing an example of an arrangement of nanoposts NP'" of a color separating lens array 130" of FIGS. 12A and 12B, and FIG. 13B is a detailed and enlarged plan view of a part of FIG. 13A.

Referring to FIGS. 12A and 12B, the pixel array 1100" of the image sensor 1000 may include the sensor substrate 110 including the plurality of pixels 111, 112, 113, and 114 sensing light, the transparent spacer layer 120 disposed on the sensor substrate 110, and the color separating lens array 130" on the spacer layer 120. The pixel array 1100" of FIGS. 12A and 12B is different from the pixel array 1100' of FIGS. 8A and 8B in that the pixel array 1100" condenses combined light of green light and infrared ray on the green and infrared pixels 111 and 114 and the pixel array 1100' respectively condenses green light and infrared ray on different pixels. In the description of the example embodiment of FIGS. 12A and 12B, redundant descriptions with the description of the pixel array 1100 of FIGS. 4A and 4B and the pixel array 1100' of FIGS. 8A and 8B will be omitted.

The sensor substrate 110 may include the pixels 111, 112, 113, and 114 that convert light into electrical signals, and the pixels 111, 112, 113 and 114 may sense light of green light, blue light, red light, and infrared ray, respectively. The arrangement of the pixels of FIGS. 12A and 12B is the same as that described with reference to FIG. 5A.

A color filter layer 105" may be disposed between the sensor substrate 110 and the spacer layer 120. The color filter layer 105" may include a green color filter CF1" disposed on the green pixel 111 and an infrared filter CF4" disposed on the infrared pixel 114. A color filter may be omitted on the blue and red pixels 112 and 113. For example, because the color separating lens array 130" condenses the green light and the infrared ray on the green and infrared pixels 111 and 114 at the same time, in order to sense only the green light from the green pixel 111, the green color filter CF1" that blocks the infrared ray may be disposed on the green pixel 111, and the infrared filter CF4" that blocks the green light may be disposed on the infrared pixel 114. The green color filter CF1" may be a filter which transmits only the green light or a filter which blocks only the infrared ray. The infrared filter CF4" may be a visible light blocking filter or a green light blocking filter. Because blue light is condensed on the blue pixel 112 and red light is condensed on the red pixel 113 by the color separating lens array 130", a color filter may not be disposed on the blue and red pixels 112 and 113.

The color separating lens array 130" may include the nanoposts NP'" arranged to change phases of the green light, blue light, red light, and infrared ray and condense combined light of the green light and the infrared ray on the green pixel 111 and the infrared pixel 114, the blue light on the blue pixel 112, and the red light on the red pixel 113.

Referring to FIG. 13A, the pixel corresponding regions 131", 132", 133", and 134" of FIGS. 12A and 12B may include the nanoposts NP'" each having a cylindrical shape of a circular cross-section. The nanoposts NP'" having different cross-sectional areas from one another may be arranged on the center of each of the first to fourth regions 131", 132", 133", and 134". The nanoposts NP'" may be also arranged on the center of a boundary between pixels and a crossing point of the pixel boundaries. The cross-sectional area of the nanoposts NP'" arranged at the boundary between pixels may be less than those of the nanoposts NP'" arranged at the center of the pixel.

FIG. 13B is a detailed view of the arrangement of the nanoposts NP'" in partial regions of FIG. 13A, that is, the pixel corresponding regions 131", 132", 133", and 134" constituting the unit pattern. In FIG. 13B, the nanoposts NP'" are indicated as p"1 to p"9 according to detailed locations thereof. Referring to FIG. 13B, from among the nanoposts NP'", a nanopost p"1 on the center of the green pixel corresponding region 131" and a nanopost p"4 on the center of the infrared pixel corresponding region 134" have larger cross-sectional areas than those of a nanopost p"2 on the center of the blue pixel corresponding region 132" or a nanopost p"3 on the center of the red pixel corresponding region 133", and the nanopost p"2 on the center of the blue pixel corresponding region 132" has a larger cross-sectional area than that of the nanopost p"3 on the center of the red pixel corresponding region 133".

The nanoposts NP'" included in the green and infrared pixel corresponding regions 131" and 134" may have different distribution rules in the first direction (X direction) and the second direction (Y direction). For example, the nanoposts NP'" included in the green and infrared pixel corresponding regions 131" and 134" may have different size arrangement in the first direction (X direction) and the second direction (Y direction). As shown in FIG. 13B, from among the nanoposts NP'", a cross-sectional area of a nanopost p"5 located at a boundary between the green pixel corresponding region 131" and the blue pixel corresponding region 132" that is adjacent to the green pixel corresponding region 131" in the first direction (X direction) is different from that of a nanopost p"6 located at a boundary between the green pixel corresponding region 131" and the red pixel corresponding region 133" that is adjacent to the green pixel corresponding region 131" in the second direction (Y direction). Similarly, a cross-sectional area of a nanopost p"7 at the boundary between the infrared pixel corresponding region 134" and the red pixel corresponding region 133" that is adjacent to the infrared pixel corresponding region 134" in the first direction (X direction) is different from that of a nanopost p"8 located at the boundary between the infrared pixel corresponding region 134" and the blue pixel corresponding region 132" that is adjacent to the infrared pixel corresponding region 134" in the second direction (Y direction).

The nanoposts NP" arranged in the blue and red pixel corresponding regions 132" and 133" may have symmetrical distribution rules in the first and second directions (X direction and Y direction). As shown in FIG. 13B, from among the nanoposts NP", the cross-sectional area of the nanoposts p"5 at a boundary between adjacent pixels that are adjacent to the blue pixel corresponding region 132" in the first direction (X direction) and the cross-sectional areas of the nanoposts p"8 at a boundary between pixels adjacent to the blue pixel corresponding region 132" in the second direction (Y direction) are the same as each other, and in the red pixel corresponding region 133", the cross-sectional areas of the nanoposts p"7 at a boundary between adjacent pixels in the first direction (X direction) and the cross-sectional areas of the nanoposts p"6 at a boundary between the adjacent pixels in the second direction (Y direction) are the same as each other.

In addition, the nanoposts p"9 at four corners in each of the pixel corresponding regions 131", 132", 133", and 134", that is, points where the four regions cross one another, have the same cross-sectional areas from one another.

In the blue and red pixel corresponding regions 132" and 133", the nanoposts NP" may be arranged in the form of 4-fold symmetry, and in the green and infrared pixel corresponding regions 131" and 134", the nanoposts NP" may be arranged in the form of 2-fold symmetry. In particular, the green and infrared pixel corresponding regions 131" and 134" are rotated by 90° angle with respect to each other.

The nanoposts NP" have symmetrical circular cross-sectional shapes but are not limited thereto. Some nanoposts having asymmetrical cross-sectional shapes may be included. For example, the green and infrared pixel corresponding regions 131" and 134" may employ the nanoposts having an asymmetrical cross-sectional shape that has different widths in the first direction (X direction) and the second direction (Y direction), and the blue and red pixel corresponding regions 132" and 133" may employ the nanoposts having a symmetrical cross-sectional shape having the identical widths in the first direction (X direction) and the second direction (Y direction).

Figure 14A:
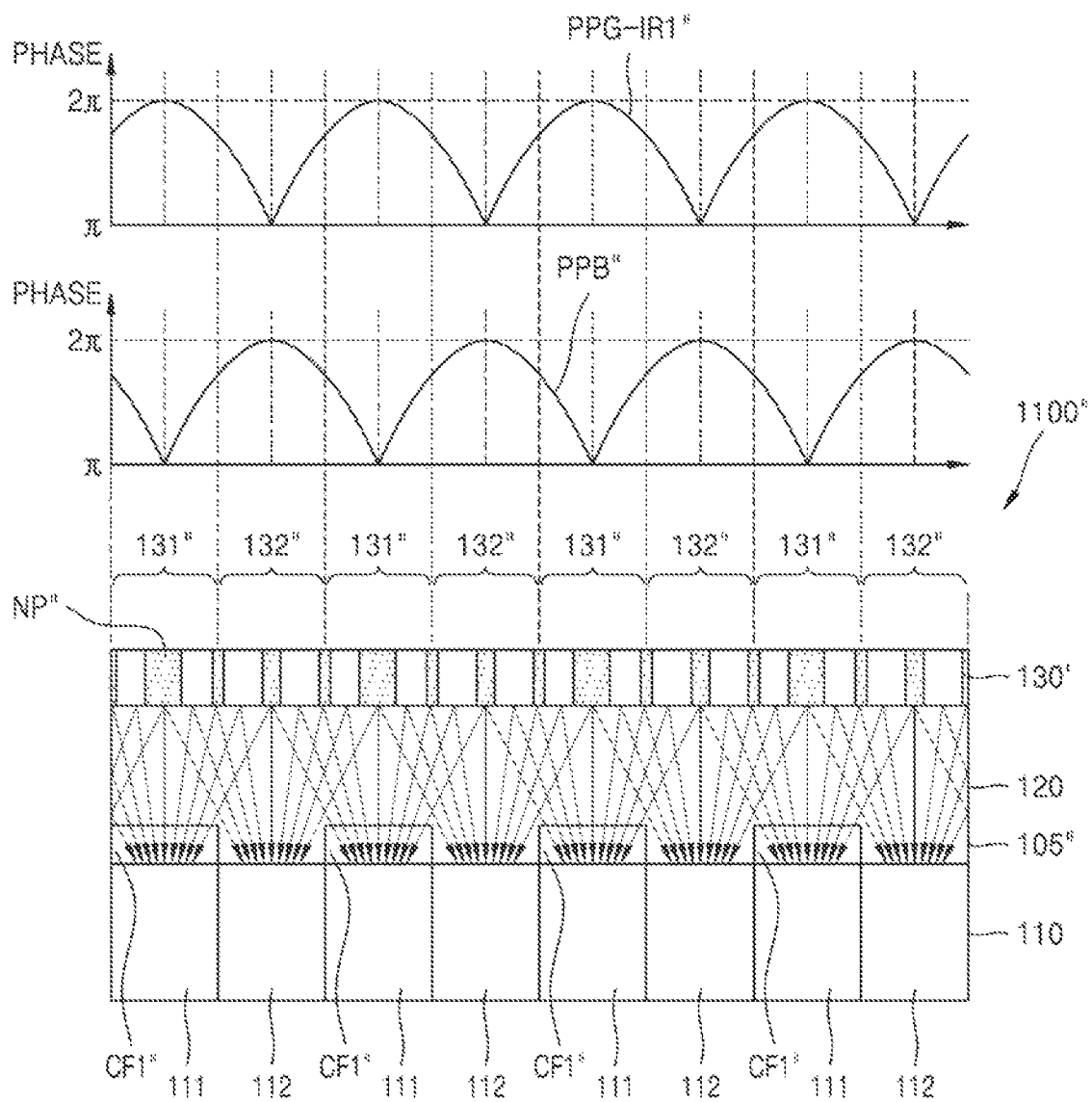
FIG. 14A shows phase profiles of combined light of green light and infrared light, and blue light passing through a color separating lens array along line V-V' of FIG. 13A.
Figure 14B:
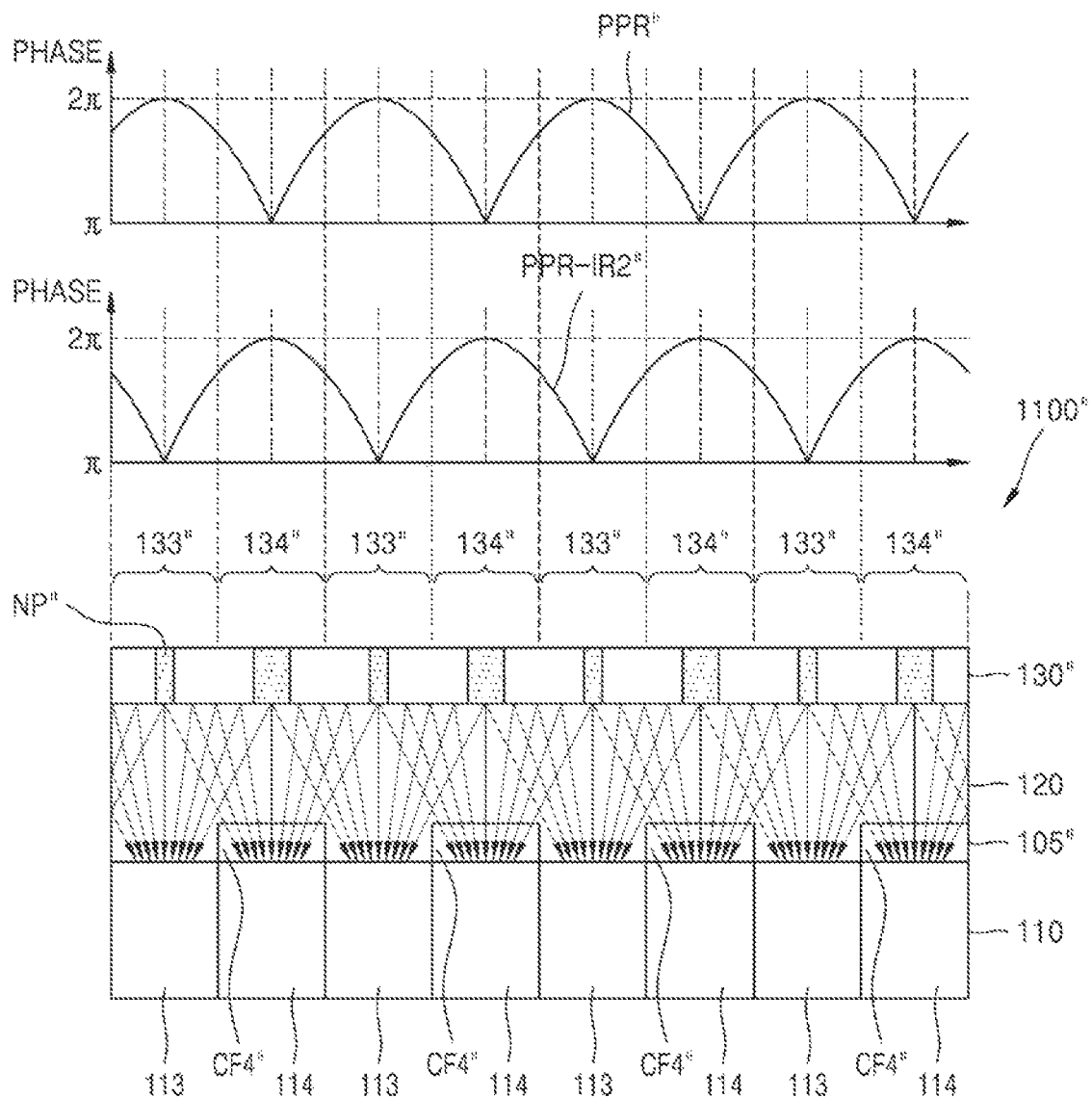
FIG. 14B shows phase profiles of red light and combined light of the green light and infrared ray passing through the color separating lens array along line VI-VI' of FIG. 13A.
Figure 14C:
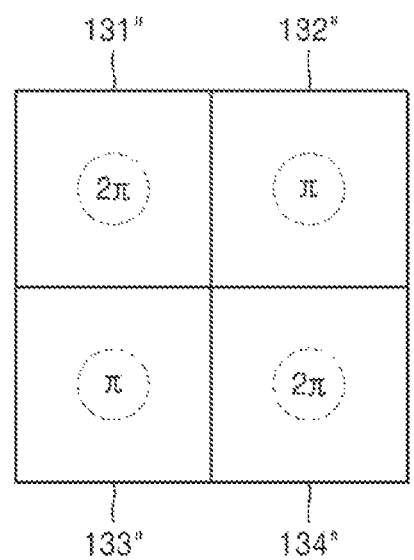
FIG. 14C shows a phase of the combined light of green light and infrared light passing through the color separating lens array at the center of pixel corresponding regions.

FIG. 14A shows phase profiles PPG-IR1" and PPB" of combined light of green light and infrared light, and blue light passing through the color separating lens array 130" along line V-V' of FIG. 13A, FIG. 14B shows phase profiles PPR" and PPR-IR2" of red light and combined light of the green light and infrared ray passing through the color separating lens array 130" along line VI-VI' of FIG. 13A, and FIG. 14C shows a phase of the combined light of green light and infrared light passing through the color separating lens array 130" at the center of the pixel corresponding regions 131", 132", 133", and 134".

Referring to FIGS. 14A to 14C, the green light and the infrared ray passing through the color separating lens array 130" may have a phase profile PPG-IR1" that is the largest at the center of the green pixel corresponding region 131" and the center of the infrared pixel corresponding region 134" and reduces in a direction away from the center of the green pixel corresponding region 131" and the center of the infrared pixel corresponding region 134". For example, at a location right after passing through the color separating lens array 130", at a lower surface location of the color separating lens array 130" or at an upper surface of the spacer layer 120, the phase of the green light and the infrared ray may be the largest at the center of the green and infrared pixel corresponding regions 131" and 134", may gradually reduce in the form of a concentric circle away from the center of the green and infrared pixel corresponding regions 131" and 134", may be the smallest at the center of the blue and red pixel corresponding regions 132" and 133" in the X and Y directions, and may be the smallest at a contact point of the green and infrared pixel corresponding regions 131" and 134" in the diagonal direction. When the phases of the green light and the infrared ray at the center of the green and infrared pixel corresponding regions 131" and 134" are $2\pi$, the phases of the green light and the infrared ray may be $0.9\pi$ to $1.1\pi$ at the center of the blue and red pixel corresponding regions 132" and 133", and may be about $1.1\pi$ to $1.5\pi$, at the contact point of the green and infrared pixel corresponding regions 131" and 134".

Figure 14D:
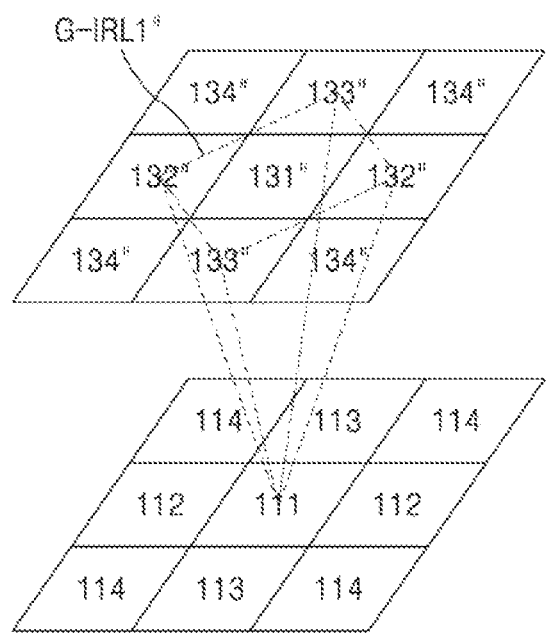
FIGS. 14D and 14E show traveling directions of green light and infrared ray incident on green and infrared pixel corresponding regions of a color separating lens array and the peripheries thereof.
Figure 14E:
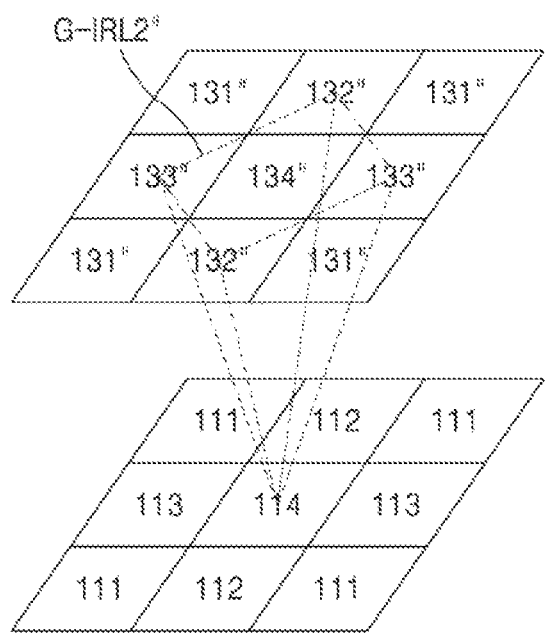
Figure 14F:
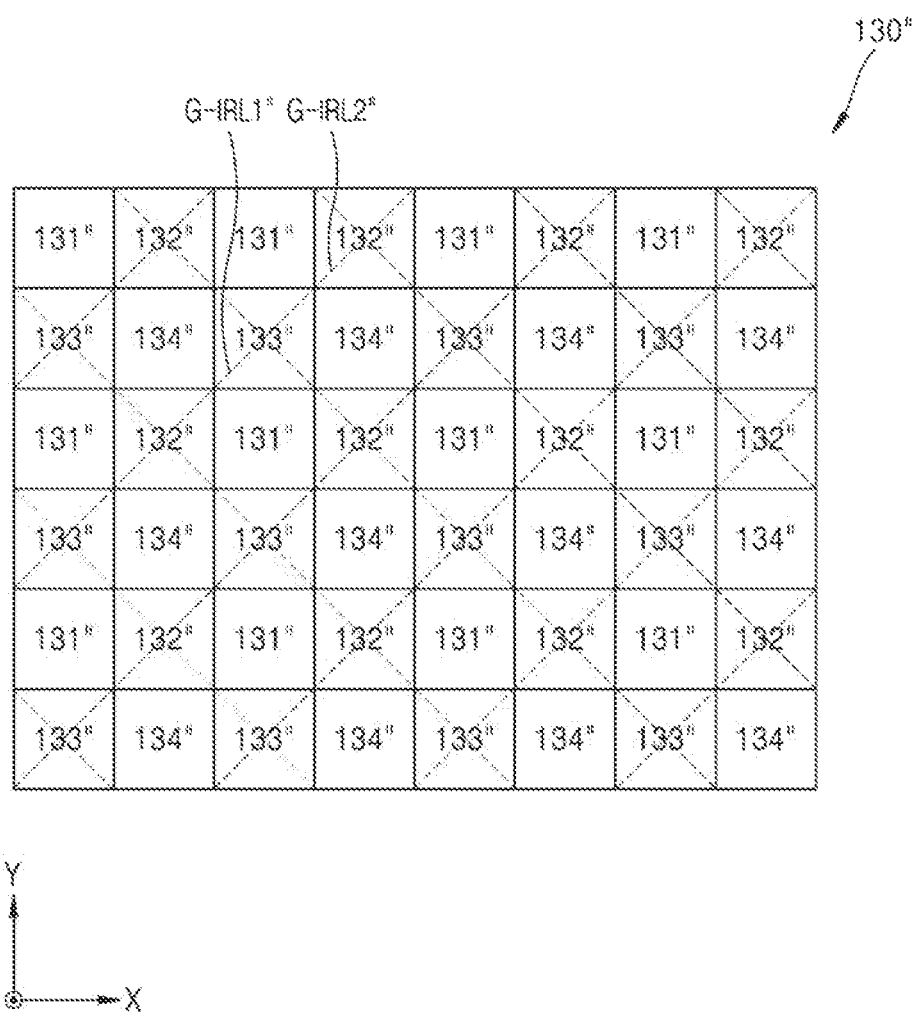
FIG. 14F shows green light and infrared ray condensing regions.

FIGS. 14D and 14E show traveling directions of the green light and the infrared ray incident on the green and infrared pixel corresponding regions 131" and 134" of the color separating lens array 130" and the peripheries thereof, and FIG. 14F shows green light and infrared ray condensing regions G-IRL1" and G-IRL2".

The green light and the infrared ray incident on the peripheries of the green and infrared pixel corresponding regions 131" and 134" may be condensed on the green and infrared pixels 111 and 114 by the color separating lens array 130" as shown in FIGS. 14D and 14E, and the green light and the infrared ray from the green, blue, and red pixel corresponding regions 131", 132", and 133" may be incident on the green pixel 111 and the infrared pixel 114. In the phase profiles PPG-IR1" of the green light and the infrared ray described above with reference to FIGS. 14A to 14C, the green light and the infrared ray incident on a first green light and infrared condensing region G-IRL1" of FIG. 14D and a second green light and infrared condensing region G-IRL2" of FIG. 14E by connecting the centers of two blue pixel corresponding regions 132" and two red pixel corresponding regions 133" adjacent to the green pixel corresponding region 131" or the infrared pixel corresponding region 134" with one side facing each other are condensed on the green and infrared pixels 111 and 114. Areas of the first and second green light and infrared condensing region G-IRL1" and G-IRL2" may be 1.2 to 2 times larger than those of the corresponding green and infrared pixels 111 and 114.

The phase profile and condensing of the blue light and the red light passing through the color separating lens array 130" referring to FIGS. 14A and 14B are similar to those of the pixel array 1100' described with reference to FIGS. 8A and 8B above, and thus, redundant descriptions thereof will be omitted. As described above, areas of a blue light condensing region and a red light condensing region may be 1.5 times to 4 times larger than areas of the corresponding blue pixel 112 and red pixel 113. Therefore, the areas of the blue light condensing region and the red light condensing region may be larger than the areas of the first and second green light and infrared condensing region G-IRL1" and G-IRL2".

The color separating lens arrays 130, 130', and 130" satisfying the phase profiles and performance described above may be automatically designed through various types of computer simulations. For example, the structures of the green, blue, red, and infrared pixel corresponding regions may be optimized through a nature-inspired algorithm such as a genetic algorithm, a particle swarm optimization algorithm, an ant colony optimization algorithm, etc., or a reverse design based on an adjoint optimization algorithm.

The structures of the green, blue, red, and infrared pixel corresponding regions may be optimized while evaluating performances of a plurality of candidate color separating lens arrays based on evaluation factors such as color separation spectrum, optical efficiency, signal-to-noise ratio, etc. when designing a color separating lens array. For example, the structures of the green, blue, red, and infrared pixel corresponding regions may be optimized in a manner that a target numerical value of each evaluation factor is determined in advance and the sum of the differences from the target numerical values of a plurality of evaluation factors is minimized. Alternatively, the performance may be indexed for each evaluation factor, and the structures of the green, blue, red, and infrared pixel corresponding regions may be optimized so that a value representing the performance may be maximized.

The color separating lens arrays 130, 130', and 130" shown in FIGS. 5B, 9A, and 13A are examples. In addition, the color separating lens arrays 130, 130', and 130" of various types may be obtained through the above optimization design, according to the sizes and thicknesses of the color separating lens arrays 130, 130', and 130", color characteristics and pitches between pixels in the image sensor, to which the color separating lens arrays 130, 130', and 130" are to be applied, distances between the color separating lens arrays 130, 130', and 130" and the image sensor, an incidence angle of the incident light, etc. For example, FIG. 15A is a plan view showing a shape of a unit pattern in a color separating lens array 130a according to another embodiment, which may be applied to an image sensor of Bayer pattern type, and FIG. 15B is a plan view showing a shape of a unit pattern in a color separating lens array 130b according to another embodiment.

Figure 15A:
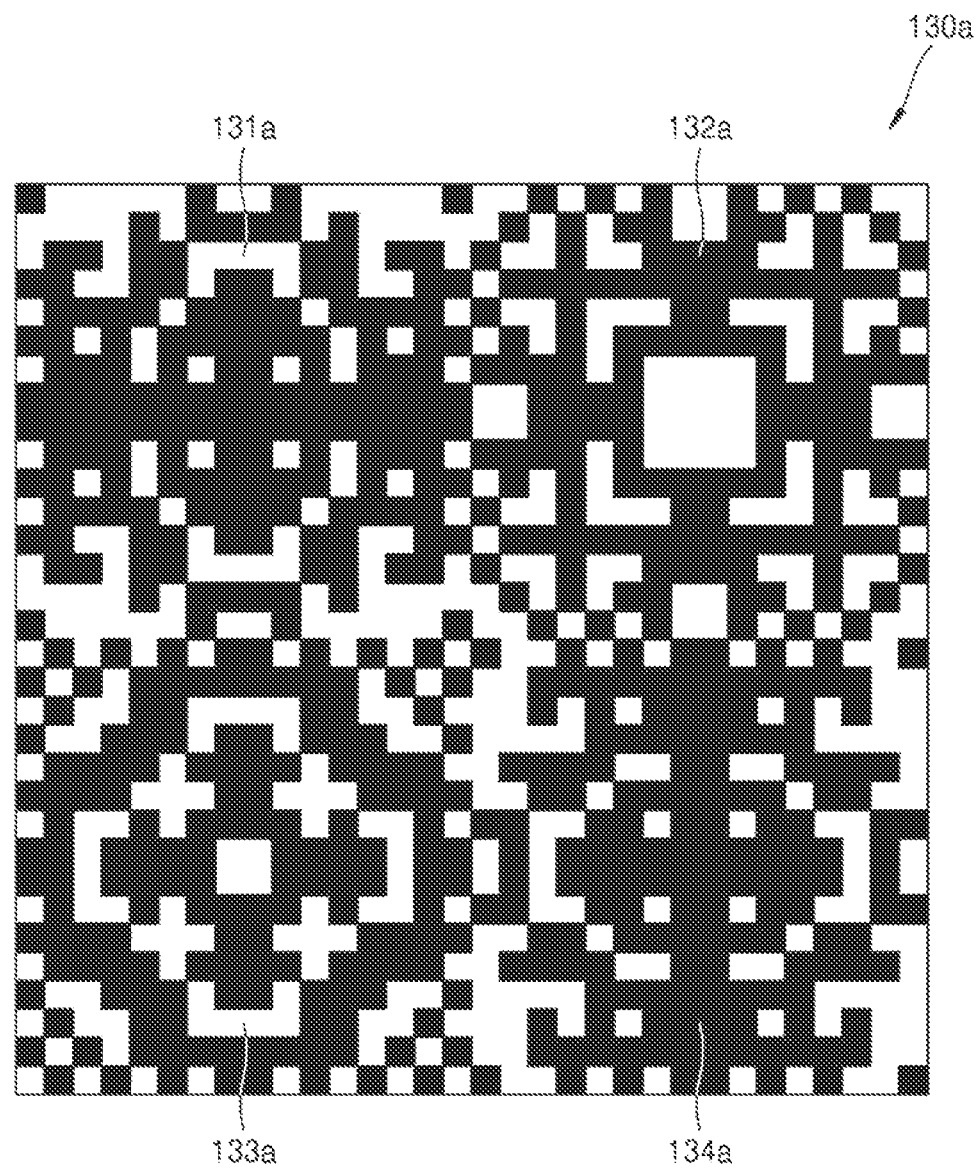
FIGS. 15A and 15B are plan views of color separating lens arrays according to another embodiment.
Figure 15B:
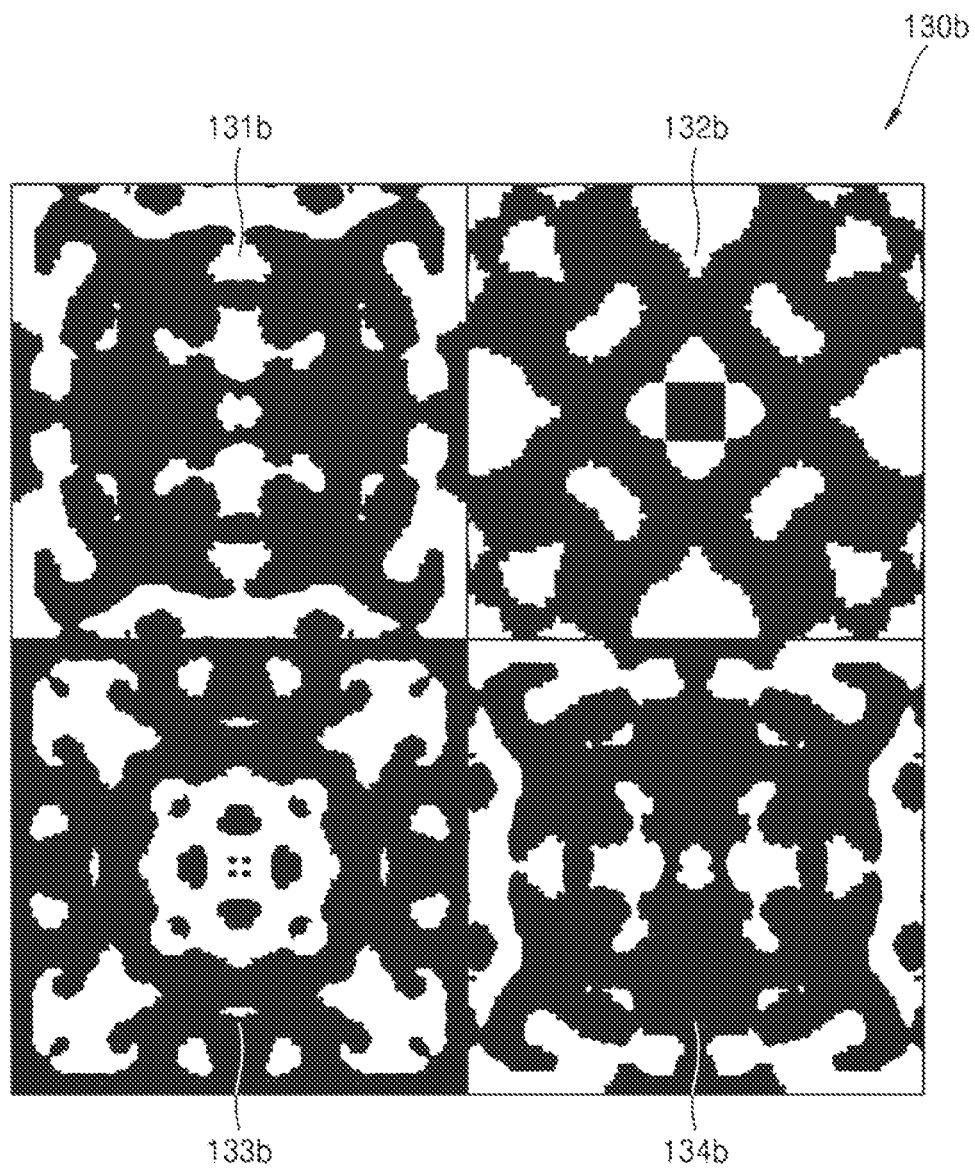

Each of pixel corresponding regions 131a, 132a, 133a, and 134a shown in FIG. 15A is optimized in a digitized binary form in a 16×16 rectangular arrangement, and the unit pattern shown in FIG. 15A has a shape of 32×32 rectangular arrangement. Each of pixel corresponding regions 131b, 132b, 133b, 134b shown in FIG. 15B may be optimized in the form of a continuous curve that is not digitized.

In the image sensor 1000 including the pixel arrays 1100, 1100', and 1100" described above, because light loss caused by a color filter, for example, an organic color filter rarely occurs, a sufficient light intensity may be provided to pixels even when sizes of the pixels are reduced. Therefore, an ultra-high resolution, ultra-small, and highly sensitive image sensor having hundreds of millions of pixels or more may be manufactured. Such an ultra-high resolution, ultra-small, and highly sensitive image sensor may be employed in various high-performance optical devices or high-performance electronic devices. For example, the electronic devices may include, for example, smart phones, personal digital assistants (PDAs), laptop computers, personal computers (PCs), a variety of portable devices, electronic devices, surveillance cameras, medical camera, automobiles, Internet of Things (IoT), other mobile or non-mobile computing devices and are not limited thereto.

In addition to the image sensor 1000, the electronic device may further include a processor controlling the image sensor, for example, an application processor (AP), to drive an operating system or an application program through the processor and control a plurality of hardware or software components, and perform various data processing and operations. The processor may further include a graphic processing unit (GPU) and/or an image signal processor. When the processor includes the image signal processor, an image (or video) obtained by the image sensor may be stored and/or output using the processor.

Figure 16:
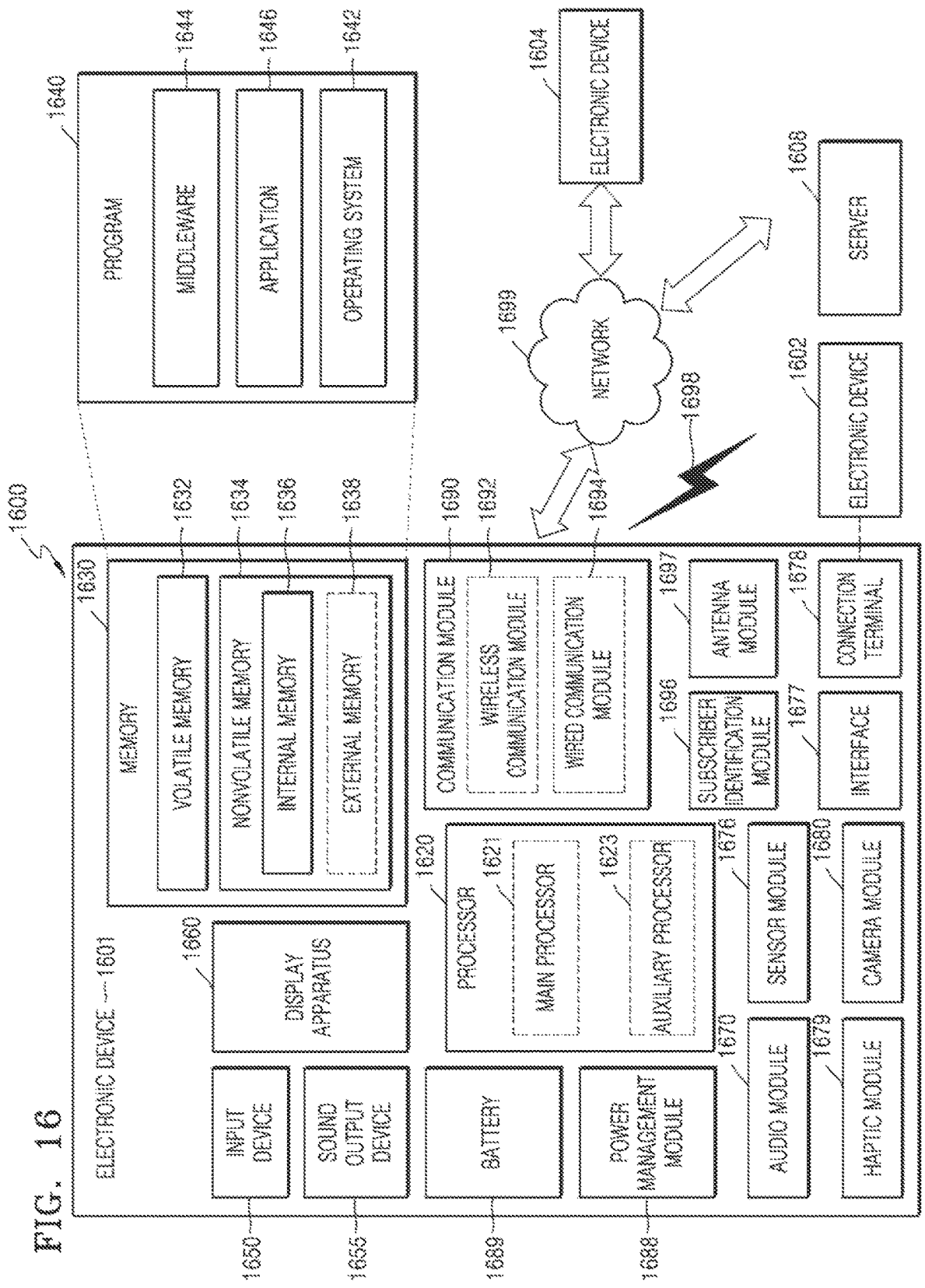
FIG. 16 is a block diagram of an example showing an electronic device including the image sensor according to an embodiment.

FIG. 16 is a block diagram of an example showing an electronic device 1601 including the image sensor 1000 according to an embodiment. Referring to FIG. 16, in a network environment 1600, the electronic device 1601 may communicate with another electronic device 1602 through a first network 1698 (a short-range wireless communication network, etc.) or communicate with another electronic device 1604 and/or a server 1608 through a second network 1699 (a remote wireless communication network, etc.) The electronic device 1601 may communicate with the electronic device 1604 through the server 1608. The electronic device 1601 may include a processor 1620, a memory 1630, an input device 1650, a sound output device 1655, a display apparatus 1660, an audio module 1670, a sensor module 1676, an interface 1677, a haptic module 1679, a camera module 1680, a power management module 1688, a battery 1689, a communication module 1690, a subscriber identification module 1696, and/or an antenna module 1697. The electronic device 1601 may omit some (the display apparatus 1660, etc.) of the components or may further include other components. One or more of the components may be implemented as an integrated circuit. For example, the sensor module 1676 (a fingerprint sensor, an iris sensor, an illumination sensor, etc.) may be embedded in the display apparatus 1660 (a display, etc.).

The processor 1620 may be configured to execute software (a program 1640, etc.) to control one or a plurality of components (hardware or software components) of the electronic device 1601, the components being connected to the processor 1620, and to perform various data processing or calculations. As part of the data processing or calculations, the processor 1620 may be configured to load a command and/or data received from other components (the sensor module 1676, the communication module 1690, etc.) into the volatile memory 1632, process the command and/or the data stored in a volatile memory 1632, and store resultant data in a nonvolatile memory 1634. The processor 1620 may include a main processor 1621 (a central processing unit (CPU), an application processor (AP), etc.) and an auxiliary processor 1623 (a graphics processing unit (GPU), an image signal processor, a sensor hub processor, a communication processor, etc.) which may independently operate or operate with the main processor 1621. The auxiliary processor 1623 may use less power than the main processor 1621 and may perform specialized functions.

When the main processor 1621 is in an inactive state (a sleep state), the auxiliary processor 1623 may take charge of an operation of controlling functions and/or states related to one or more components (the display apparatus 1660, the sensor module 1676, the communication module 1690, etc.) from among the components of the electronic device 1601, or when the main processor 1621 is in an active state (an application execution state), the auxiliary processor 1623 may perform the same operation along with the main processor 1621. The auxiliary processor 1623 (the image signal processor, the communication processor, etc.) may be realized as part of other functionally-related components (the camera module 1680, the communication module 1690, etc.).

The memory 1630 may store various data required by the components (the processor 1620, the sensor module 1676, etc.) of the electronic device 1601. The data may include, for example, software (the program 1640, etc.), input data and/or output data of a command related to the software. The memory 1630 may include the volatile memory 1632 and/or the nonvolatile memory 1634. The nonvolatile memory 1634 may include an internal memory 1636 fixedly mounted in the electronic device 1601 and a removable external memory 1638.

The program 1640 may be stored in the memory 1630 as software, and may include an operating system 1642, middleware 1644, and/or an application 1646.

The input device 1650 may receive a command and/or data to be used by the components (the processor 1620, etc.) of the electronic device 1601 from the outside of the electronic device 1601. The input device 1650 may include a microphone, a mouse, a keyboard, and/or a digital pen (a stylus pen, etc.).

The sound output device 1655 may output a sound signal to the outside of the electronic device 1601. The sound output device 1655 may include a speaker and/or a receiver. The speaker may be used for a general purpose, such as multimedia playing or recording playing, and the receiver may be used to receive an incoming call. The receiver may be coupled to the speaker as part of the speaker or may be realized as a separate device.

The display apparatus 1660 may visually provide information to the outside of the electronic device 1601. The display apparatus 1660 may include a display, a hologram device, or a controlling circuit for controlling a projector and a corresponding device. The display apparatus 1660 may include touch circuitry configured to sense a touch operation and/or sensor circuitry (a pressure sensor, etc.) configured to measure an intensity of a force generated by the touch operation.

The audio module 1670 may convert sound into an electrical signal or an electrical signal into sound. The audio module 1670 may obtain sound via the input device 1650 or may output sound via the sound output device 1655 and/or a speaker and/or a headphone of an electronic device (the electronic device 1602, etc.) directly or wirelessly connected to the electronic device 1601.

The sensor module 1676 may sense an operation state (power, temperature, etc.) of the electronic device 1601 or an external environmental state (a user state, etc.) and generate electrical signals and/or data values corresponding to the sensed state. The sensor module 1676 may include a gesture sensor, a gyro-sensor, an atmospheric sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface 1677 may support one or a plurality of designated protocols to be used for the electronic device 1601 to be directly or wirelessly connected to another electronic device (the electronic device 1602, etc.) The interface 1677 may include a high-definition multimedia interface (HDMI) interface, a universal serial bus (USB) interface, an SD card interface, and/or an audio interface.

A connection terminal 1678 may include a connector, through which the electronic device 1601 may be physically connected to another electronic device (the electronic device 1602, etc.) The connection terminal 1678 may include an HDMI connector, a USB connector, an SD card connector, and/or an audio connector (a headphone connector, etc.).

A haptic module 1679 may convert an electrical signal into a mechanical stimulus (vibration, motion, etc.) or an electrical stimulus which is recognizable to a user via haptic or motion sensation. The haptic module 1679 may include a motor, a piezoelectric device, and/or an electrical stimulus device.

The camera module 1680 may capture a still image and a video. The camera module 1680 may include a lens assembly including one or a plurality of lenses, the image sensor 1000 of FIG. 1, image signal processors, and/or flashes. The lens assemblies included in the camera module 1680 may collect light emitted from an object, an image of which is to be captured.

The power management module 1688 may manage power supplied to the electronic device 1601. The power management module 8388 may be realized as part of a power management integrated circuit (PMIC).

The battery 1689 may supply power to the components of the electronic device 1601. The battery 1689 may include a non-rechargeable primary battery, rechargeable secondary battery, and/or a fuel battery.

The communication module 1690 may support establishment of direct (wired) communication channels and/or wireless communication channels between the electronic device 1601 and other electronic devices (the electronic device 1602, the electronic device 1604, the server 1608, etc.) and communication performance through the established communication channels. The communication module 1690 may include one or a plurality of communication processors separately operating from the processor 1620 (an application processor, etc.) and supporting direct communication and/or wireless communication. The communication module 1690 may include a wireless communication module 1692 (a cellular communication module, a short-range wireless communication module, a global navigation satellite system (GNSS) communication module, and/or a wired communication module 1694 (a local area network (LAN) communication module, a power line communication module, etc.). From these communication modules, a corresponding communication module may communicate with other electronic devices through a first network 1698 (a short-range wireless communication network, such as Bluetooth, Wifi direct, or infrared data association (IrDa)) or a second network 1699 (a remote communication network, such as a cellular network, the Internet, or a computer network (LAN, WAN, etc.)). Various types of communication modules described above may be integrated as a single component (a single chip, etc.) or realized as a plurality of components (a plurality of chips). The wireless communication module 1692 may identify and authenticate the electronic device 1601 within the first network 1698 and/or the second network 1699 by using subscriber information (international mobile subscriber identification (IMSI), etc.) stored in the subscriber identification module 1696.

The antenna module 1697 may transmit a signal and/or power to the outside (other electronic devices, etc.) or receive the same from the outside. The antenna may include an emitter including a conductive pattern formed on a substrate (a printed circuit board (PCB), etc.). The antenna module 1697 may include an antenna or a plurality of antennas. When the antenna module 1697 includes a plurality of antennas, an appropriate antenna which is suitable for a communication method used in the communication networks, such as the first network 1698 and/or the second network 1699, may be selected. Through the selected antenna, signals and/or power may be transmitted or received between the communication module 1690 and other electronic devices. In addition to the antenna, another component (a radio frequency integrated circuit (RFIC), etc.) may be included in the antenna module 1697.

One or more of the components of the electronic device 1601 may be connected to one another and exchange signals (commands, data, etc.) with one another, through communication methods performed among peripheral devices (a bus, general purpose input and output (GPIO), a serial peripheral interface (SPI), a mobile industry processor interface (MIPI), etc.).

The command or the data may be transmitted or received between the electronic device 1601 and another external electronic device 1604 through the server 1608 connected to the second network 1699. Other electronic devices 1602 and 1604 may be electronic devices that are homogeneous or heterogeneous types with respect to the electronic device 1601. All or part of operations performed in the electronic device 1601 may be performed by one or more other electronic devices 1602, 1604, and 1608. For example, when the electronic device 1601 has to perform a function or a service, instead of directly performing the function or the service, the one or more other electronic devices may be requested to perform part or all of the function or the service. The one or more other electronic devices receiving the request may perform an additional function or service related to the request and may transmit a result of the execution to the electronic device 1601. To this end, cloud computing, distribution computing, and/or client-server computing techniques may be used.

Figure 17:
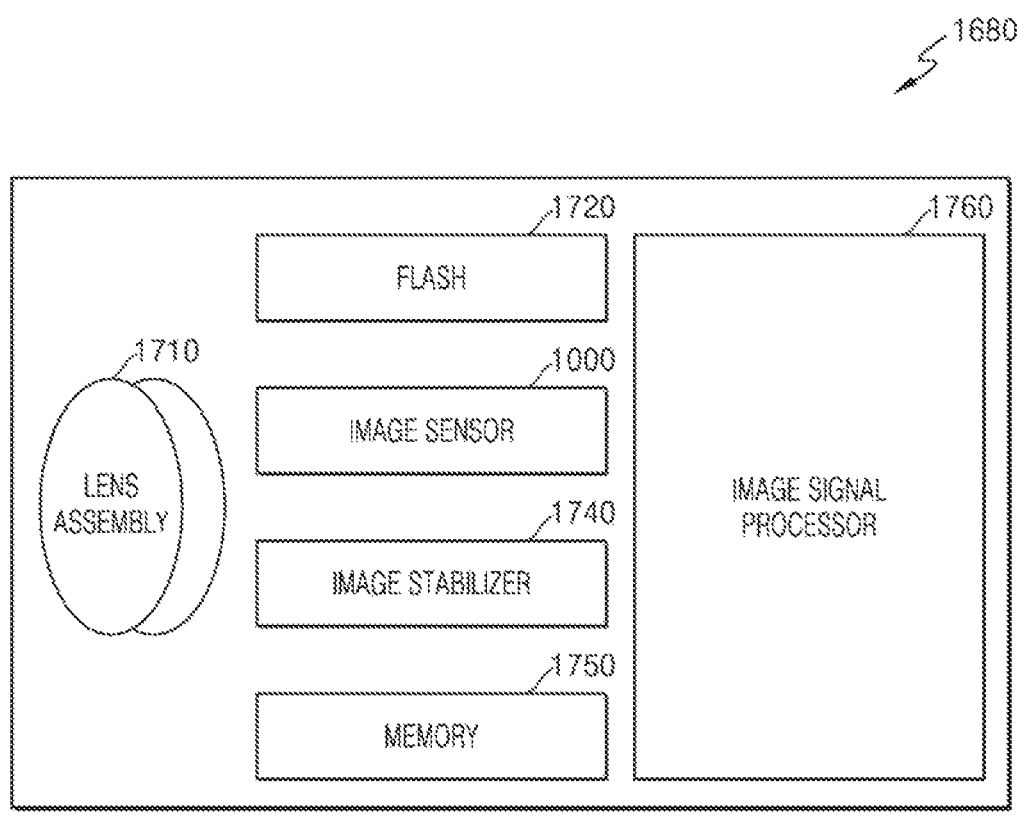
FIG. 17 is a schematic block diagram showing a camera module of FIG. 16.

FIG. 17 is a block diagram showing the camera module 1680 of FIG. 16. Referring to FIG. 17, the camera module 1680 may include a lens assembly 1710, a flash 1720, the image sensor 1000 (see FIG. 1), an image stabilizer 1740, a memory 1750 (a buffer memory, etc.), and/or an image signal processor 1760. The lens assembly 1710 may collect light emitted from a subject that is a target of image capture. The camera module 1680 may include a plurality of lens assemblies 1710, and in this case, the camera module 1680 may be a dual camera, a 360 degree camera, or a spherical camera. Some of the plurality of lens assemblies 1710 may have the same lens property (an angle of view, a focal length, AF, a F number, optical zoom, etc.), or may have different lens properties. The lens assembly 1710 may include a wide-angle lens or a telephoto lens.

The flash 1720 may emit light used to enhance light emitted or reflected from a subject. The flash 1720 may include one or more light emitting diodes (Red-Green-Blue (RGB) LED, White LED, Infrared LED, Ultraviolet LED, etc.), and/or a Xenon Lamp. The image sensor 1000 may be the image sensor 1000 described in FIG. 1, and may obtain an image corresponding to the subject by converting the light emitted or reflected from the subject and transmitted through the lens assembly 1710 into an electrical signal. The image sensor 1000 may include one or a plurality of sensors selected from image sensors having different attributes, such as an RGB sensor, a black and white (BW) sensor, an IR sensor, or a UV sensor. Each of the sensors included in the image sensor 1000 may be implemented as a Charged Coupled Device (CCD) sensor and/or a Complementary Metal Oxide Semiconductor (CMOS) sensor.

The image stabilizer 1740 may move one or more lenses included in the lens assembly 1710 or image sensors 1000 in a specific direction in response to the movement of the camera module 1680 or the electronic device 1601 including the camera module 1680 or control the operating characteristics of the image sensor 1000 (adjusting read-out timing, etc.) to compensate for a negative influence due to the movement. The image stabilizer 1740 may use a gyro sensor (not shown) or an acceleration sensor (not shown) disposed inside or outside the camera module 1680 to detect the movement of the camera module 1680 or the electronic device 1601. The image stabilizer 1740 may be implemented optically.

The memory 1750 may store part or entire data of an image obtained through the image sensor 1000 for a next image processing operation. For example, when a plurality of images are obtained at high speed, obtained original data (Bayer-Patterned data, high-resolution data, etc.) may be stored in the memory 1750, only low-resolution images may be displayed, and then the original data of a selected (a user selection, etc.) image may be transmitted to the image signal processor 1760. The memory 1750 may be integrated into the memory 1630 of the electronic device 1601, or may be configured as a separate memory that operates independently.

The image signal processor 1760 may perform one or more image processing operations on the image obtained through the image sensor 1000 or the image data stored in the memory 1750. The one or more image processing operations may include depth map generation, 3D modeling, panorama generation, feature point extraction, image synthesis, and/or image compensation (noise reduction, resolution adjustment, brightness adjustment, blurring, sharpening, softening, etc.) The image signal processor 1760 may perform control (exposure time control, read-out timing control, etc.) of components (the image sensor 1000, etc.) included in the camera module 1680. The image processed by the image signal processor 1760 may be stored again in the memory 1750 for further processing or may be provided to external components (the memory 1630, the display apparatus 1660, the electronic device 1602, the electronic device 1604, the server 1608, etc.) of the camera module 1680. The image signal processor 1760 may be integrated into the processor 1620 or may be configured as a separate processor that operates independently from the processor 1620. When the image signal processor 1760 is configured as the processor separate from the processor 1620, the image processed by the image signal processor 1760 may undergo additional image processing by the processor 1620 and then be displayed through the display apparatus 1660.

The electronic device 1601 may include the plurality of camera modules 1680 having different properties or functions. In this case, one of the plurality of camera modules 1680 may be a wide-angle camera, and the other may be a telephoto camera. Similarly, one of the plurality of camera modules 1680 may be a front camera and the other may be a rear camera.

Figure 18:
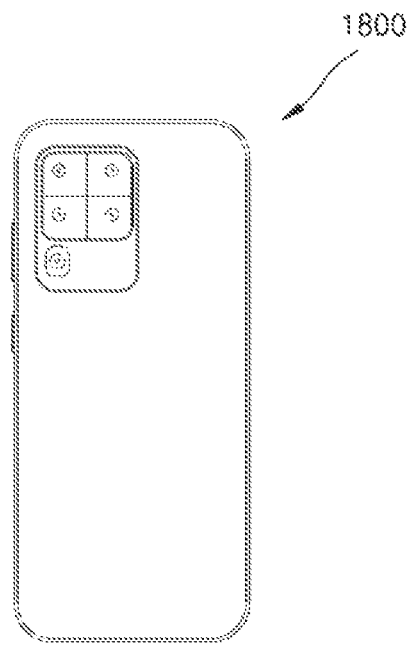
FIGS. 18, 19, 20, 21, 22, 23, 24, 25, 26, and 27 show various examples of electronic devices to which image sensors are applied according to example embodiments.
Figure 19:
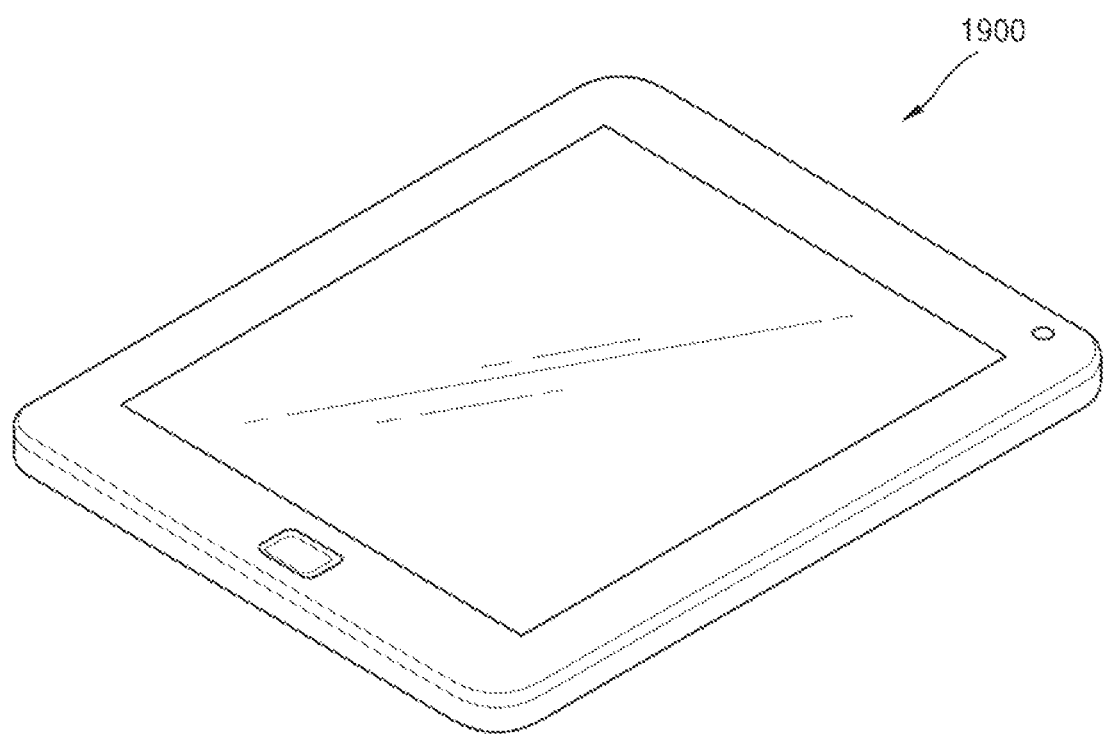
Figure 20:
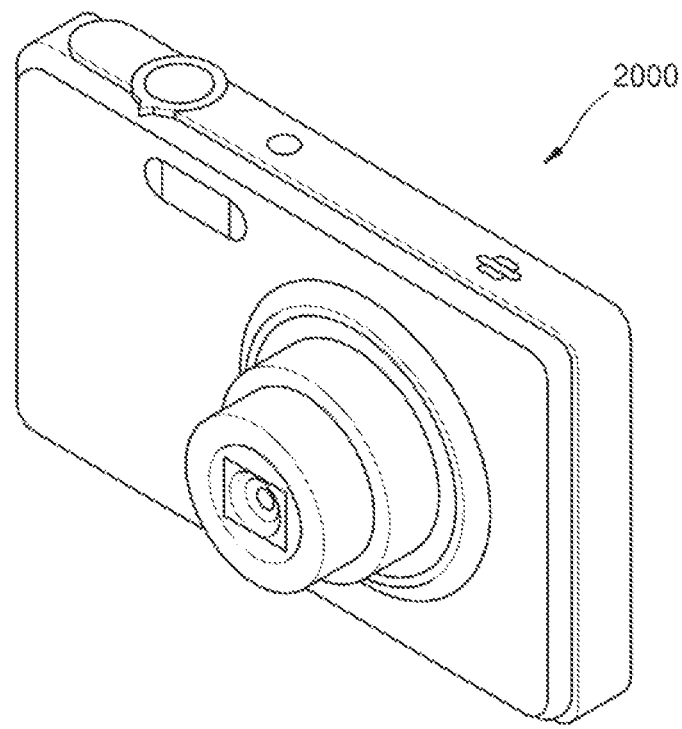
Figure 21:
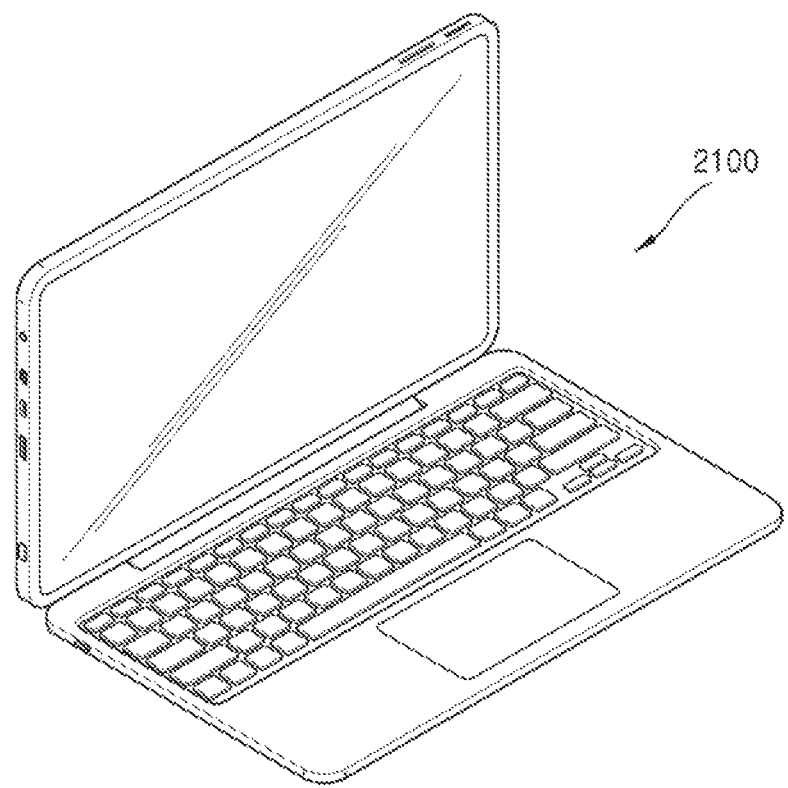
Figure 22:
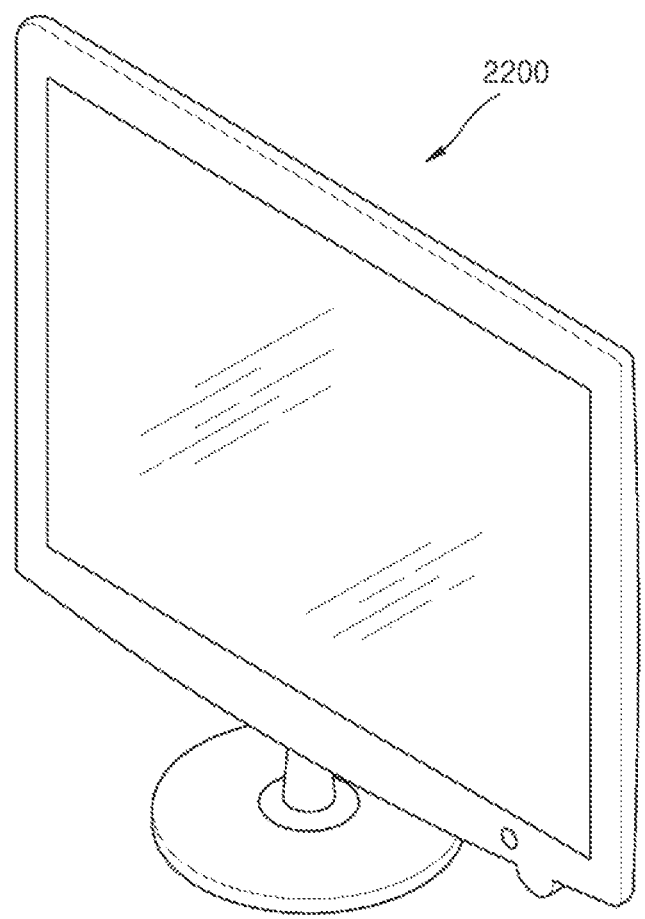

The image sensor 1000 according to the embodiments may be applied to the mobile phone or a smartphone 1800 shown in FIG. 18, a tablet or a smart tablet 1900 shown in FIG. 19, a digital camera or a camcorder 2000 shown in FIG. 20, a laptop computer 2100 shown in FIG. 21, or a television or a smart television 2200 shown in FIG. 22, etc. For example, the smartphone 1800 or the smart tablet 1900 may include a plurality of high-resolution cameras each including a high-resolution image sensor. Depth information of objects in an image may be extracted, out condensing of the image may be adjusted, or objects in the image may be automatically identified by using the high-resolution cameras.

Figure 23:
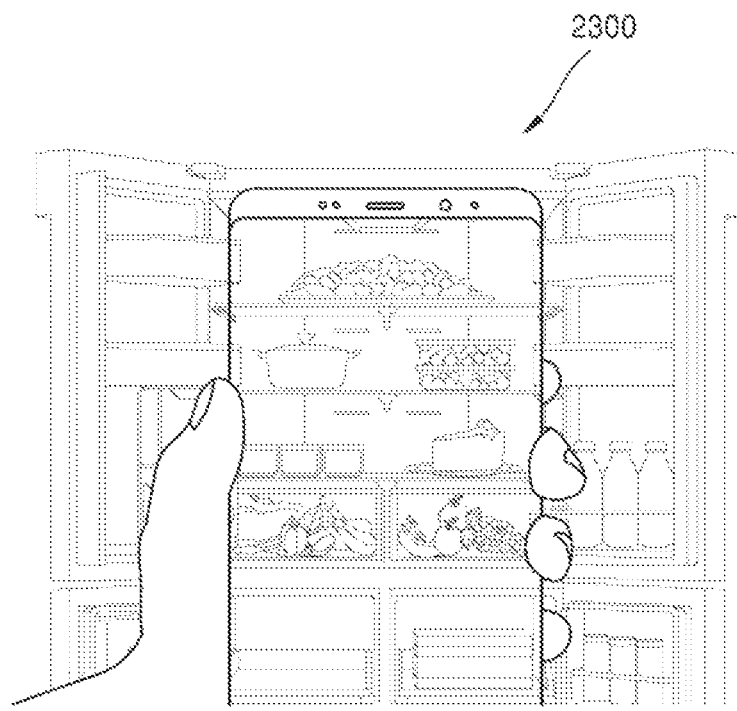
Figure 24:
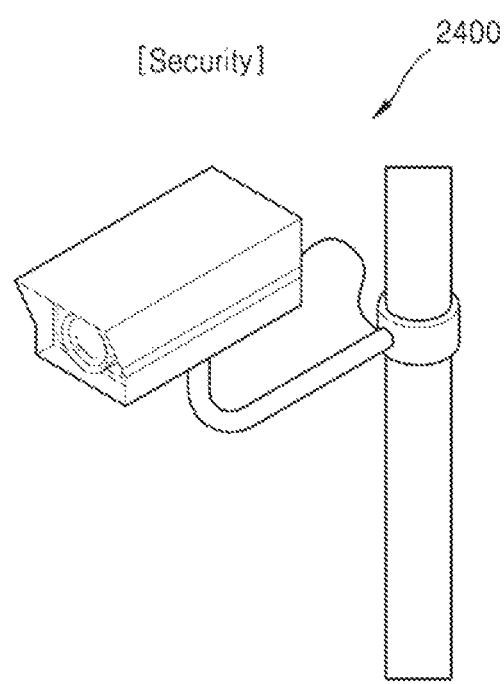
Figure 25:
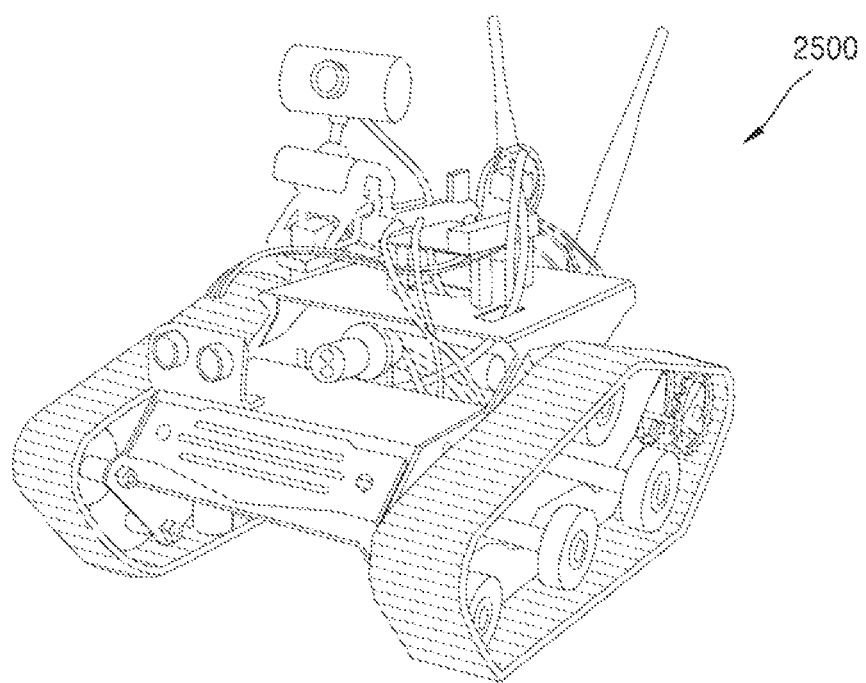
Figure 26:
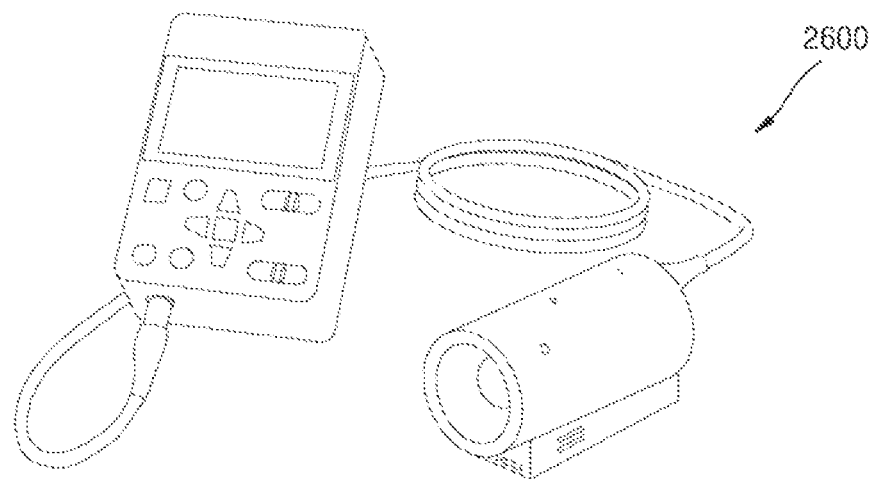

Also, the image sensor 1000 may be applied to a smart refrigerator 2300 shown in FIG. 23, a surveillance camera 2400 shown in FIG. 24, a robot 2500 shown in FIG. 25, a medical camera 2600 shown in FIG. 26, etc. For example, the smart refrigerator 2300 may automatically recognize food in the refrigerator by using the image sensor, and may notify the user of an existence of a certain kind of food, kinds of food put into or taken out, etc. through a smartphone. Also, the surveillance camera 2400 may provide an ultra-high-resolution image and may allow the user to recognize an object or a person in the image even in dark environment by using high sensitivity. The robot 2500 may be input to a disaster or industrial site that a person may not directly access, to provide the user with high-resolution images. The medical camera 2600 may provide high-resolution images for diagnosis or surgery, and may dynamically adjust a field of view.

Figure 27:
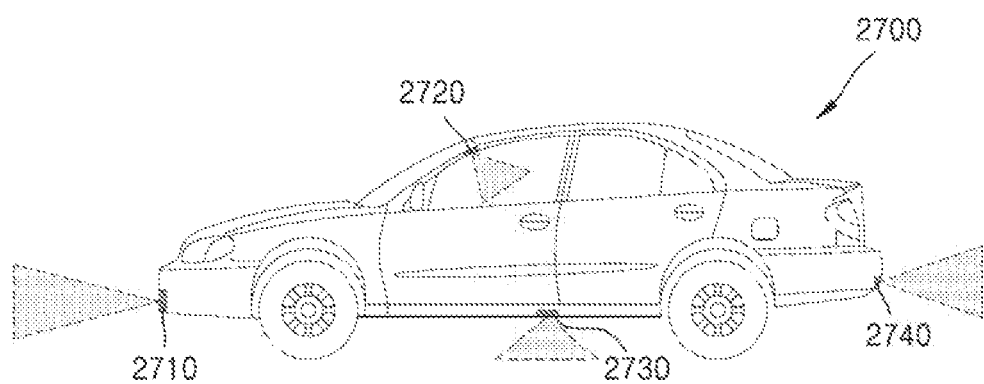

Also, the image sensor may be applied to a vehicle 2700 as shown in FIG. 27. The vehicle 2700 may include a plurality of vehicle cameras 2710, 2720, 2730, and 2740 arranged on various positions. Each of the vehicle cameras 2710, 2720, 2730, and 2740 may include the image sensor according to the embodiment. The vehicle 2700 may provide a driver with various information about the interior of the vehicle 2700 or the periphery of the vehicle 2700 by using the plurality of vehicle cameras 2710, 2720, 2730, and 2740, and may provide the driver with the information necessary for the autonomous travel by automatically recognizing an object or a person in the image.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. An image sensor comprising:
   a sensor substrate comprising a plurality of first pixels configured to sense first wavelength light in an infrared ray band and a plurality of second pixels configured to sense second wavelength light in a visible light band; and
   a color separating lens array disposed on the sensor substrate and configured to change a phase of the first wavelength light incident on the color separating lens array such that the first wavelength light is condensed to the plurality of first pixels, the color separating lens array comprising a plurality of first pixel corresponding regions corresponding to the plurality of first pixels and a plurality of second pixel corresponding regions corresponding to the plurality of second pixels,
   wherein each of the plurality of first pixel corresponding regions and each of the plurality of second pixel corresponding regions comprises a plurality of nanoposts, the plurality of nanoposts being configured to change the phase of the first wavelength light incident on the color separating lens array,
   wherein the plurality of nanoposts are configured to form a plurality of light condensing regions configured to condense the first wavelength light respectively on the plurality of first pixels, and
   wherein an area of each of the plurality of light condensing regions is larger than an area of each of the plurality of first pixels.

2. The image sensor of claim 1, wherein the plurality of light condensing regions are configured to change the phase of the first wavelength light such that the first wavelength light passing through the plurality of light condensing regions has a phase profile that reduces in a direction away from a center of the plurality of light condensing regions.

3. The image sensor of claim 1, wherein the area of each of the plurality of light condensing regions is 1.5 to 4 times larger than the area of each of the plurality of first pixels.

4. The image sensor of claim 1, wherein the color separating lens array is configured such that a phase of the second wavelength light passing through the color separating lens array has a constant phase profile.

5. The image sensor of claim 1, further comprising an infrared filter disposed between the sensor substrate and the color separating lens array that face the plurality of first pixels in a vertical direction, the infrared filter being configured to block visible light.

6. The image sensor of claim 1, further comprising a color filter disposed between the sensor substrate and the color separating lens array that face the plurality of second pixels in a vertical direction, the color filter being configured to block infrared ray.

7. The image sensor of claim 6, further comprising a microlens disposed on the color filter.

8. The image sensor of claim 1, wherein the
   first pixel corresponding region is disposed to face the plurality of first pixels in a vertical direction and comprises a first nanopost, and
   wherein the second pixel corresponding region is disposed to face the plurality of second pixels in the vertical direction and comprises a second nanopost.

9. The image sensor of claim 8, wherein the first nanopost is disposed in a center of the first pixel corresponding region,
   wherein the second nanopost is disposed in a center of the second pixel corresponding region, and
   wherein a cross-sectional area of the first nanopost is larger than a cross-sectional area of the second nanopost.

10. The image sensor of claim 1, wherein the plurality of light condensing regions comprise a first wavelength light condensing region,
    wherein the second wavelength light comprises red light or blue light,
    wherein the color separating lens array comprises a second wavelength light condensing region configured to condense the second wavelength light to the plurality of second pixels,
    wherein an area of the second wavelength light condensing region is larger than an area of the plurality of second pixels, and
    wherein the first wavelength light condensing region partially overlaps the second wavelength light condensing region.

11. The image sensor of claim 1, wherein the sensor substrate comprises a plurality of third pixels configured to sense third wavelength light, and a plurality of fourth pixels configured to sense fourth wavelength light,
    wherein the second wavelength light is red light, the third wavelength light is blue light, and the fourth wavelength light is green light, and
    wherein the color separating lens array is further configured to:
    change a phase of the second wavelength light incident on the color separating lens array such that the second wavelength light is condensed to the plurality of second pixels;
    change a phase of the third wavelength light incident on the color separating lens array such that the third wavelength light is condensed to the plurality of third pixels; and
    change a phase of the fourth wavelength light incident on the color separating lens array such that the fourth wavelength light is condensed to the plurality of fourth pixels.

12. The image sensor of claim 1, wherein the sensor substrate comprises a plurality of third pixels configured to sense third wavelength light, and a plurality of fourth pixels configured to sense fourth wavelength light,
wherein the second wavelength light is red light, the third wavelength light is blue light, the fourth wavelength light is green light, and
wherein the color separating lens array is configured to change the phase of the first wavelength light and a phase of the fourth wavelength light that are incident on the color separating lens array such that combined light of the first wavelength light and the fourth wavelength light is condensed to the plurality of first pixels and the plurality of fourth pixels.

13. The image sensor of claim 12, further comprising a color filter disposed on the plurality of fourth pixels, the color filter being configured to block infrared ray.

14. The image sensor of claim 12, further comprising a color filter disposed on the plurality of first pixels, the color filter being configured to block visible light.

15. The image sensor of claim 12, wherein the color separating lens array is configured to:
change a phase of the second wavelength light incident on the color separating lens array such that the second wavelength light is condensed to the plurality of second pixels; and
change a phase of the third wavelength light incident on the color separating lens array such that the third wavelength light is condensed to the plurality of third pixels.

16. The image sensor of claim 12, wherein the plurality of light condensing regions comprise a first wavelength light condensing region,
wherein the color separating lens array comprises a plurality of second wavelength light condensing regions configured to respectively condense the second wavelength light on the plurality of second pixels, and
wherein an area of each of the plurality of second wavelength light condensing regions is larger than that of the first wavelength light condensing region.

17. The image sensor of claim 1, wherein at least one nanoposts, among the plurality of nanoposts, is disposed at a boundary of each of the plurality of first pixel corresponding regions and a boundary of each of the plurality of second pixel corresponding regions.

18. An electronic device comprising:
an image sensor configured to convert an optical image into an electrical signal; and
a processor configured to control the image sensor, and store and output a signal generated by the image sensor,
wherein the image sensor comprises:
a sensor substrate comprising a plurality of first pixels configured to sense first wavelength light in an infrared ray band and a plurality of second pixels configured to sense second wavelength light in a visible light band; and
a color separating lens array disposed on the sensor substrate and configured to change a phase of the first wavelength light incident on the color separating lens array such that the first wavelength light is condensed to the plurality of first pixels, the color separating lens array comprising a plurality of first pixel corresponding regions corresponding to the plurality of first pixels and a plurality of second pixel corresponding regions corresponding to the plurality of second pixels,
wherein each of the plurality of first pixel corresponding regions and each of the plurality of second pixel corresponding regions comprises a plurality of nanoposts, the plurality of nanoposts being configured to change the phase of the first wavelength light incident on the color separating lens array
wherein the plurality of nanoposts are configured to form a plurality of light condensing regions configured to condense the first wavelength light respectively on the plurality of first pixels, and
wherein an area of each of the plurality of light condensing regions is larger than an area of each of the plurality of first pixels.

19. The electronic device of claim 18, wherein the plurality of light condensing regions are configured to change the phase of the first wavelength light such that the first wavelength light passing through the plurality of light condensing regions has a phase profile that reduces in a direction away from a center of the plurality of light condensing regions.

20. The electronic device of claim 18, wherein the area of each of the plurality of light condensing regions is 1.5 to 4 times larger than the area of each of the plurality of first pixels.

21. The electronic device of claim 18, wherein the color separating lens array is configured such that a phase of the second wavelength light passing through the color separating lens array has a constant phase profile.

22. The electronic device of claim 18, further comprising an infrared filter disposed between the sensor substrate and the color separating lens array that face the plurality of first pixels in a vertical direction, the infrared filter being configured to block visible light.

23. The electronic device of claim 18, further comprising a color filter disposed between the sensor substrate and the color separating lens array that face the plurality of second pixels in a vertical direction, the color filter being configured to block infrared ray.

24. The electronic device of claim 23, further comprising a microlens disposed on the color filter.

25. The electronic device of claim 18, wherein the plurality of first pixel corresponding regions are disposed to face the plurality of first pixels, respectively, in a vertical direction and respectively comprises a first nanopost, and
wherein the plurality of second pixel corresponding regions are disposed to face the plurality of second pixels, respectively, in the vertical direction and respectively comprises a second nanopost.

26. The electronic device of claim 25, wherein the first nanopost is disposed in a center of the first pixel corresponding region,
wherein the second nanopost is disposed in a center of the second pixel corresponding region, and
wherein a cross-sectional area of the first nanopost is larger than a cross-sectional area of the second nanopost.

27. The electronic device of claim 18, wherein the plurality of light condensing regions comprise a first wavelength light condensing region,
wherein the second wavelength light comprises red light or blue light,
wherein the color separating lens array comprises a second wavelength light condensing region configured to condense the second wavelength light to the plurality of second pixels, wherein an area of the second wavelength light condensing region is larger than an area of the plurality of second pixels, and wherein the first wavelength light condensing region partially overlaps the second wavelength light condensing region.

28. The electronic device of claim 18, wherein the sensor substrate comprises a plurality of third pixels configured to sense third wavelength light, and a plurality of fourth pixels configured to sense fourth wavelength light, wherein the second wavelength light is red light, the third wavelength light is blue light, and the fourth wavelength light is green light, and wherein the color separating lens array is configured to:
change a phase of the second wavelength light incident on the color separating lens array such that the second wavelength light is condensed to the plurality of second pixels;
change a phase of the third wavelength light incident on the color separating lens array such that the third wavelength light is condensed to the plurality of third pixels; and
change a phase of the fourth wavelength light incident on the color separating lens array such that the fourth wavelength light is condensed to the plurality of fourth pixels.

29. The electronic device of claim 18, wherein the sensor substrate comprises a plurality of third pixels configured to sense third wavelength light, and a plurality of fourth pixels configured to sense fourth wavelength light, wherein the second wavelength light is red light, the third wavelength light is blue light, and the fourth wavelength light is green light, and wherein the color separating lens array is configured to change phases of the first wavelength light and the fourth wavelength light that are incident on the color separating lens array such that combined light of the first wavelength light and the fourth wavelength light is condensed on the plurality of first pixels and the plurality of fourth pixels.

30. The electronic device of claim 29, further comprising a color filter disposed on the plurality of fourth pixels, the color filter being configured to block infrared ray.

31. The electronic device of claim 29, further comprising a color filter disposed on the plurality of first pixels, the color filter being configured to block visible light.

32. The electronic device of claim 29, wherein the color separating lens array is configured to:
change a phase of the second wavelength light incident on the color separating lens array such that the second wavelength light is condensed on the plurality of second pixels; and
change a phase of the third wavelength light incident on the color separating lens array such that the third wavelength light is condensed on the plurality of third pixels.

33. The electronic device of claim 29, wherein the plurality of light condensing regions comprise a first wavelength light condensing region, wherein the color separating lens array comprises a plurality of second wavelength light condensing regions configured to respectively condense the second wavelength light on the plurality of second pixels, and wherein an area of each of the plurality of second wavelength light condensing regions is larger than that of the first wavelength light condensing region.

* * * * *